(12) United States Patent
Choi et al.

(10) Patent No.: US 9,825,153 B2
(45) Date of Patent: Nov. 21, 2017

(54) METHOD OF MANUFACTURING SEMICONDUCTOR DEVICE USING PLASMA DOPING PROCESS AND SEMICONDUCTOR DEVICE MANUFACTURED BY THE METHOD

(71) Applicant: Samsung Electronics Co., Ltd., Suwon-si (KR)

(72) Inventors: Kyungin Choi, Seoul (KR); Sunghyun Choi, Suwon-si (KR); Yong-Suk Tak, Seoul (KR); Bonyoung Koo, Suwon-si (KR); Jaejong Han, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/422,907

(22) Filed: Feb. 2, 2017

(65) Prior Publication Data
US 2017/0148901 A1 May 25, 2017

Related U.S. Application Data

(63) Continuation of application No. 14/460,404, filed on Aug. 15, 2014, now Pat. No. 9,577,075.

(30) Foreign Application Priority Data

Nov. 14, 2013 (KR) .................. 10-2013-0138426

(51) Int. Cl.
*H01L 29/66* (2006.01)
*H01L 29/06* (2006.01)
(Continued)

(52) U.S. Cl.
CPC .... *H01L 29/66803* (2013.01); *H01L 21/2236* (2013.01); *H01L 21/823431* (2013.01);
(Continued)

(58) Field of Classification Search
CPC ....... H01L 21/823431; H01L 29/66803; H01L 29/0649; H01L 29/66553; H01L 29/66795; H01L 29/7848; H01L 29/785
See application file for complete search history.

(56) References Cited

U.S. PATENT DOCUMENTS 7,667,271 B2   2/2010   Yu et al.
8,124,507 B2   2/2012   Sasaki et al.
(Continued)

*Primary Examiner* — Joseph C Nicely
(74) *Attorney, Agent, or Firm* — Muir Patent Law, PLLC

(57) ABSTRACT

A method of manufacturing a semiconductor device includes forming a preliminary fin-type active pattern extending in a first direction, forming a device isolation pattern covering a lower portion of the preliminary fin-type active pattern, forming a gate structure extending in a second direction and crossing over the preliminary fin-type active pattern, forming a fin-type active pattern having a first region and a second region, forming a preliminary impurity-doped pattern on the second region by using a selective epitaxial-growth process, and forming an impurity-doped pattern by injecting impurities using a plasma doping process, wherein the upper surface of the first region is at a first level and the upper surface of the second region is at a second level lower than the first level.

13 Claims, 58 Drawing Sheets

(51) Int. Cl.
    *H01L 21/223*     (2006.01)
    *H01L 29/78*      (2006.01)
    *H01L 21/8234*    (2006.01)
    *H01L 21/84*      (2006.01)

(52) U.S. Cl.
    CPC ........ *H01L 21/845* (2013.01); *H01L 29/0649* (2013.01); *H01L 29/66553* (2013.01); *H01L 29/66795* (2013.01); *H01L 29/7848* (2013.01); *H01L 29/7851* (2013.01)

(56) References Cited

U.S. PATENT DOCUMENTS

| | | |
|---|---|---|
| 8,264,021 B2 | 9/2012 | Lai et al. |
| 8,298,925 B2 | 10/2012 | Wu et al. |
| 8,409,939 B2 | 4/2013 | Sasaki et al. |
| 9,577,075 B2 * | 2/2017 | Choi ................ H01L 29/66803 |
| 2003/0030144 A1 | 2/2003 | Ono et al. |
| 2011/0269287 A1 | 11/2011 | Tsai et al. |
| 2011/0272763 A1 | 11/2011 | Sasaki et al. |
| 2012/0052664 A1 | 3/2012 | Fuse et al. |
| 2013/0200433 A1 | 8/2013 | Adam et al. |
| 2013/0307037 A1 | 11/2013 | Masuoka et al. |
| 2014/0183660 A1 | 7/2014 | Jou et al. |
| 2014/0312393 A1 | 10/2014 | Rodder et al. |
| 2014/0361383 A1 | 12/2014 | Masuoka et al. |
| 2014/0374845 A1 | 12/2014 | Masuoka et al. |
| 2014/0377926 A1 | 12/2014 | Kim et al. |
| 2016/0027699 A1 | 1/2016 | Chien |
| 2016/0056290 A1 | 2/2016 | Tsai et al. |
| 2016/0064381 A1 | 3/2016 | Chang et al. |
| 2016/0093726 A1 | 3/2016 | Ching et al. |
| 2017/0162668 A1 * | 6/2017 | Kim ................ H01L 21/76224 |

\* cited by examiner

METHOD OF MANUFACTURING SEMICONDUCTOR DEVICE USING PLASMA DOPING PROCESS AND SEMICONDUCTOR DEVICE MANUFACTURED BY THE METHOD

CROSS-REFERENCE TO RELATED APPLICATIONS

This U.S. non-provisional patent application is a continuation application of and claims priority to U.S. patent application Ser. No. 14/460,404 filed on Aug. 15, 2014, which claims priority under 35 U.S.C. §119 to Korean Patent Application No. 10-2013-0138426, filed on Nov. 14, 2013 in the Korean Intellectual Property Office (KIPO), the contents of each of which are herein incorporated by reference in their entirety.

BACKGROUND

Nowadays, semiconductor devices are very widely used in electronic industries because they have many beneficial characteristics, such as a possibility of miniaturization, a multi-functional ability, and a lower manufacturing cost, etc. These semiconductor devices include memory devices, logic devices, and/or hybrid devices performing various functions simultaneously.

In response to the growing demands for miniaturized semiconductor devices, the pattern size of semiconductor devices has become much smaller. If the pattern size is very small, process margins for manufacturing these semiconductor devices should be reduced. Thus, it is becoming very difficult to form the smaller patterns due to the reduced process margin, such as an exposure margin of a photolithographic process.

In addition, demands for forming a high-speed semiconductor device are also increasing. Therefore, various studies have been conducted to meet the demands for forming miniaturized semiconductor devices and high-speed semiconductor devices.

Certain semiconductor devices include fin structures, such as fin Field Effect Transistors (FinFETS). Methods of manufacturing these fin structures have included doping using plasma processes. See, e.g., U.S. Pat. Nos. 8,409,939, 8,298,925, and 8,124,507, each of which is incorporated herein in its entirety by reference.

SUMMARY

An aspect of the present inventive concepts provides a method of manufacturing a semiconductor device using a using a plasma doping process and a semiconductor device manufactured by the method. The semiconductor device may have a fin-type field effect transistor (FinFET).

In one example embodiment, the method may include forming a preliminary fin-type active pattern by partially etching a substrate, the preliminary fin-type active pattern extending in a first direction, forming a device isolation pattern covering a lower portion of the preliminary fin-type active pattern, forming a gate structure crossing over the preliminary fin-type active pattern, the gate structure extending in a second direction and the preliminary fin-type active pattern having an exposed upper portion not covered by the gate structure, forming a fin-type active pattern having a first region and a second region by etching the exposed upper portion of the preliminary fin-type active pattern, the first region being located below the gate structure and the second region being located at both sides of the gate structure wherein the first region has sidewall surfaces and the second region has upper surfaces, forming an impurity-doped region at the sidewall surfaces of the first region and at the upper surface of the second region by using a plasma doping process, and forming an impurity-doped pattern on the second region by using a selective epitaxial-growth process, wherein an upper surface of the first region is at a first level and an upper surface of the second region is at a second level lower than the first level.

The method may further include annealing the substrate after the plasma doping process, and wherein the impurity-doped region has substantially the same thickness at the sidewall surfaces of the first region and at the upper surface of the second region.

The impurity-doped region may have a substantially uniform thickness along the sidewall surfaces of the first region and along the upper surfaces of the second region.

The method of annealing the substrate may include performing a first heat treatment to the impurity-doped region at a first temperature, and performing a second heat treatment to the impurity-doped region at a second temperature higher than the first temperature.

The first heat treatment may include at least one selected from the group consisting of a rapid thermal anneal (RTA), a rapid thermal oxidation, a plasma annealing, and a microwave annealing.

The second heat treatment may include at least one selected from the group consisting of a spike RTA, a flash RTA, and a laser annealing.

The plasma doping process may include supplying an impurity gas to the substrate, forming a plasma in order to ionize impurities of the impurity gas, and injecting the ionized impurities into the sidewalls of the first region and the upper surfaces of the second region by supplying a bias voltage to the substrate.

The impurity gas may include boron (B).

The impurity gas may further include carbon (C).

The impurity-doped pattern may have a compressive stress.

The impurity gas may include at least one selected from the group consisting of arsenic (As) and phosphorus (P).

The impurity-doped pattern may have a tensile stress.

The plasma doping process may further include supplying a dilution gas to the substrate.

The dilution gas may include at least one element selected from the group consisting of argon (Ar), neon (Ne), helium (He), hydrogen (H), Krypton (Kr), and Xenon (Xe).

The method may further include removing the impurity-doped region formed at the upper surfaces of the second region.

The method of forming the impurity-doped pattern may further include supplying at least one impurity to the impurity-doped pattern by using an in-situ process during the selective epitaxial-growth process.

The method may further include removing a by-product formed during the plasma doping process.

The method may further include forming a passivation layer on the impurity doped region after the plasma doping process.

The method of forming the passivation layer may include supplying an oxygen-plasma to the impurity-doped region.

The method may further include performing a knock-in process after the plasma doping process. The knock-in process may be performed by using at least one selected from the group consisting of argon (Ar), neon (Ne), helium (He), hydrogen (H), Krypton (Kr), and Xenon (Xe).

The method of forming the gate structure may include forming sequentially a dielectric layer and a material layer on the preliminary fin-type active pattern, forming a mask pattern extending in the second direction on the material layer, forming a line pattern and a dielectric layer pattern by etching the material layer and the dielectric layer using the mask pattern as an etch mask, and forming a spacer on the sidewall of the line pattern and the dielectric layer pattern.

The method may further include forming a trench by removing a portion of the gate structure in order to expose a portion of the device isolation pattern and the first region of the fin-type active pattern, conformally forming a dielectric layer pattern on the device isolation pattern and the first region exposed in the trench, and forming a gate electrode filling the trench on the dielectric layer pattern.

In another example embodiment, a method of manufacturing a semiconductor device includes: providing a substrate; forming a fin-type active pattern on the substrate, the fin-type active pattern extending in a first direction and having a first portion and a second portion, wherein the first portion extends upwards from the second portion and has sidewall surfaces, and an upper surface of the first portion is at a first level and an upper surface of the second portion is at a second level lower than the first level; forming a device isolation pattern covering a lower portion of the fin-type active pattern; forming a gate structure crossing over the fin-type active pattern, the gate structure extending in a second direction perpendicular to the first direction, wherein the first portion is located below the gate structure and the second portion is located at both sides of the gate structure; and forming an impurity-doped region at sidewall surfaces of the first portion and at upper surfaces of the second portion by using a plasma doping process. The impurity-doped region has substantially the same and uniform thickness along the sidewall surfaces of the first region and along the upper surfaces of the second region.

The method may additionally include forming an impurity-doped pattern on the second region by using a selective epitaxial-growth process.

In one embodiment, widths of individual impurity doping bands of the impurity-doped pattern are substantially uniform.

The plasma doping process may further include supplying an impurity gas to the substrate; forming a plasma in order to ionize impurities in the impurity gas; and injecting the ionized impurities into the sidewalls of the first region and the upper surfaces of the second region by supplying a bias voltage to the substrate.

Forming the gate structure may further include forming sequentially a dielectric layer and a material layer on a preliminary fin-type active pattern; forming a mask pattern extending in the second direction on the material layer; forming a line pattern and a dielectric layer pattern by etching the material layer and the dielectric layer using the mask pattern as an etch mask; and forming a spacer on the sidewall of the line pattern and the dielectric layer pattern.

In another example embodiment of the inventive concepts, a method of manufacturing a semiconductor device may include forming a preliminary fin-type active pattern by partially etching a substrate, the preliminary fin-type active pattern extending in a first direction, forming a device isolation pattern covering a lower portion of the preliminary fin-type active pattern, forming a pattern structure crossing over the preliminary fin-type active pattern, the pattern structure extending in a second direction and the preliminary fin-type active pattern having an exposed upper portion not covered by the pattern structure, forming a fin-type active pattern having a first region and a second region by etching the exposed upper portion of the preliminary fin-type active pattern, the first region being located below the pattern structure and having an upper surface, and the second region being located at both sides of the pattern structure and having an upper surface, forming a preliminary impurity-doped pattern on the second region by using a selective epitaxial-growth process, and forming an impurity-doped pattern from the preliminary impurity-doped pattern by injecting impurities using a plasma doping process, wherein the upper surface of the first region is at a first level and the upper surface of the second region is at a second level lower than the first level.

The method may further include annealing the impurity-doped pattern after the plasma doping process.

The method of annealing the impurity-doped pattern may include at least one selected from the group consisting of a spike RTA, a flash RTA, and a laser annealing.

The method may further include performing an ion beam doping process to inject impurities into the impurity-doped pattern.

In still another example embodiment of the inventive concepts, a semiconductor device may include a fin-type active pattern protruding from a substrate and extending in a first direction, the fin-type active pattern including a first region having a first vertical thickness and having sidewalls and a second region having a second vertical thickness and an upper surface, the second vertical thickness less than the first vertical thickness, a pattern structure crossing over the first region of the fin-type active pattern, the pattern structure extending in a second direction, and an impurity-doped pattern having an impurity concentration on the second region of the fin-type active pattern, wherein the impurity concentration of the impurity-doped pattern along the sidewall of the first region is substantially uniform.

The semiconductor device may further include a device isolation pattern covering a lower portion of the fin-type active pattern, wherein the upper surface of the first region is higher than the upper surface of the device isolation pattern, and wherein the upper surface of the second region is lower than the upper surface of the device isolation pattern.

The upper surface of the impurity-doped pattern may be higher than the upper surface of the device isolation pattern, but lower than the upper surface of the pattern structure.

A sidewall of the impurity-doped pattern may have an impurity concentration higher than an impurity concentration at the bottom of the impurity-doped pattern.

The sidewalls of the first region may have an impurity concentration higher than that of the upper surface of the second region.

BRIEF DESCRIPTION OF THE DRAWINGS

The foregoing and other features and advantages of this disclosure will be apparent from the more particular description of the example embodiments, as illustrated in the accompanying drawings in which like reference characters refer to the same parts throughout the different views. The drawings are not necessarily to scale, emphasis instead being placed upon illustrating the principles of the disclosed embodiments.

FIGS. 3a through 10a are perspective views illustrating a method of manufacturing a semiconductor device according to an example embodiment of the inventive concepts.

FIGS. 3b through 10b are cross-sectional views illustrating a method of manufacturing a semiconductor device according to an example embodiment of the inventive concepts corresponding to line I-I' of FIG. 10a.

FIGS. 1a through 20a are perspective views illustrating a method of manufacturing a semiconductor device according to an example embodiment of the inventive concepts.

FIGS. 11b through 20b are cross-sectional views illustrating a method of manufacturing a semiconductor device according to an example embodiment of the inventive concepts corresponding to line I-II' of FIG. 20a.

FIGS. 21a through 25a are perspective views illustrating a method of manufacturing a semiconductor device according to an example embodiment of the inventive concepts.

FIGS. 21b through 25b are cross-sectional views illustrating a method of manufacturing a semiconductor device according to an example embodiment of the inventive concepts corresponding to line I-II' of FIGS. 21a through 25a.

DETAILED DESCRIPTION OF EXAMPLE EMBODIMENTS

Figure 1A:
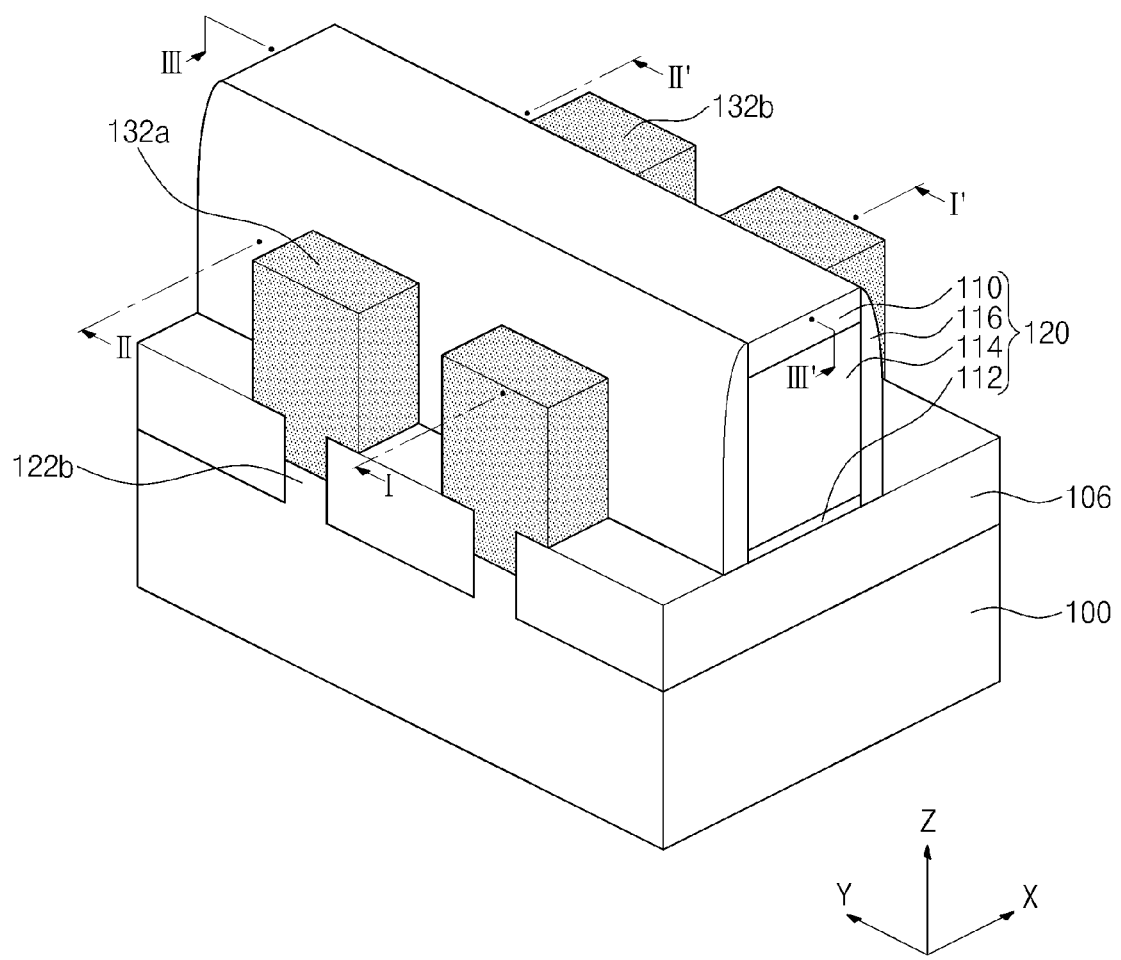
FIGS. 1a through 1d are a perspective view and cross-sectional views illustrating a semiconductor device according to an example embodiment of the inventive concepts.

Example embodiments will now be described more fully hereinafter with reference to the accompanying drawings; however, they may be embodied in different forms and should not be construed as limited to the example embodiments set forth herein.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or "contacting" another element, there are no intervening elements present. Other words used to describe the relationship between elements or layers should be interpreted in a like fashion (e.g., "between" versus "directly between," "adjacent" versus "directly adjacent," "on" versus "directly on," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawings, the dimensions of layers and regions may be exaggerated for clarity of illustration. Like reference numerals refer to like elements throughout the specification.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Hereinafter, example embodiments of the inventive concepts will be described in detail with reference to the accompanying drawings.

Figure 1B:
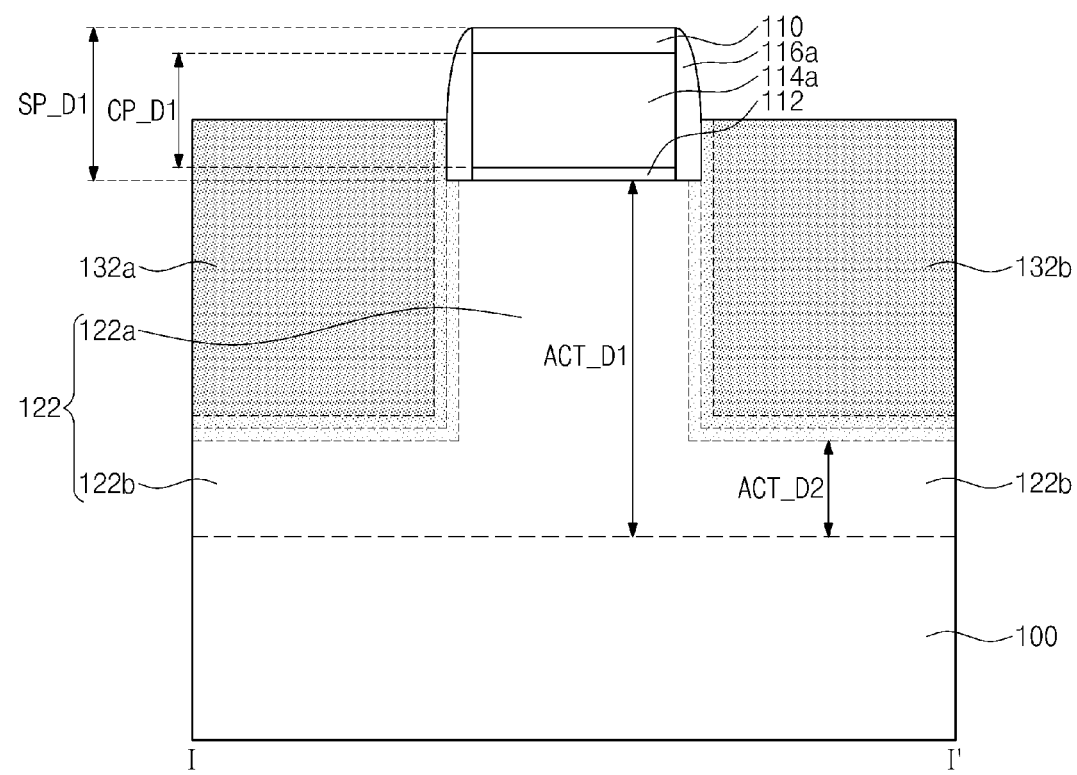
Figure 1C:
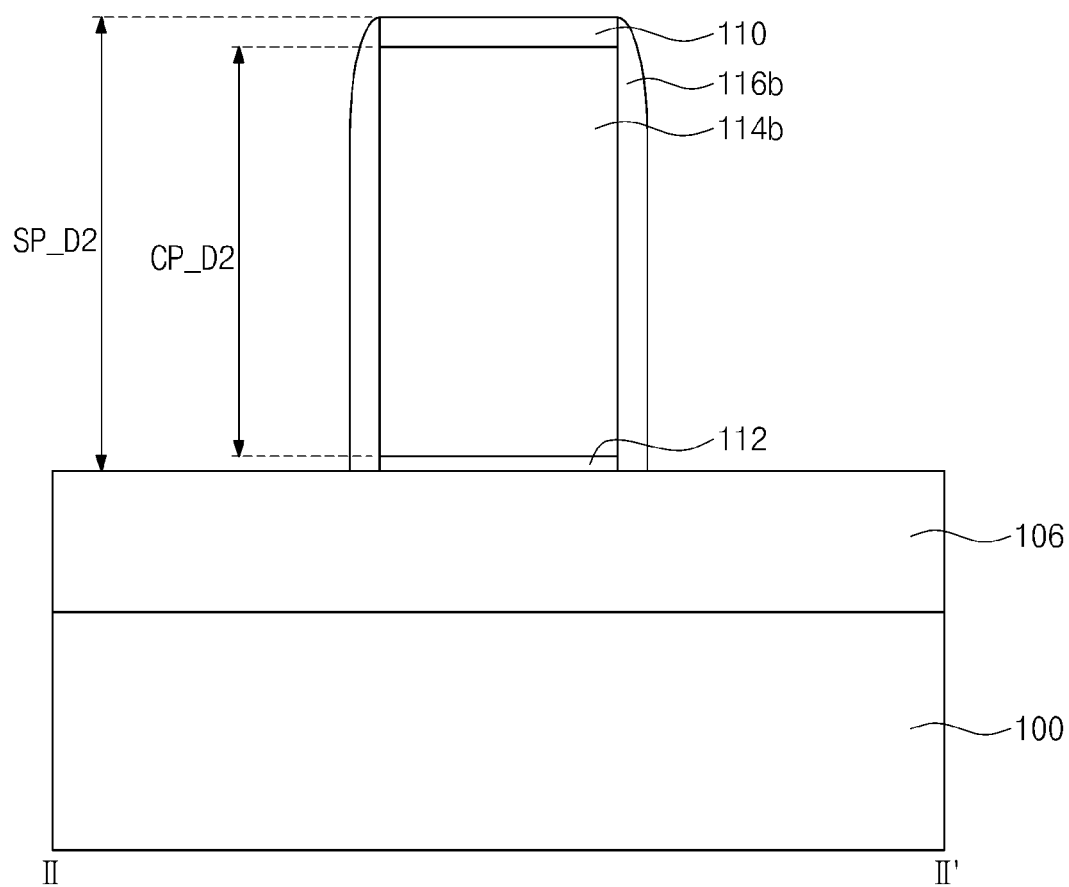
Figure 1D:
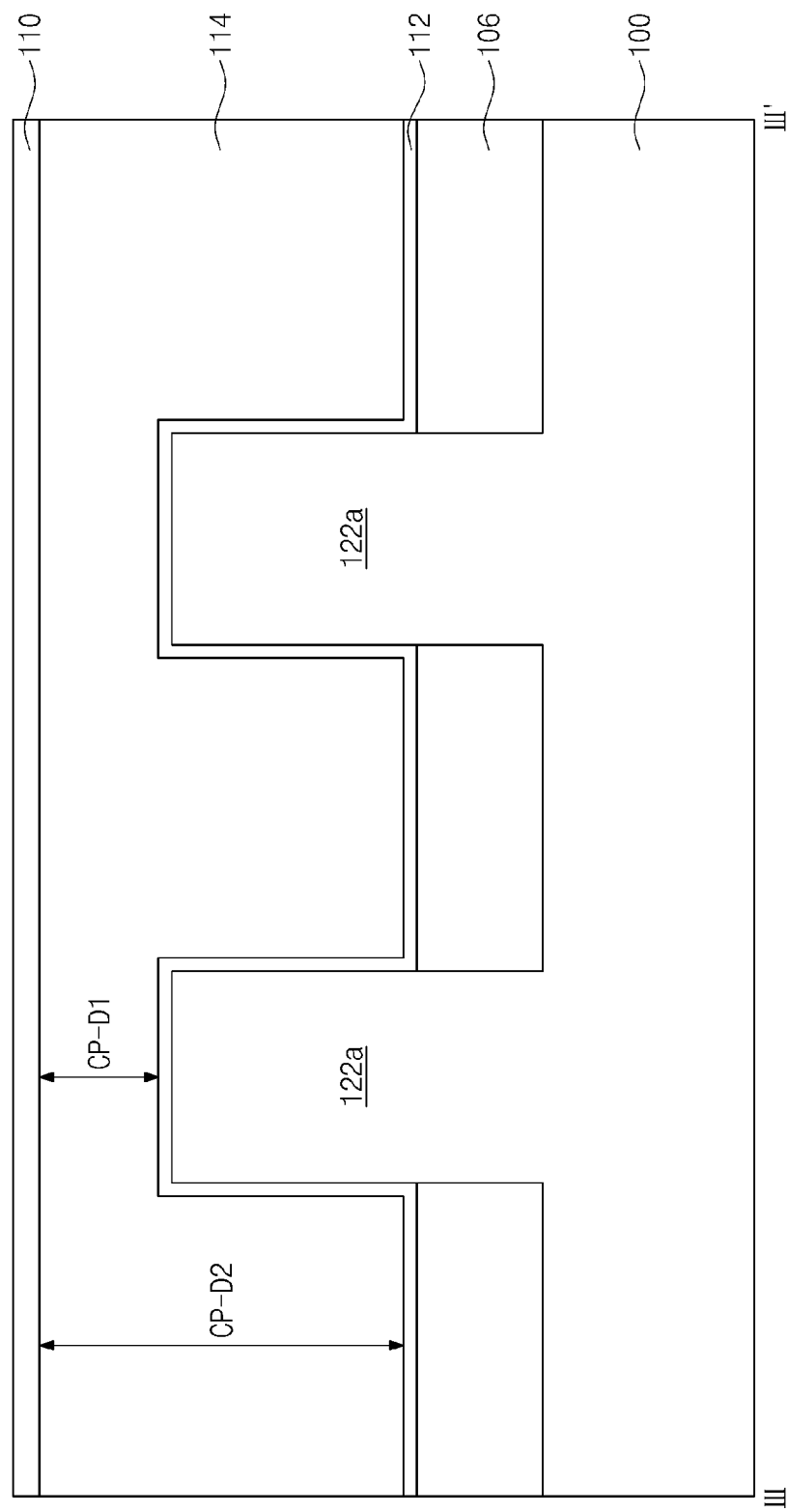

FIG. 1a is a perspective view illustrating a semiconductor device according to an example embodiment of the inventive concepts. FIG. 1b is a cross-sectional view illustrating a semiconductor device corresponding to line I-I' of FIG. 1a. FIG. 1c is a cross-sectional view illustrating a semiconductor device corresponding to line II-II' of FIG. 1a. FIG. 1d is a cross-sectional view illustrating a semiconductor device corresponding to line III-III' of FIG. 1a.

Referring to FIGS. 1a through 1d, a semiconductor device includes a substrate 100, a fin-type active pattern 122, a device isolation pattern 106, a pattern structure 120, a first impurity-doped pattern 132a, and a second impurity-doped pattern 132b.

In certain embodiments, the substrate 100 may comprise a bulk silicon substrate or a silicon-on-insulator (SOI) substrate. For example, the substrate 100 may include silicon (Si), silicon germanium (SiGe), indium antimonide (InSb), lead telluride (PbTe), indium arsenide (InAs), indium phosphide (InP), gallium arsenide (GaAs), and/or gallium antimonide (GaSb). The substrate 100 may also include an epitaxial layer formed on a base substrate.

The fin-type active pattern 122 may extend in a first direction. For example, the first direction may be along an X-axis. The fin-type active pattern 122 may include a plurality of patterns. The plurality of the fin-type active patterns may be extended to the first direction and spaced from each other substantially the same distance to a second direction. For example, the second direction may be along a Y-axis. The fin-type active pattern 122 may be a part of the substrate 100. In one embodiment, for example, the fin-type active pattern 122 includes an epitaxial layer grown from the substrate 100.

The fin-type active pattern 122 may protrude from the substrate in a third direction. For example, the third direction may be along a Z-axis (e.g., vertically). In one embodiment, the fin-type active pattern 122 has a first portion 122a formed in a first active pattern region and a second portion 122b formed in a second active pattern region, both portions protruding from the substrate 100. The first portion 122a, also explained herein as a first region 122a, may have a first thickness ACT_D1 from the substrate 100 and the second portion 122b, also explained herein as a second region 122b may have a second thickness ACT_D2 from the substrate 100. The second thickness ACT_D2 may be less than the first thickness ACT_D1. The second region 122b may be disposed at both sides of the first region 122a. The first portion 122a and second portion 122b may form an upside-down T-shape. For example, the first portion 122a may include the entire section of the fin-type active pattern 122 whose vertical thickness is depicted as ACT_D1 or greater, and the second portion 122b may include the remaining section of the fin-type active pattern 122 whose vertical thickness is depicted as ACT-D2. A first and a second impurity-doped region 132a and 132b are disposed in the second active pattern region on the second portion 122b which is disposed at the both sides of the first active pattern region.

The device isolation pattern 106 may cover a lower portion of the sidewalls of the fin-type active pattern 122. For example, the device isolation pattern 106 may cover a lower portion of the first region 122a of the fin-type active pattern 122. The upper surface of the first region 122a may be at a level higher than that of the upper surface of the device isolation pattern 106. On the contrary, the upper surface of the second region 122b of the fin-type active pattern may be at a level equal to or lower than that of the upper surface of the device isolation pattern 106. The device isolation pattern 106 may comprise, for example, silicon oxide, silicon nitride, and/or silicon oxynitride.

The pattern structure 120 may include an insulation pattern 112, a line pattern 114, and/or a spacer 116. The line pattern 114 may have a line shape, for example, crossing over the fin-type active pattern 122. For example, the line pattern 114 may be extended along the Y-axis. Though only one line is shown, the line pattern 114 may comprise a plurality of lines. The plurality of lines of the line pattern 114 may be spaced from each other by substantially the same distance in the X-direction. In certain embodiments, the line pattern 114 may be a portion of a gate electrode of a fin-type field effect transistor (FinFET). For example, the line pattern may include a conductive material that forms the gate electrode. The pattern structure 120 may therefore include a plurality of gate structures extending in the Y-direction and separated from each other in the X-direction.

The line pattern 114 may cover the device isolation pattern 106 and a portion of the first region 122a of the fin-type active pattern 122. The line pattern 114 may comprise a first region 114a having a first thickness CP_D1 and a second region 114b having a second thickness CP_D2. Note that the term "pattern" as used herein may refer to a group of repeated elements or single element. For example, a line pattern as described herein may refer to a single line, or to a group of lines spaced apart from each other that are formed by the same patterning process. The first region 114a of the line pattern 114 may be disposed on the first region 122a of the fin-type active pattern 122. The second region 114b of the line pattern 114 may be disposed on the device isolation pattern 106. The upper surfaces of the first region 114a of the line pattern 114 may have a level substantially equal to that of the upper surface of the second region 114b of the line pattern 114. The line pattern 114 may cover the upper surface and the sidewall of the first region 122a of the fin-type active pattern 122. In one embodiment, the insulation pattern 112 is disposed between the first region 122a of the fin-type active pattern 122 and the line pattern 114 as shown in FIG. 1d.

The line pattern 114 may include, for example, silicon (Si) or silicon germanium (SiGe). The line pattern 114 may also include a metal or a metal compound. For example, the line pattern 114 may include at least one selected from the group consisting of tungsten (W), aluminum (Al), titanium nitride (TiN), tantalum nitride (TaN), titanium carbide (TiC), tantalum carbide (TaC).

The insulation pattern 112, which is disposed between the first region 122a of the fin-type active pattern 122 and the line pattern 114, may extend along the Y-axis direction. The insulation pattern 112 may perform as a gate dielectric layer of the fin-type field effect transistor (FinFET). The insulation pattern 112 may include, for example, silicon oxide ($Si_xO_y$). The insulation pattern 112 may also include a high-k dielectric layer having a higher dielectric constant than that of a silicon oxide layer. For example, the insulation pattern 112 may include at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The spacer 116 may be disposed at the sidewalls of the insulation pattern 112 and the line pattern 114 and may extend along the Y-axis direction. The spacer 116 may include, for example, silicon nitride, silicon oxide, and/or silicon oxynitride.

The spacer 116 may comprise a first region 116a having a first thickness SP_D1 (also described as a first height) and a second region 116b having a second thickness SP_D2 (also described as a second height) thicker or greater than the first thickness SP_D1. The first region 116a of the spacer 116 may be disposed on the first region 112a of the fin-type active pattern 122. The second region 116b of the spacer 116 may be disposed on the device isolation pattern 106. The uppermost surfaces of the first and second regions 116a and 116b of the spacer 116 may be at substantially the same level. A lower portion of the sidewall of the spacer 116 and the uppermost portion of the sidewall of the first region 122a of the fin-type active pattern 122 may be at substantially the same level as shown in FIG. 1b. Thus, these sidewalls may have overlapping heights in the Z-direction. Thus, the sidewall of the first region 122a of the fin-type active pattern 122 may be exposed in relation to the substrate at the bottom of the spacer 116.

The pattern structure 120 may include a mask pattern 110 disposed on the line pattern 114. The mask pattern 110 may also extend in the Y-axis direction. The mask pattern 110 may include, for example, silicon nitride and/or silicon oxynitride.

The first and second impurity-doped patterns 132a and 132b may be disposed on the second region 122b of the fin-type active pattern 122. At least one of n-type or p-type Impurities may be injected into the first and second impurity-doped patterns 132a and 132b, for example, by a plasma doping process. The impurity concentration along the sidewall of the first impurity-doped pattern 132a may be substantially the same as the impurity concentration along the sidewall the second impurity-doped pattern 132b. In addition, the impurity concentration of each of these impurity-doped patterns may be uniform along these sidewalls. The impurity concentration of each of the first and second impurity-doped patterns 132a and 132b at the sidewall of the first region 122a of the fin-type active pattern 122 may also be substantially the same along the Z-axis direction and may further be uniform along these sidewalls.

In one embodiment, the first and the second impurity-doped pattern 132a and 132b may be formed on the second region 122b of the fin-type active pattern 122 by using a selective epitaxial growth (SEG) process. Therefore, a vertical plane of the first and the second impurity-doped pattern 132a and 132b may have a circle shape or a polygonal shape. A horizontal width of the first and the second impurity-doped pattern 132a and 132b (e.g., along a Y-axis direction) may be greater than that of the second region 122b of the fin-type active pattern 122. The upper surfaces of the first and second impurity-doped patterns 132a and 132b may be at a level higher than that of the upper surface of the device isolation pattern 106, but lower than that of the upper surface of the pattern structure 120. However, in certain embodiments, the first and second impurity-doped patterns 132a and 132b may have a different shape unlike mentioned above.

If the semiconductor device includes a fin-type PMOS transistor, the first and second impurity-doped patterns 132a and 132b may have a compressive stress. The compressive stress may be induced, for example, by injecting a material having a lattice constant greater than that of silicon (Si), e.g., silicon germanium (SiGe) into the first and second impurity-doped patterns 132a and 132b. The compressive stress induced in the first and second impurity-doped patterns 132a and 132b may increase the carrier mobility in the channel area of the fin-type PMOS transistor. The first and second impurity-doped patterns 132a and 132b may include, for example, boron (B). The first and second impurity-doped patterns 132a and 132b may further include carbon (C) in order to prevent or decrease diffusion of the boron.

If the semiconductor device includes a fin-type NMOS transistor, the first and second impurity-doped patterns 132a and 132b may have a tensile stress. The tensile stress may be induced by injecting a material having a lattice constant less than that of silicon (Si), e.g., silicon carbide (SiC) into the first and second impurity-doped patterns 132a and 132b. The tensile stress induced in the first and second impurity-doped patterns 132a and 132b may increase the carrier mobility in the channel area of the fin-type NMOS transistor. The first and second impurity-doped patterns 132a and 132b may include, for example, phosphorus (P) and/or arsenic (As).

In certain embodiments, the sidewall of the first and second impurity-doped pattern 132a and 132b (e.g., a sidewall on an outside of a first active pattern region 122a of the pattern structure 120) may have an impurity concentration higher than that of the bottom of the first and second impurity-doped pattern 132a and 132b (e.g., the portions of the first and second impurity-doped patterns 132a and 132b below a top surface of the device isolation pattern 106, such as a bottom surface of the first and second impurity-doped patterns 132a and 132b).

The first and second impurity-doped pattern 132a and 132b may have a lightly doped drain (LDD) structure. Portions of the first and second impurity-doped patterns 132a and 132b adjacent to the first region 122a of the fin-type active pattern 122 (e.g., directly adjacent to and/or contacting the first region 122a) may have impurity concentrations lower than those of the other portions of the first and second impurity-doped patterns 132a and 132b, respectively.

The upper surfaces of the first and second impurity-doped patterns 132a and 132b may have an impurity concentration higher than that of certain other portions of the first and second impurity-doped patterns 132a and 132b (e.g., portions below the upper surfaces). Thus, contact resistances which are formed between the upper surfaces of the first and second impurity-doped patterns 132a and 132b and contact plugs being electrically connected to them, may become lower.

When the impurities are injected into the first and second impurity-doped patterns 132a and 132b by using a plasma doping process, the source/drain junction depth of the fin-type field effect transistor (FinFET) is controlled uniformly and the transistor's performance of the semiconductor device is improved.

Figure 2A:
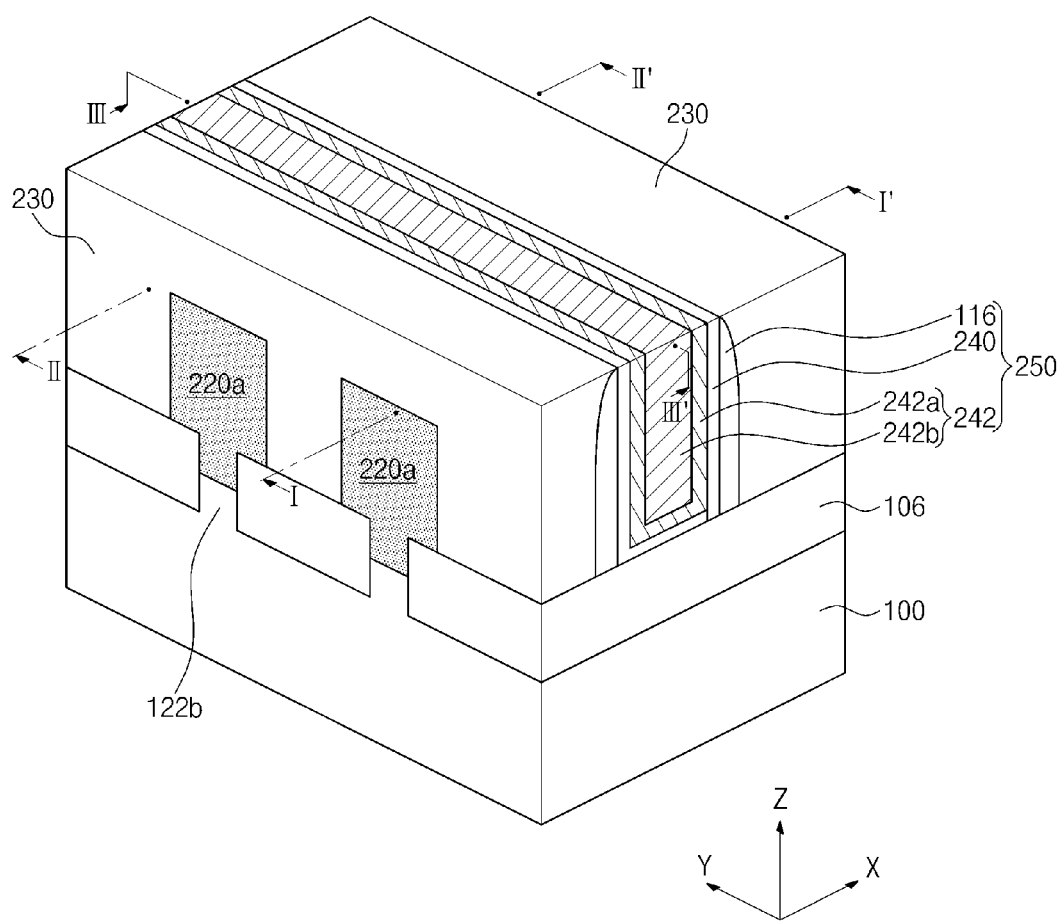
FIGS. 2a through 2d are a perspective view and cross-sectional views illustrating a semiconductor device according to another example embodiment of the inventive concepts.
Figure 2B:
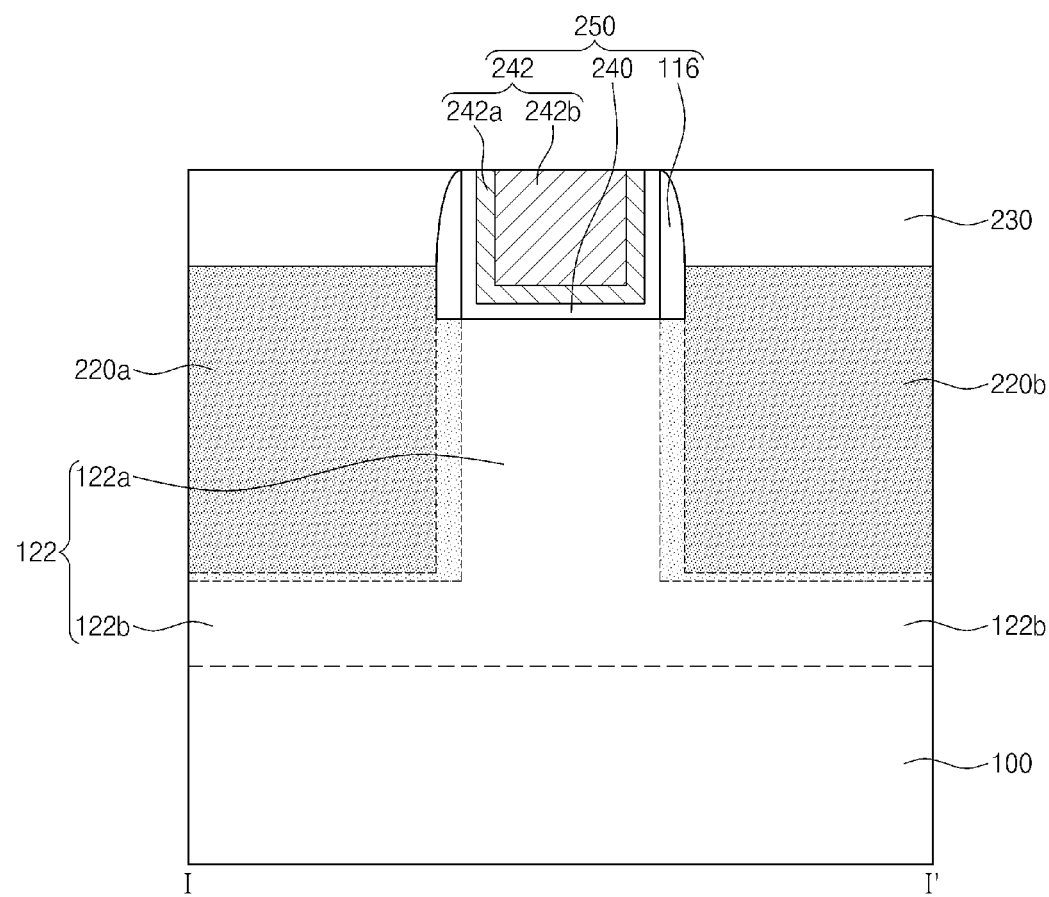
Figure 2C:
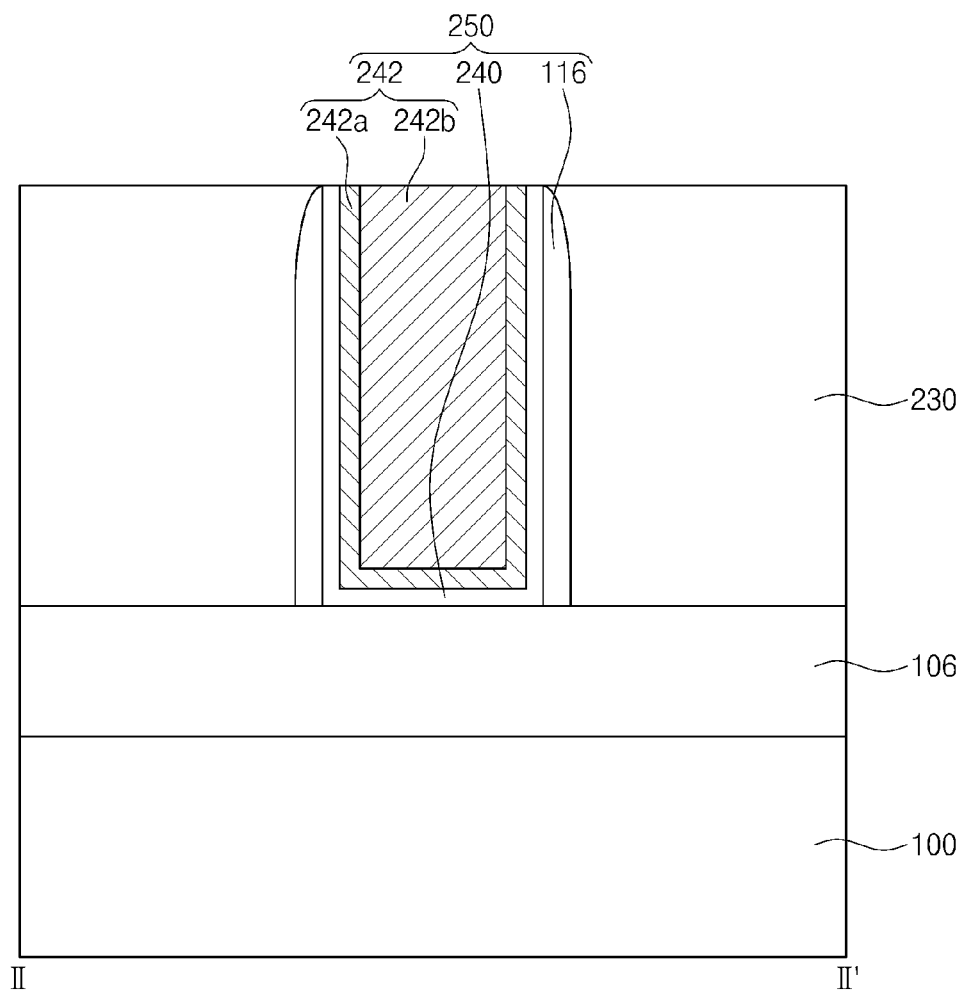
Figure 2D:
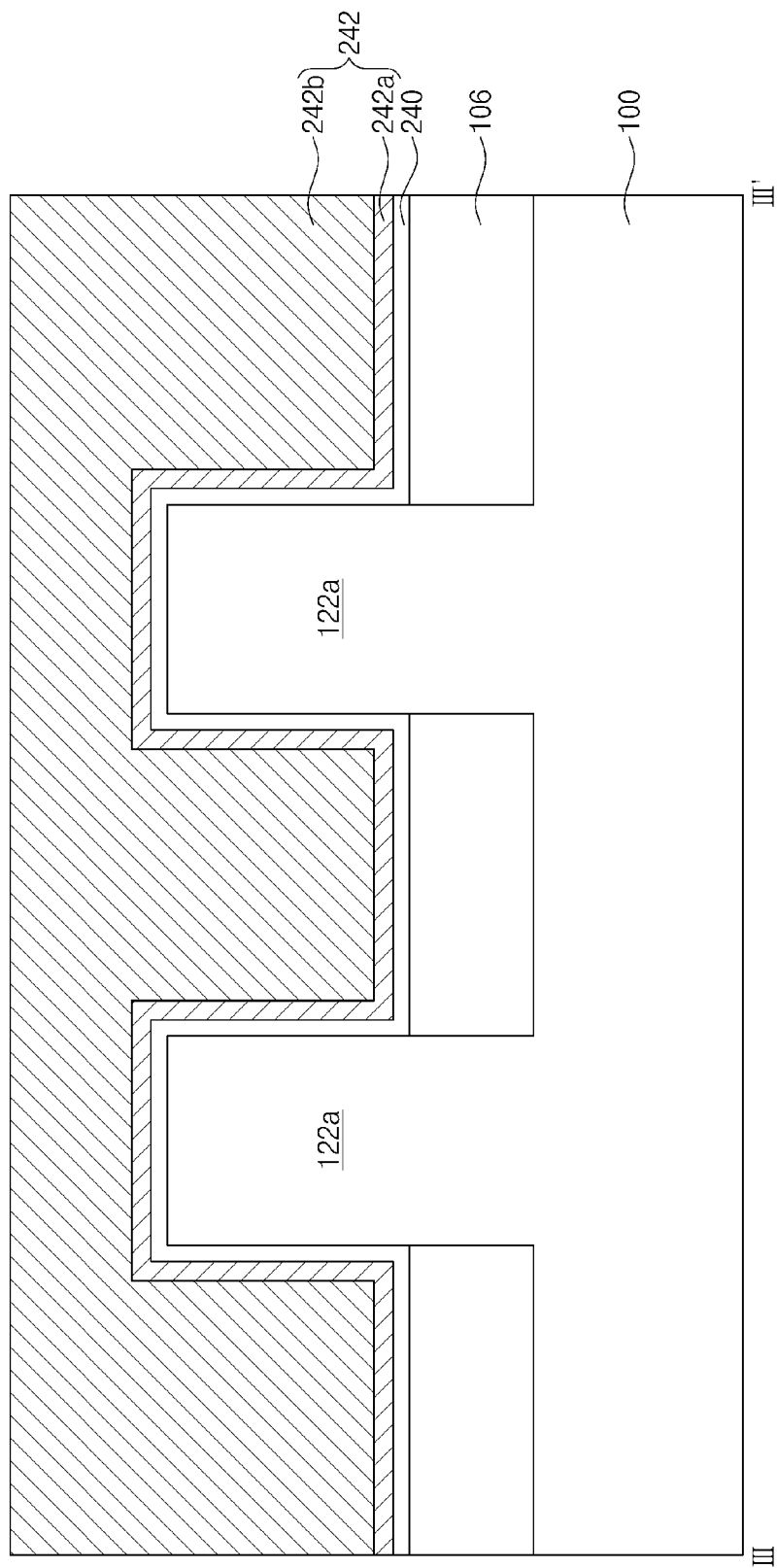

FIG. 2a is a perspective view illustrating a semiconductor device according to another example embodiment of the inventive concepts. FIG. 2b is a cross sectional view illustrating a semiconductor device corresponding to line I-I' of FIG. 2a. FIG. 2c is a cross sectional view corresponding to line II-II' of FIG. 2a. FIG. 2d is a cross sectional view corresponding to line III-III' of FIG. 2a.

Referring to FIGS. 2a through 2d, a semiconductor device may include a substrate 100, a fin-type active pattern 122, a device isolation pattern 106, a pattern structure 250, a first impurity-doped pattern 220a, and a second impurity-doped pattern 220b.

The pattern structure 250 may include a gate dielectric layer pattern 240, a gate electrode 242, and a spacer 116.

The gate electrode 242 may have a line shape crossing over the fin-type active pattern 122. For example, the gate electrode 242 may extend in the Y-axis direction. The gate electrode 242 may be formed by using a replacement process including removing the line pattern 114 as mentioned above referring to FIGS. 1a through 1d.

The gate electrode 242 may have a multilayer structure. If the gate electrode 242 has a structure of bilayer, a lower layer 242a of the gate electrode 242 may control the work function value of the gate electrode 242 and include at least one selected from the group of titanium nitride (TiN), tantalum nitride (TaN), titanium carbide (TiC), and tantalum carbide (TaC). An upper layer 242b of the gate electrode 242 may include tungsten (W) and/or aluminum (Al).

The gate dielectric layer pattern 240 may cover the sidewall and the bottom of the gate electrode 242 and may extend in the Y-axis direction. The gate dielectric layer pattern 240 may be formed by a replacement process including removing the insulation pattern 112 as mentioned above referring to FIGS. 1*a* through 1*d*.

A detailed description about the spacer 115 may be omitted because in one embodiment, it is substantially the same to the description as mentioned above referring to FIGS. 1*a* and 1*b*.

The semiconductor device may further include an interlayer insulating layer 230 covering the sidewall of the pattern structure 250. The upper surface of the interlayer insulating layer 230 may be at substantially the same level as the upper surface of the pattern structure 250. The interlayer insulating layer 230 may include, for example, silicon oxide, silicon nitride, and/or silicon oxynitride.

Detailed descriptions about the substrate 100, the fin-type active pattern 122, the device isolation pattern 106, the pattern structure 120, and the first and second impurity-doped patterns 220*a* and 220*b* are also omitted because they may be substantially the same as the descriptions as mentioned above referring to FIGS. 1*a* through 1*d*.

FIGS. 3*a* through 10*a* are perspective views illustrating a method of manufacturing a semiconductor device according to still another example embodiment of the inventive concepts. FIGS. 3*b* through 10*b* are cross-sectional views illustrating a method of manufacturing a semiconductor device according to an example embodiment of the inventive concepts corresponding to line I-I' of FIG. 10*a*.

Figure 3A:
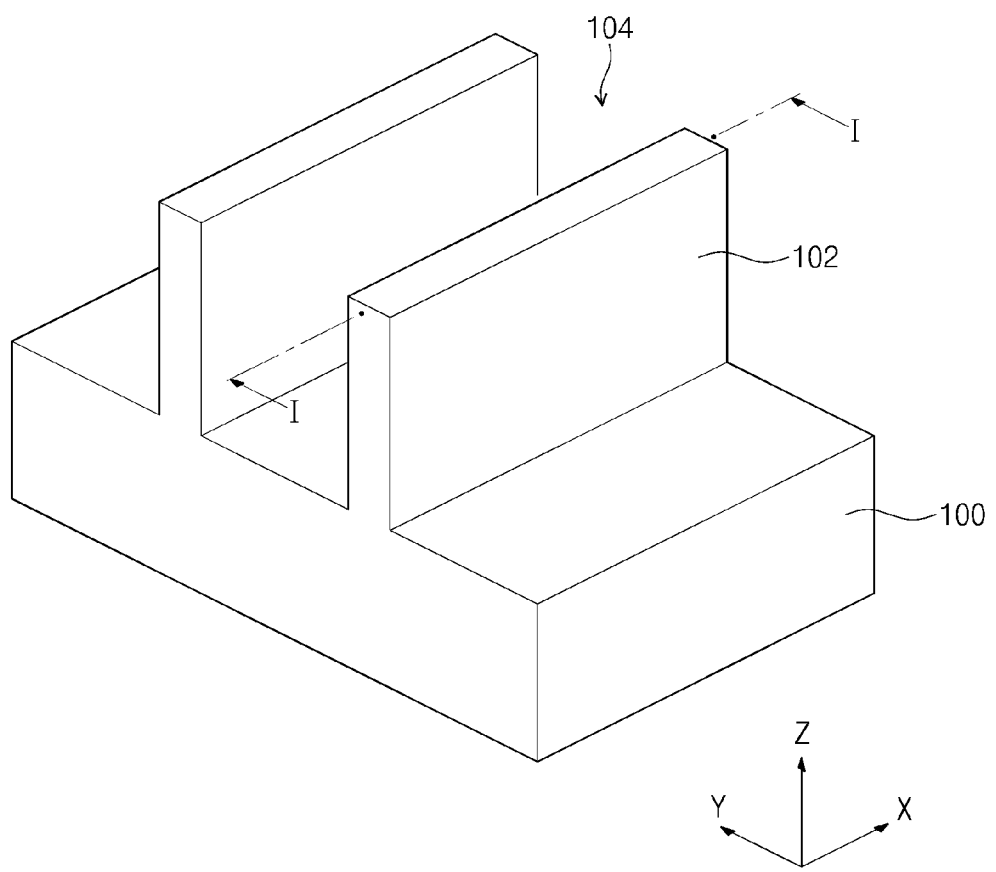
Figure 3B:
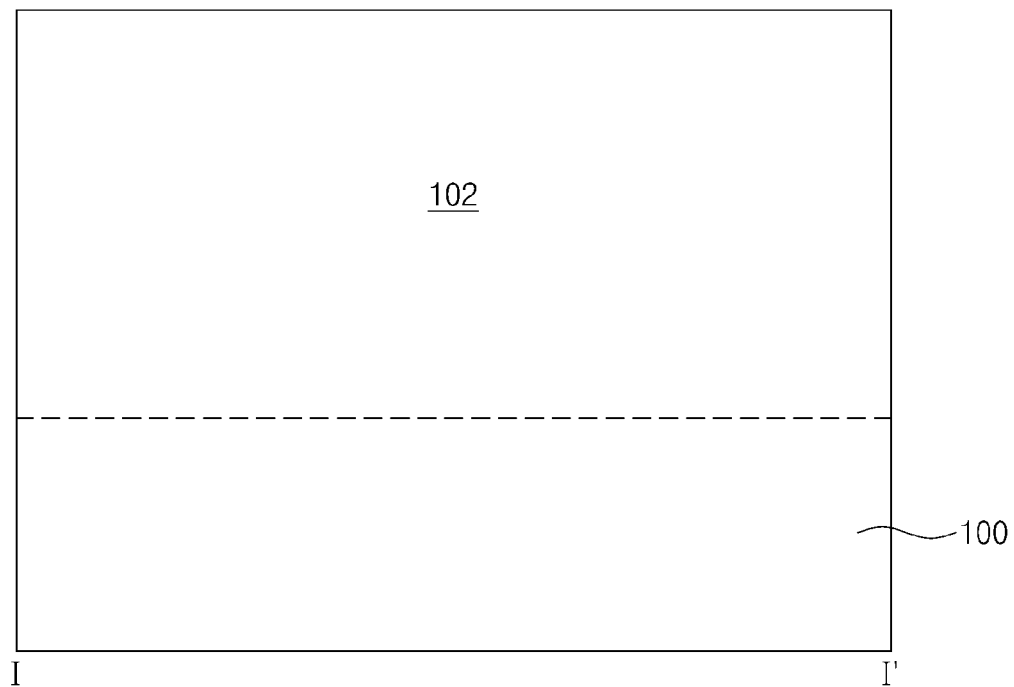

Referring to FIGS. 3*a* and 3*b*, one or more trenches 104 extending along the X-axis direction and defining a plurality of preliminary fin-type active patterns 102 may be formed by etching the substrate 100 using a first mask pattern. The plurality of the preliminary fin-type active patterns 102 are separated from each other in the Y-axis direction. Each may be defined by two trenches 104 and spaced from an adjacent preliminary fin-type active pattern 102 by a particular distance.

Figure 4A:
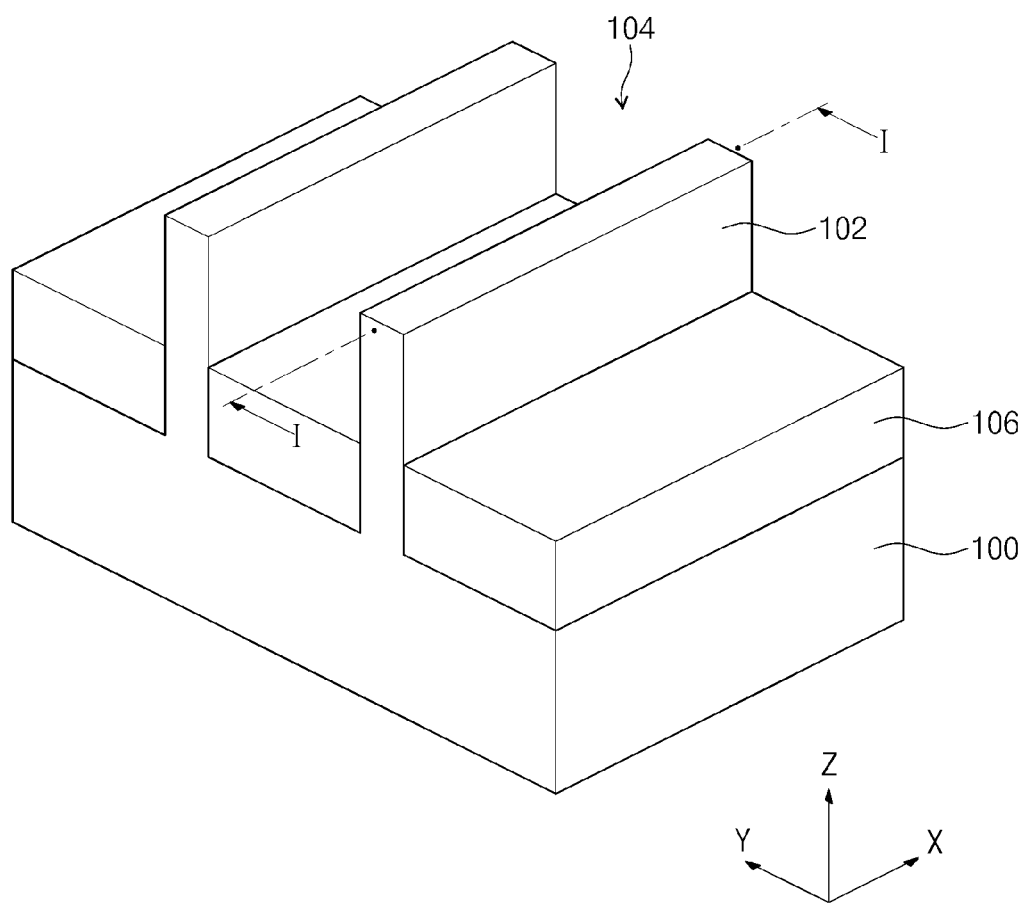
Figure 4B:
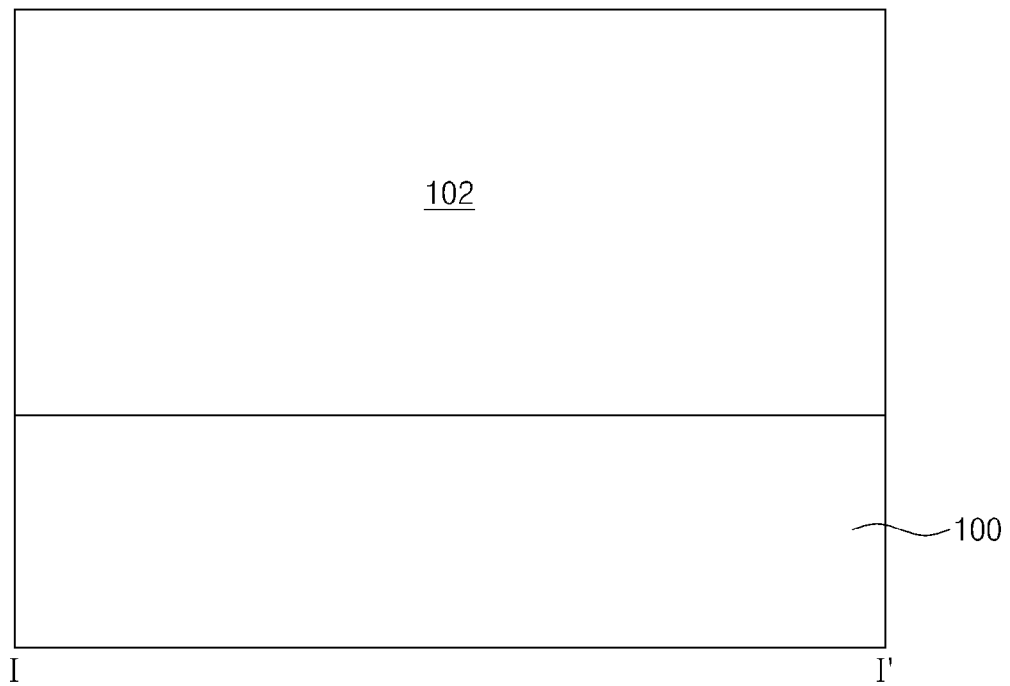

Referring to FIGS. 4*a* and 4*b*, a device isolation pattern 106 may be formed in the trench 104. Specifically, a device isolation layer filling the trench 104 may be formed on the substrate 100 and the plurality of the preliminary fin-type active patterns 102. The device isolation layer may include, for example, silicon oxide, silicon nitride, and/or silicon oxynitride. The device isolation layer may be planarized by a planarization process. In one embodiment, after planarization, the upper surface of the device isolation layer is at substantially the same level as the upper surfaces of the plurality of the preliminary fin-type active patterns 102. And then, the device isolation layer may be recessed, for example, using an etch-back process to form the device isolation pattern 106. Upper sidewalls of the plurality of the preliminary fin-type active patterns 102 (e.g., sidewalls extending along the X-Z plane, and also sidewalls extending along the Y-Z plane) may be exposed after the etch-back process.

In an alternative embodiment, an epitaxial layer may be formed on the plurality of the preliminary fin-type active patterns 102 by using an epitaxial growth process without recessing the device isolation layer 106. Therefore, the epitaxial layer may extend from the upper surface of the substrate 100. An upper surface of the epitaxial layer may be at a level higher than an upper surface of the device isolation layer 106.

Impurities may be injected into the plurality of the preliminary fin-type active patterns 102 to control the threshold voltage of the fin-type field effect transistor. If the fin-type field effect transistor is a NMOS transistor, the impurities may include, for example, boron (B). If the fin-type field effect transistor is a PMOS transistor, the impurities may include, for example, phosphorus (P) or arsenic (As).

Figure 5A:
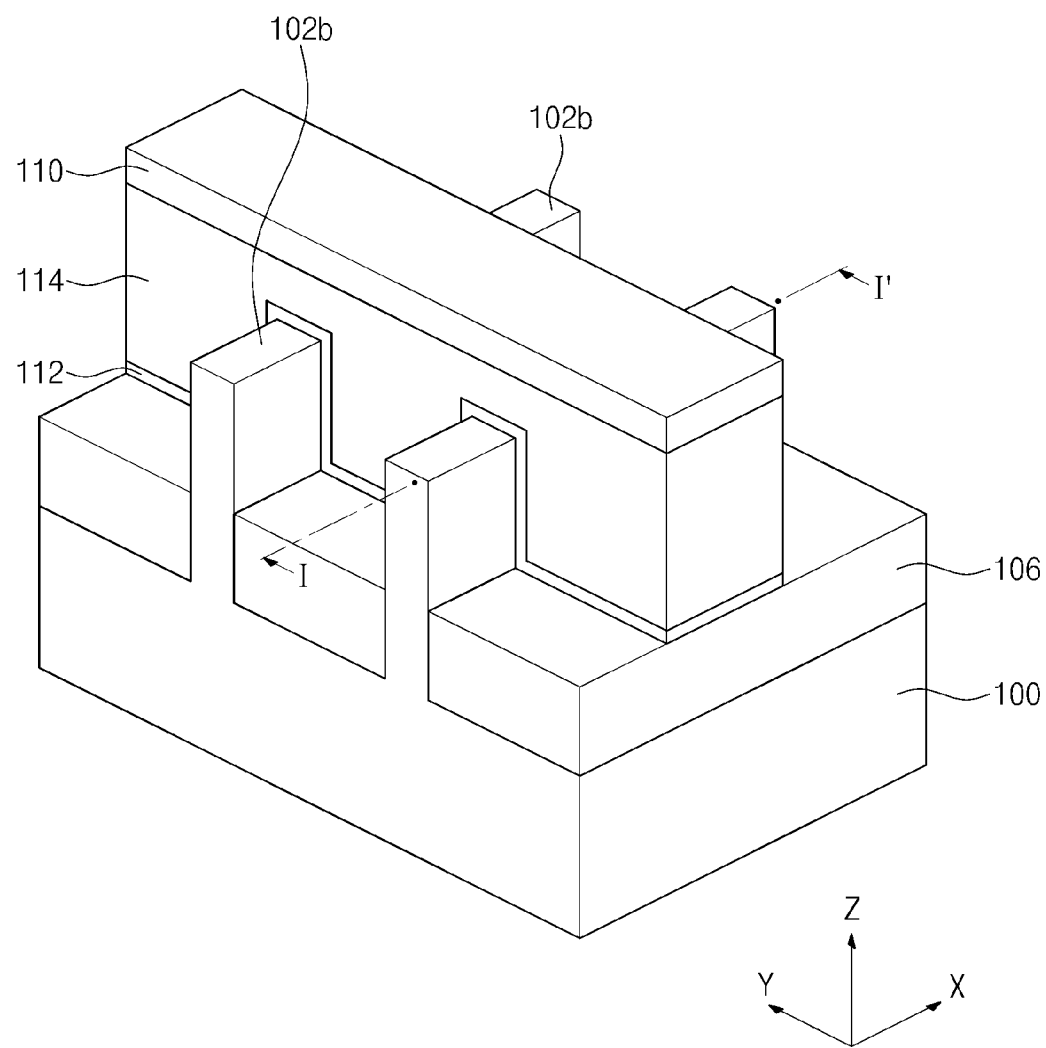
Figure 5B:
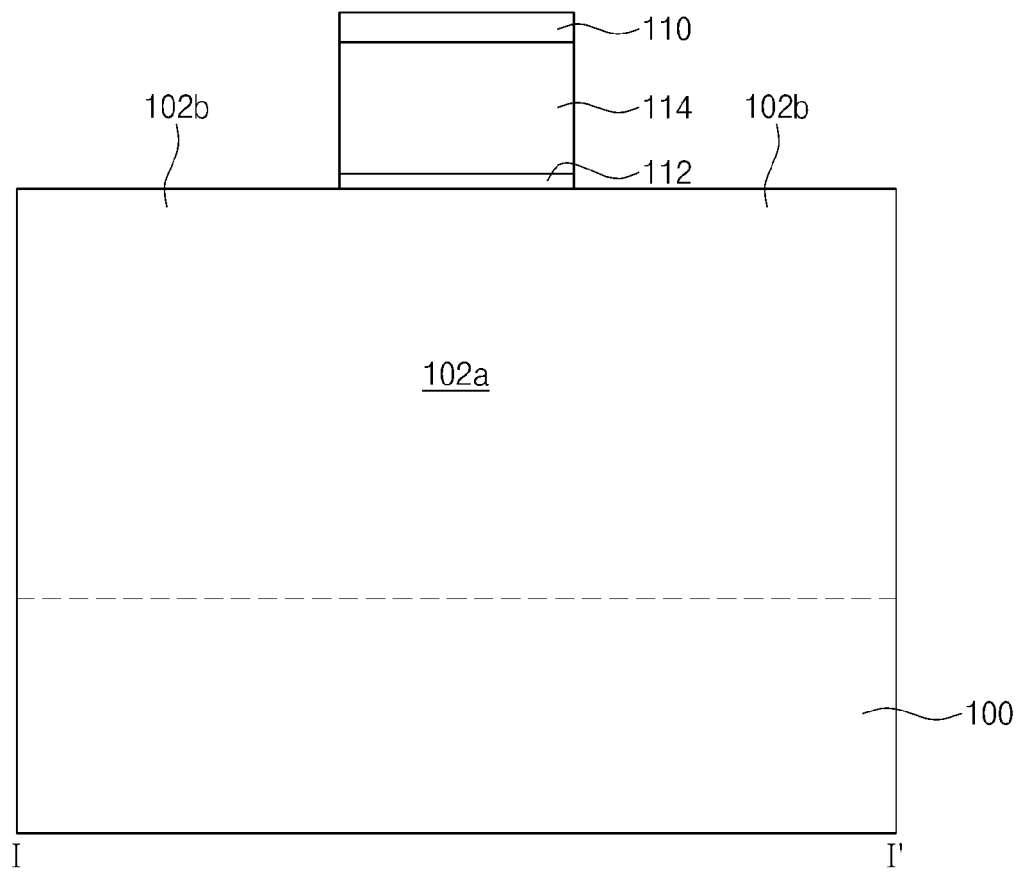

Referring to FIGS. 5*a* and 5*b*, an insulation pattern 112 and a line pattern 114 may be formed on the plurality of the preliminary fin-type active patterns 102 and the device isolation pattern 106.

Specifically, a dielectric layer and a material layer may be formed on the plurality of the preliminary fin-type active patterns 102 and the device isolation pattern 106. The dielectric layer may include, for example, silicon oxide, silicon nitride and/or silicon oxynitride. The material layer may include, for example, silicon (Si) or silicon germanium (SiGe). Alternatively, the material layer may include at least one material selected from the group consisting of tungsten (W), aluminum (Al), titanium nitride (TiN), tantalum nitride (TaN), titanium carbide (TiC), and tantalum carbide (TaC).

A second mask pattern 110 may be formed on the material layer. The second mask pattern 110 may cross over the plurality of the preliminary fin-type active patterns 102 and extend in the Y-axis direction.

The second mask pattern 110 may comprise a material having an etch selectivity with respect to the plurality of the preliminary fin-type active patterns 102. The second mask pattern 110 may include, for example, silicon nitride, silicon oxide, and/or silicon oxynitride. Alternatively, the second mask pattern 110 may be a bilayer structure having a silicon nitride pattern and a photoresist pattern.

A line pattern 114 and an insulation pattern 112 which extend along the Y-axis direction may be formed by etching the material layer and the dielectric layer using the second mask pattern 110 as an etch mask.

The plurality of the preliminary fin-type active patterns 102 may comprise a first region 102*a* covered by the line pattern 114 and a second region 102*b* exposed at both sides of the line pattern 114.

Figure 6A:
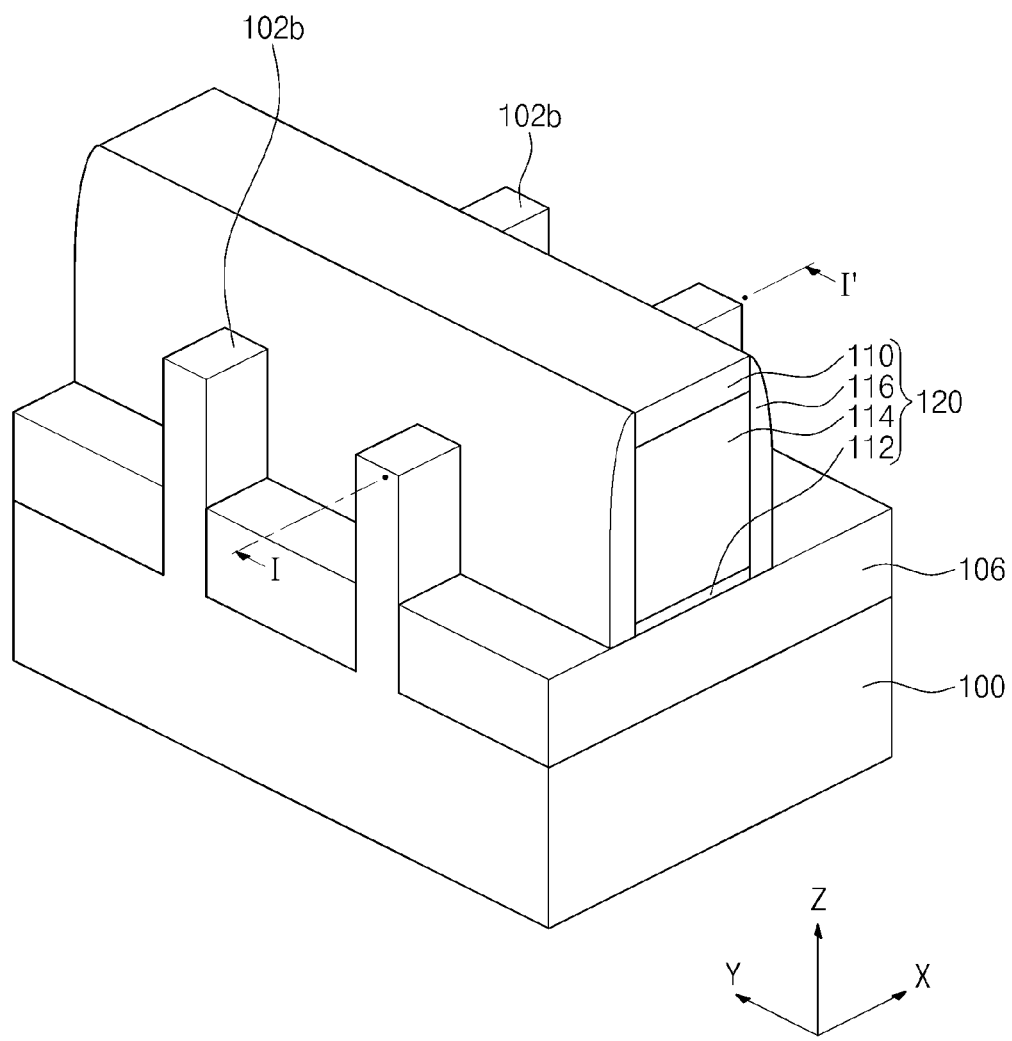
Figure 6B:
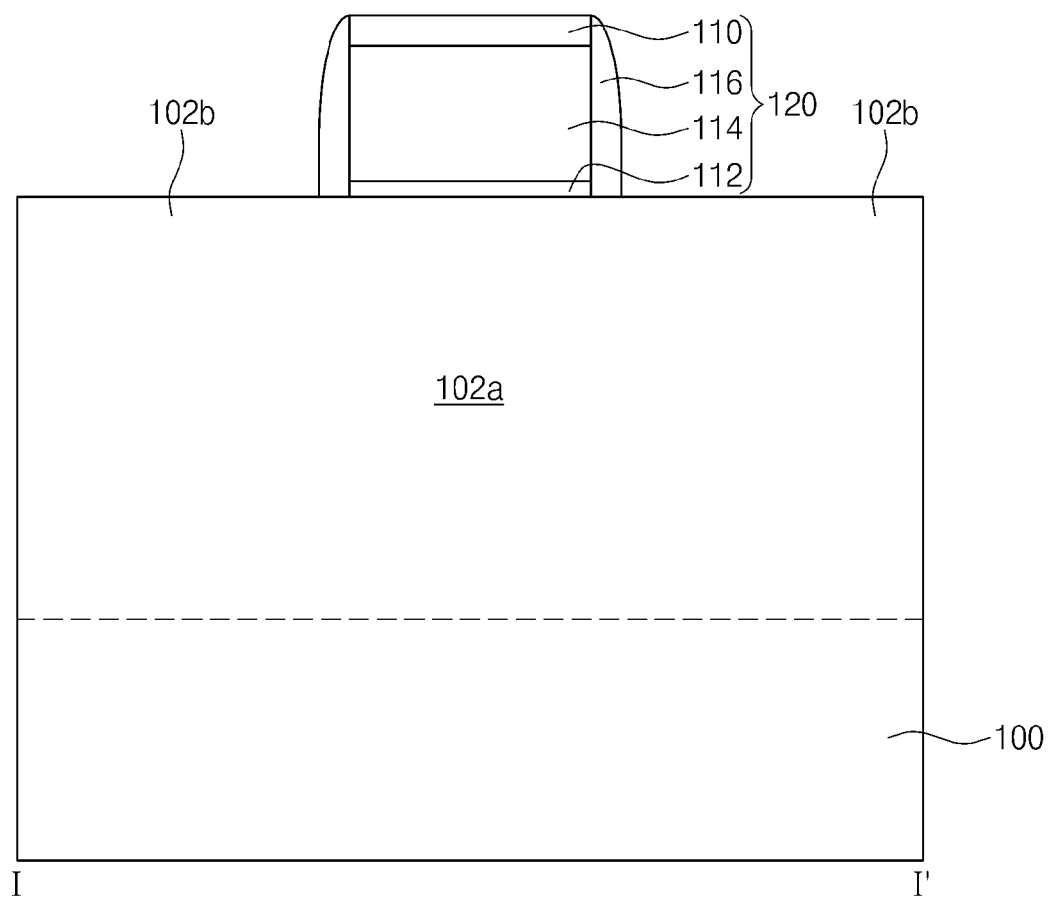

Referring to FIGS. 6*a* and 6*b*, a spacer 116 may be formed on the sidewalls of the insulation pattern 112 and the line pattern 114 (e.g., on sidewalls extending along the Y-Z direction).

Specifically, a spacer layer may be conformally formed on the plurality of the preliminary fin-type active patterns 102, the substrate 100, and the sidewalls of the insulation pattern 112 and the line pattern 114. The spacer layer may include, for example, silicon oxide, silicon nitride, and/or silicon oxynitride. The spacer extending in the Y-axis direction may be formed on the sidewalls of the insulation pattern 112 and the line pattern 114 by etching the spacer layer using, for example, an anisotropic etching process.

Thereby, a pattern structure 120 extending to the Y-axis may be formed on the plurality of the preliminary fin-type active patterns 102. The pattern structure 120 may include the insulation pattern 112, the line pattern 114, the second mask pattern 110, and the spacer 116. The insulation pattern 112 may be a gate dielectric layer pattern of the fin-type field effect transistor. The line pattern 114 may perform as a gate electrode of the fin-type field effect transistor. Thus the pattern structure 120 may also be referred to herein as a gate structure.

Figure 7A:
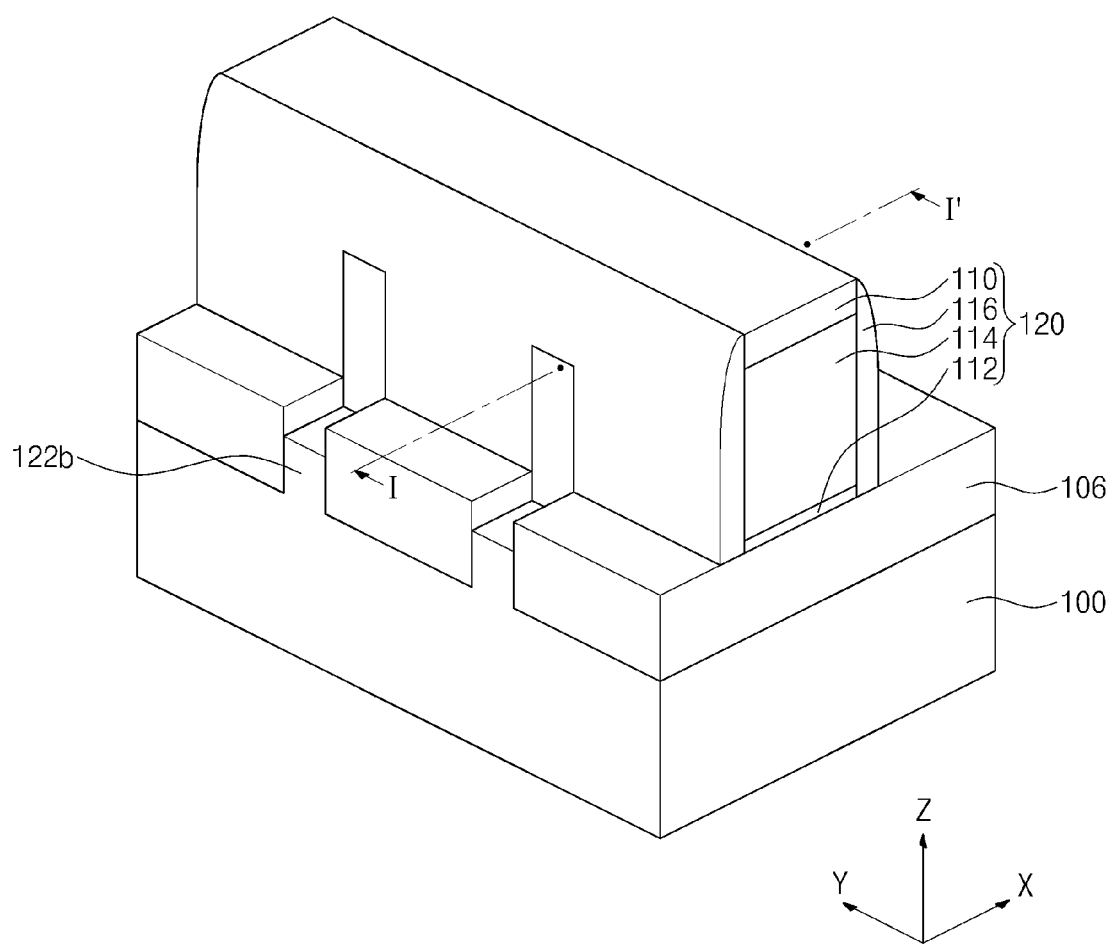
Figure 7B:
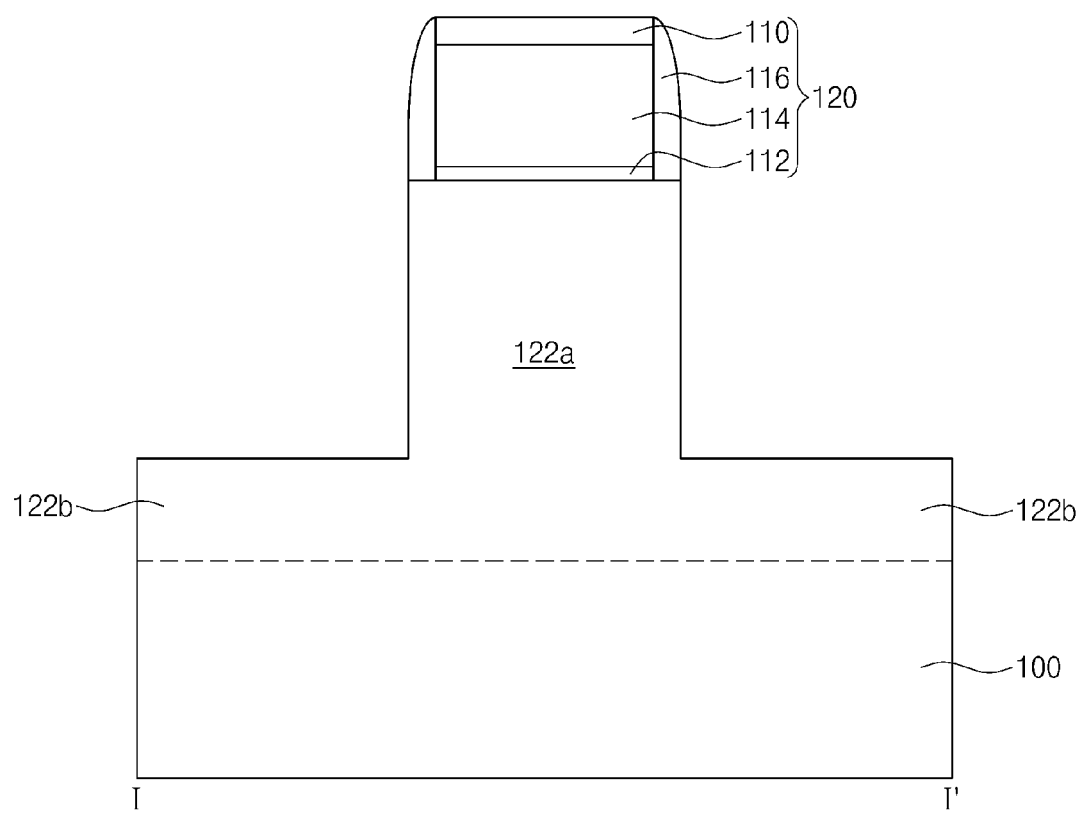

Referring to FIGS. 7*a* and 7*b*, a plurality of fin-type active patterns 122 may be formed by partially etching the second region 102*b* of the plurality of the preliminary fin-type active patterns 102.

The fin-type active pattern 122 may extend along the X-axis. The fin-type active pattern 122 may have a first region 122a having a first thickness (e.g., vertical thickness, in a Z-direction) and a second region 122b having a second thickness less than the first thickness. The first region 122a of the fin-type active pattern 122 may overlapped the line pattern 114, for example, in the Z-direction. The upper surface of the second region 122b of the fin-type active pattern 122 may have a level lower than or substantially equal to that of the upper surface of the device isolation pattern 106.

Figure 8A:
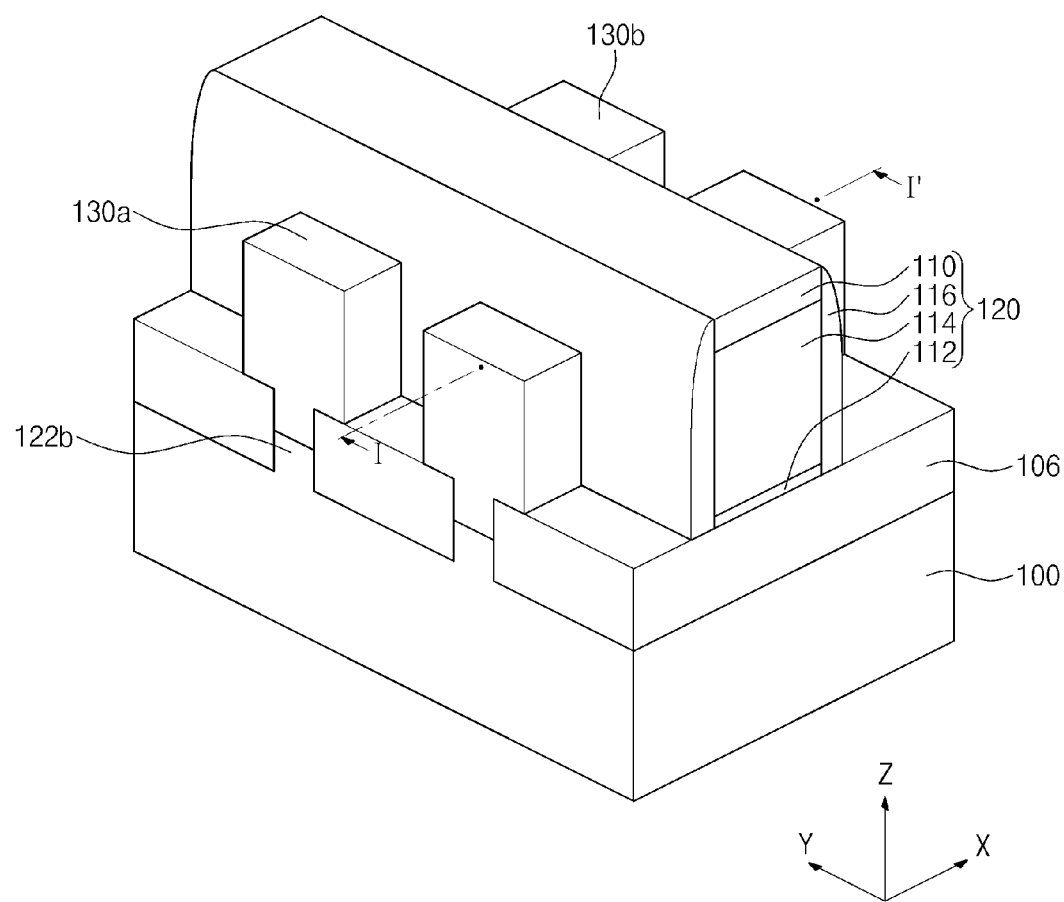
Figure 8B:
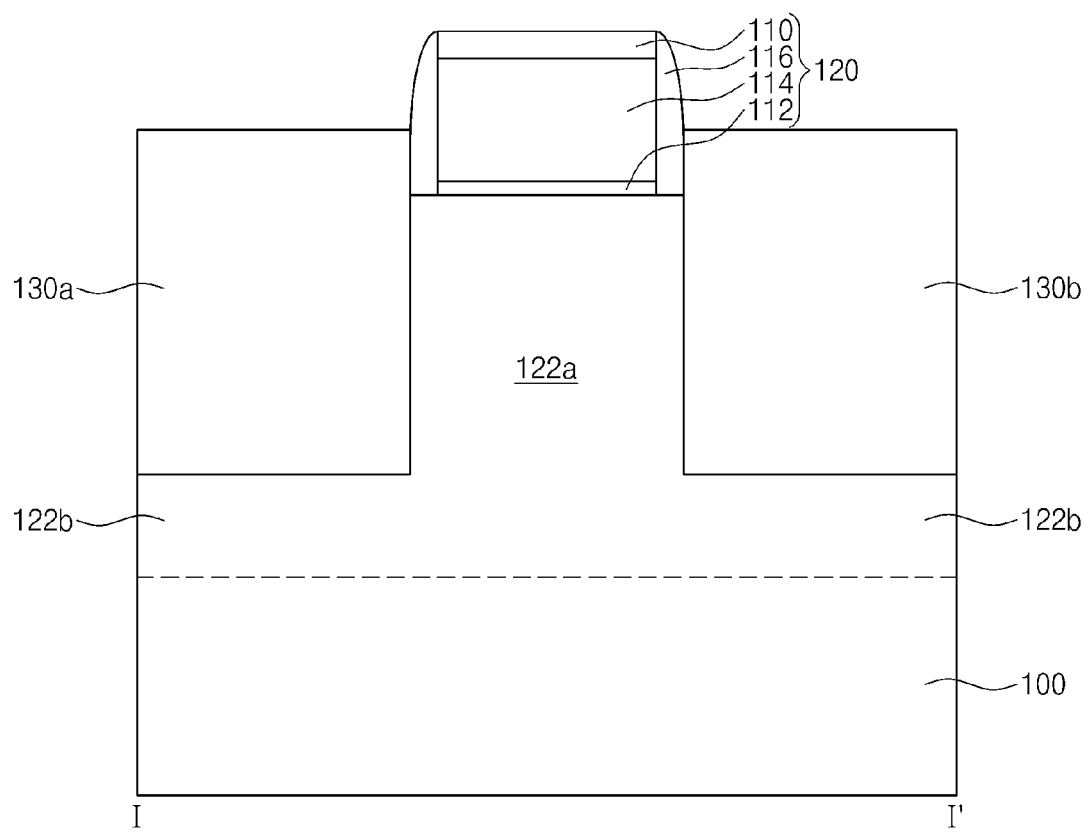

Referring to FIGS. 8a and 8b, a first preliminary impurity-doped pattern 130a and a second preliminary impurity-doped pattern 130b may be formed at both sides of the pattern structure, respectively. The first preliminary impurity-doped pattern 130a and the second preliminary impurity-doped pattern 130b may be formed on the second region 122b of the fin-type active pattern 122 by using a selective epitaxial growth process. A cross sectional view from the Y-axis direction of the first and second preliminary impurity-doped patterns 130a and 130b may have a rectangular shape, a hexagonal shape, a polygonal shape, or a circular shape. Horizontal widths (e.g., in the Y-direction) of the first and second preliminary impurity-doped patterns 130a and 130b may be greater than that of the fin-type active pattern 122. The upper surfaces of the first and second preliminary impurity-doped patterns 130a and 130b may have a level lower than that of upper surface of the pattern structure 120.

If the semiconductor device includes a fin-type PMOS transistor, the first and second preliminary impurity-doped patterns 130a and 130b may have a compressive stress. The compressive stress may be induced by injecting a material having a lattice constant greater than that of silicon (Si), e.g., silicon germanium (SiGe) into the first and second preliminary impurity-doped patterns 130a and 130b.

If the semiconductor device includes a fin-type NMOS transistor, the first and second preliminary impurity-doped patterns 130a and 130b may have a tensile stress. The tensile stress may be induced by injecting a material having a lattice constant less than that of silicon (Si), e.g., silicon carbide (SiC) into the first and second preliminary impurity-doped patterns 130a and 130b. Alternatively, the first and second preliminary impurity-doped patterns 130a and 130b may be formed of substantially the same material as the fin-type active pattern 122. In this case, the first and second preliminary impurity-doped patterns 130a and 130b may be formed of silicon (Si).

Impurities may be injected into the first and second preliminary impurity-doped patterns 130a and 130b during the selective epitaxial growth process. For example, if the semiconductor device includes a fin-type PMOS transistor, boron (B) may be injected into the first and second preliminary impurity-doped patterns 130a and 130b, for example by using an in-situ process. Carbon (C) may be further injected into them to reduce diffusion of boron (B). Alternatively, if the semiconductor device includes a fin-type NMOS transistor, arsenic (As) or phosphorus (P) may be injected into the first and second preliminary impurity-doped patterns 130a and 130b by using an in-situ process.

Figure 9A:
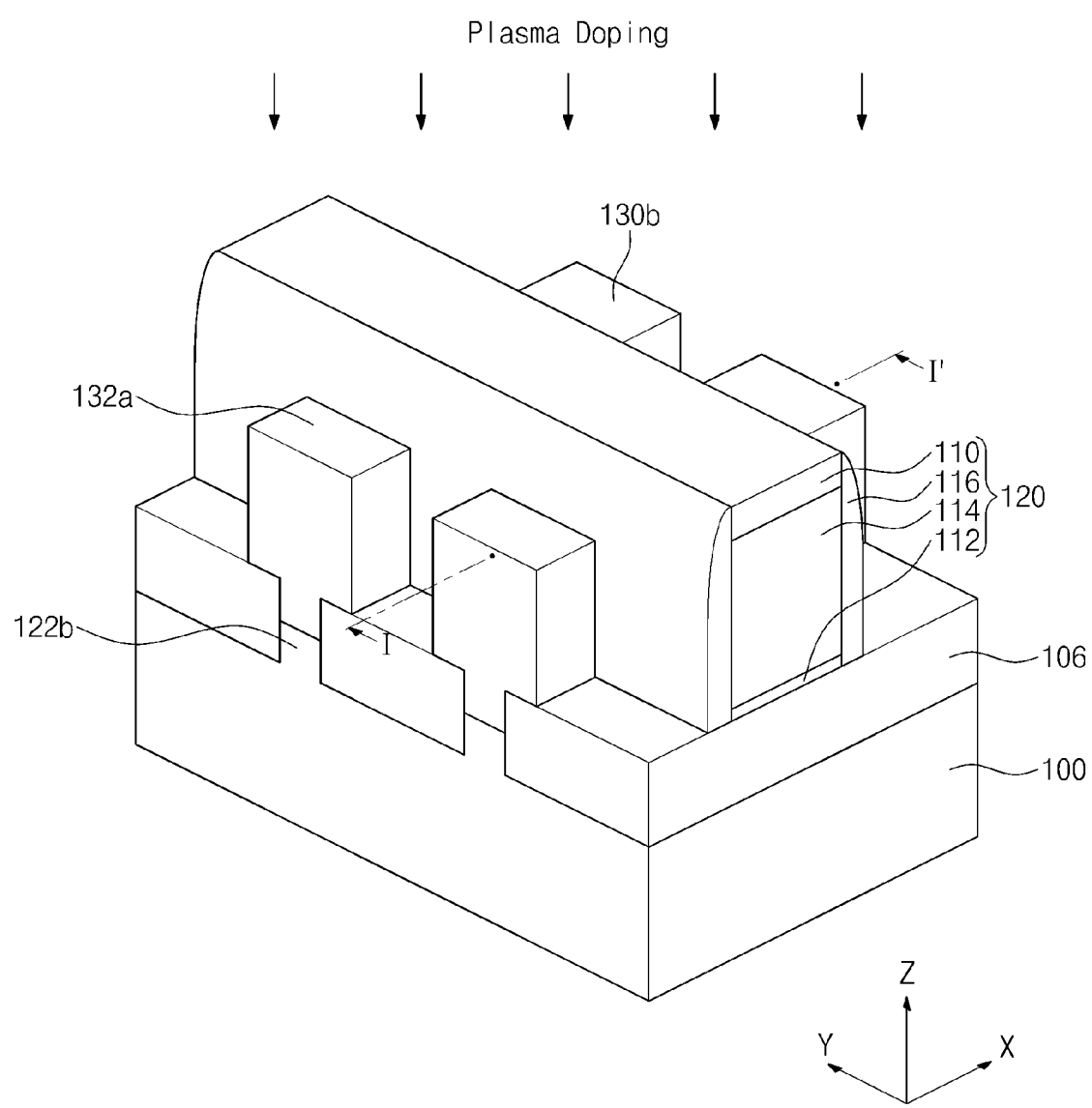
Figure 9B:
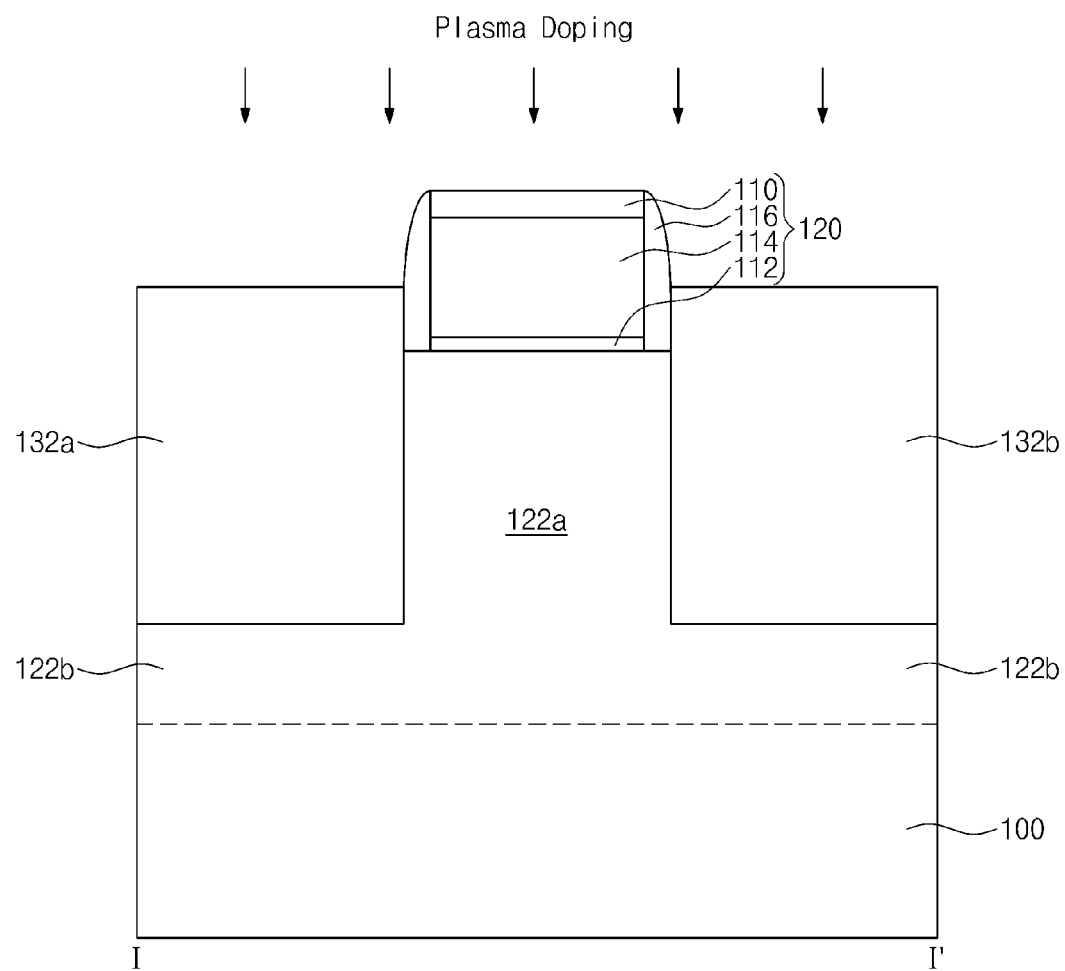

Referring to FIGS. 9a and 9b, alternatively, the impurities may be injected into the first and second preliminary impurity-doped patterns 130a and 130b by using a plasma doping process.

An exemplary plasma doping process will be specifically explained from now on. In one embodiment, the substrate 100 is loaded into a process chamber after forming the first and second preliminary impurity-doped patterns 130a and 130b using a selective epitaxial growth process as mentioned above referring to FIGS. 8a and 8b. Then, a source gas is injected into the process chamber to perform the plasma doping process.

The source gas may include an impurity gas including an n-type dopant or a p-type dopant. The source gas may further include a dilution gas. The dilution gas may include at least one selected from the group consisting of argon (Ar), neon (Ne), helium (He), hydrogen (H), Krypton (Kr), and Xenon (Xe).

If the semiconductor device includes a fin-type PMOS transistor, the impurity gas may include, for example, boron (B), boron hydride, and/or boron halide. The impurity gas may further include carbon (C), carbon hydride, and/or carbon halide.

If the semiconductor device includes a fin-type NMOS transistor, the impurity gas may include, for example, arsenic (As) or phosphorus (P). For example, the impurity gas may include arsenic hydride and/or arsenic halide.

The impurities in the impurity gas may be ionized by a plasma induced in the process chamber. The ionized impurities may be injected into the first and second preliminary impurity-doped patterns 130a and 130b when a direct current (DC) bias is induced to the substrate 100. Thereby the first and second preliminary impurity-doped patterns 130a and 130b may be transformed to the first and second impurity-doped patterns 132a and 132b.

The first impurity-doped pattern 132a may include an impurity-doped region having a uniform impurity concentration along certain surfaces (e.g., sidewalls) of the first region 122a of the fin-type active region 122 (e.g., along a sidewall extending along the Y-Z plane). The impurity-doped region may have substantially the same thickness in an X-direction extending from the Y-Z surface of the sidewall of the first region 122a.

The second impurity-doped pattern 132b may also include an impurity-doped region having a uniform impurity concentration along certain surfaces of the first region 122a and second region 122b of the fin-type active region 122.

In one embodiment, the impurities may be vertically injected from the upper surface of the first and second impurity-doped patterns 132a and 132b to the bottom of them. Therefore, the impurity concentration at the upper surfaces of the first and second impurity-doped patterns 132a and 132b may be greater than those of their bottoms. Furthermore, contact resistances of contact plugs being electrically connected to the first and second impurity-doped patterns 132a and 132b may become lower.

Figure 10A:
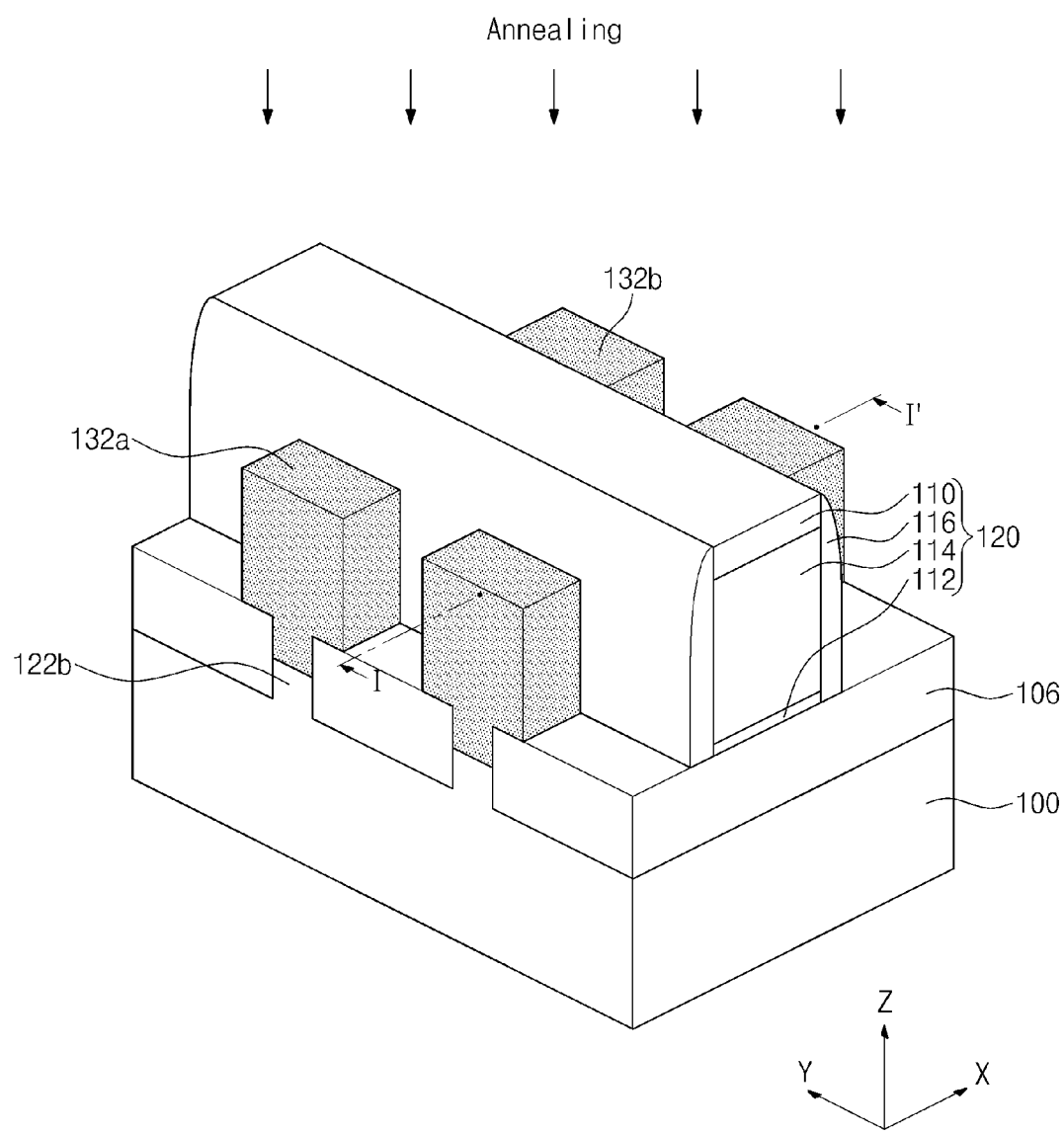
Figure 10B:
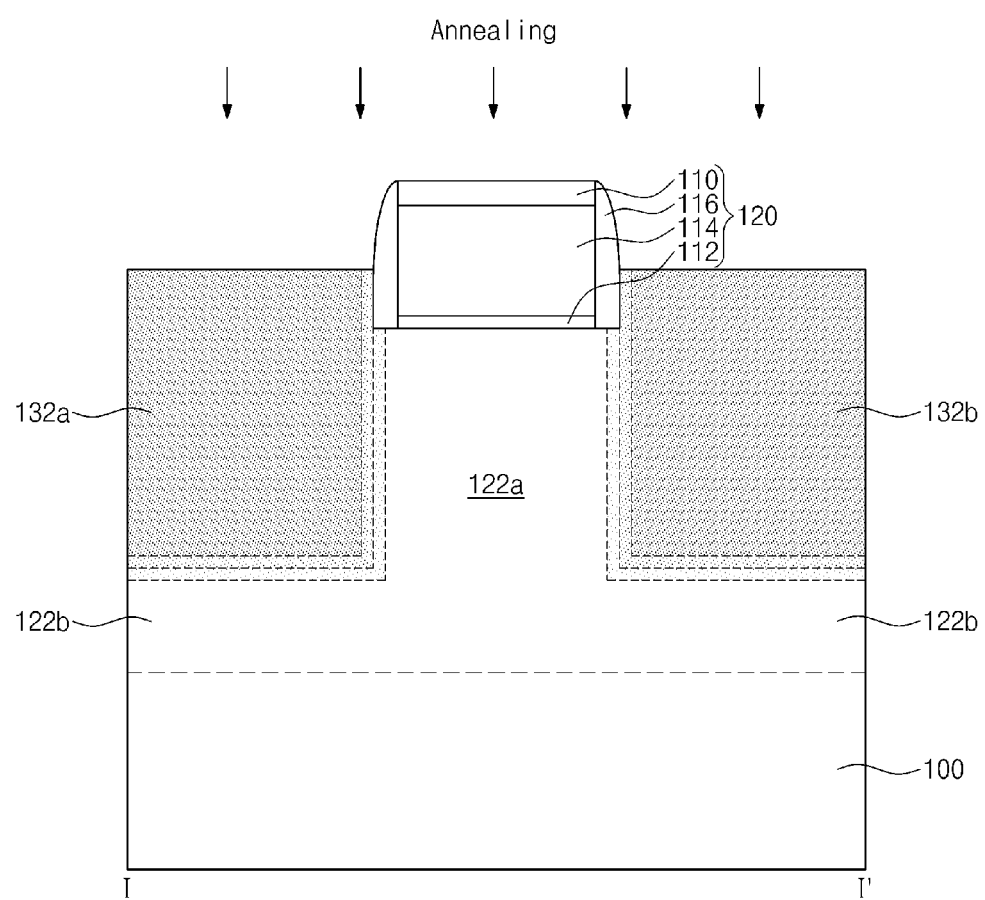

Referring to FIGS. 10a and 10b, the impurities injected in the first and second impurity-doped patterns 132a and 132b may be diffused and activated by performing an annealing process.

The annealing process may be performed, for example, at a temperature of higher than 900° C. The annealing process may include, for example, a spike annealing, a flash annealing, a laser annealing, and/or a micro-wave annealing.

The upper surfaces of the first and second impurity-doped patterns 132a and 132b may be damaged during the plasma doping process, and then the damaged surfaces of the first and second impurity-doped patterns 132a and 132b may be cured by the annealing process.

In one embodiment, other impurities may be further injected into the upper surface of the first and second impurity-doped patterns 132a and 132b by using a further injecting process. The further injecting process may include a beam-line-ion implantation process. In this case, the beam-line-ion implantation process may be performed for a very short time in order to protect further damage to the first and second impurity-doped patterns 132a and 132b.

As a result, a fin-type field effect transistor having the pattern structure 120 and the first and second impurity-doped patterns 132a and 132b may be formed on the substrate 100. In this case, the insulation pattern 112 of the pattern structure 120 may be formed as a gate dielectric layer pattern and the line pattern 114 of the pattern structure 120 may be formed as a gate electrode of the fin-type field effect transistor.

In one embodiment, the pattern structure 120 may be removed to form a gate dielectric layer and a gate electrode layer by using a replacement process. Detail descriptions for the replacement process will follow.

FIGS. 11a through 20a are perspective views illustrating a method of manufacturing a semiconductor device according to an example embodiment of the inventive concepts. FIGS. 11b through 20b are cross-sectional views illustrating a method of manufacturing a semiconductor device according to an example embodiment of the inventive concepts corresponding to line I-I' of FIGS. 11a through 20a.

Figure 11A:
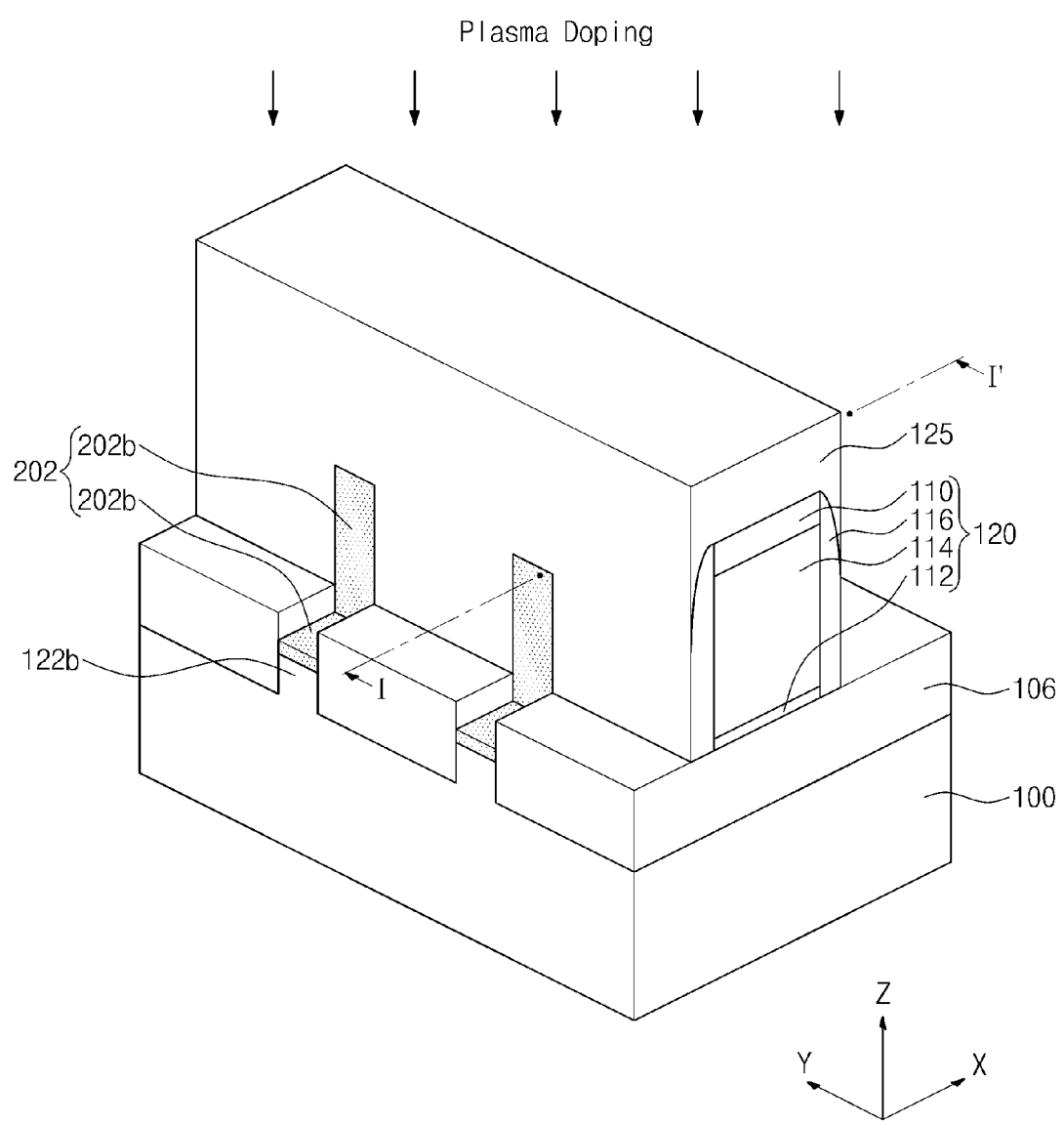
Figure 11B:
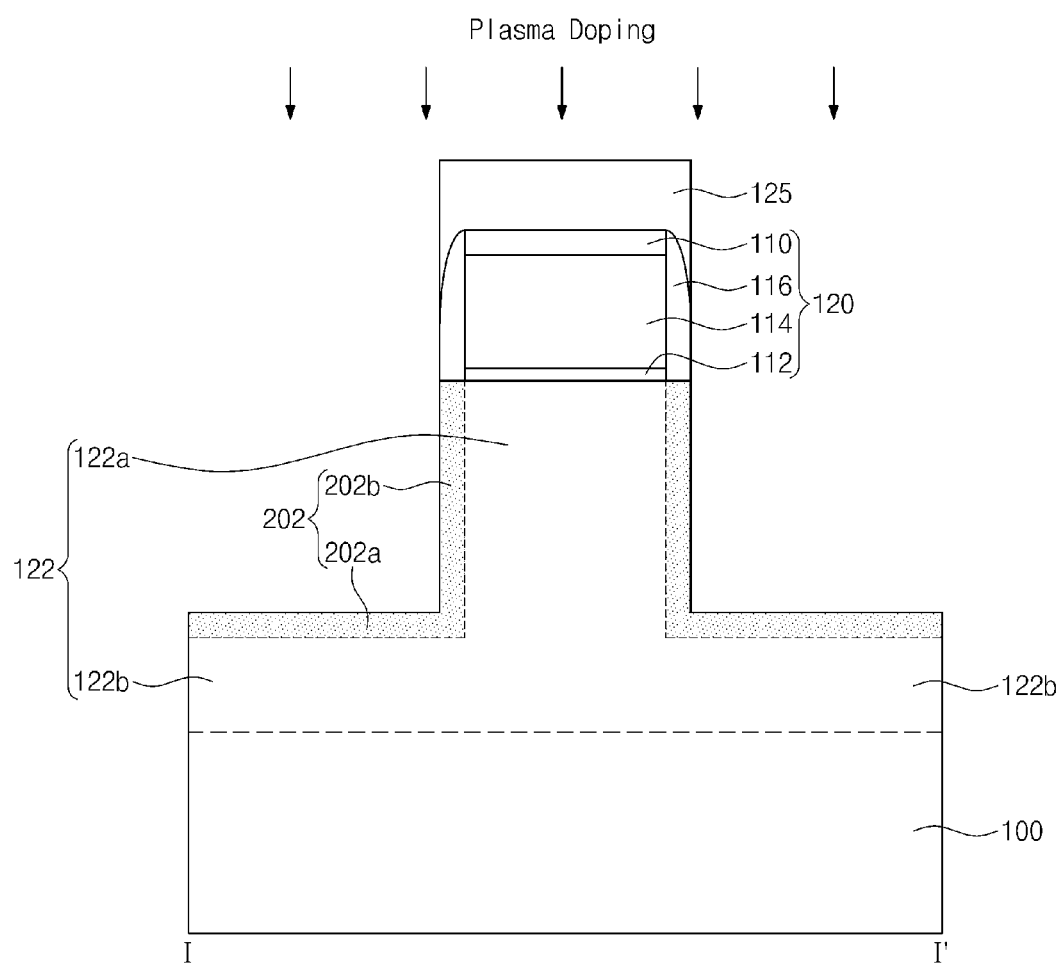

Referring to FIGS. 11a and 11b, a fin-type active pattern 122, a device isolation pattern 106, and a pattern structure 120 may be formed on a substrate 100. The fin-type active pattern 122, the device isolation pattern 106, and the pattern structure 120 may be formed respectively by using substantially the same process as mentioned above referring to FIGS. 3a through 7a and FIGS. 3b through 7b. Therefore, detailed descriptions about the methods of forming them will be omitted.

Impurities may be injected into the second region 122b of the fin-type active region 122 which is not covered by the pattern structure 120 using a plasma doping process. The impurities may be uniformly injected into the upper surface of the second region 122b and the sidewall of the first region 122a.

Before performing the doping process, a photoresist pattern 125 exposing the second region 122b of the fin-type active pattern 122 may be further formed on the pattern structure 120. Alternatively, if a second mask pattern 110 is formed on the line pattern 114, the forming of the photoresist pattern 125 may be omitted.

The doping process will be described in detail as follows.

A substrate 100 having the photoresist pattern 125 may be loaded in a process chamber in which a plasma may be generated or induced. And then, a source gas may be injected into the process chamber.

The source gas may include an impurity gas. The source gas may further include a dilution gas. The dilution gas may comprise, for example, at least one selected from the group consisting of argon (Ar), neon (Ne), helium (He), hydrogen (H), Krypton (Kr), and Xenon (Xe).

The impurity type of the source gas induced into the process chamber may be variable in accordance with the type of the fin-type field effect transistor, such as a PMOS or a NMOS transistor. Description for the impurity type of the source gas may be omitted because it is substantially the same as mentioned above referring to FIGS. 10a and 10b.

The impurities in the impurity gas may be ionized by inducing or generating plasma in the process chamber. The ionized impurities may be injected into the second region 122b of the fin-type active pattern 122 when a direct current (DC) bias is induced to the substrate 100.

An impurity-doped region 202 may be formed at the upper surface of the second region 122b of the fin-type active pattern 122 and at the sidewall of the first region 122a of the fin-type active pattern 122 by performing the plasma doping process. The impurity-doped region 202 may include a first impurity-doped region 202a formed at the upper surface of the second region 122b and a second impurity-doped region 202b formed at the sidewall of the first region 122a. The first impurity-doped region 202a and the second impurity-doped region 202b may have substantially the same thickness, which may be a uniform thickness.

The upper surfaces of the first and second regions 122a and 122b of the fin-type active pattern 122 may be less damaged if the impurities are injected by using a plasma doping process instead of the beam-line-ion implantation process.

The plasma doping process may have an advantage of forming a shallow junction having a highly doped region by controlling the bias voltage and the density of the plasma induced into the process chamber.

Figure 12A:
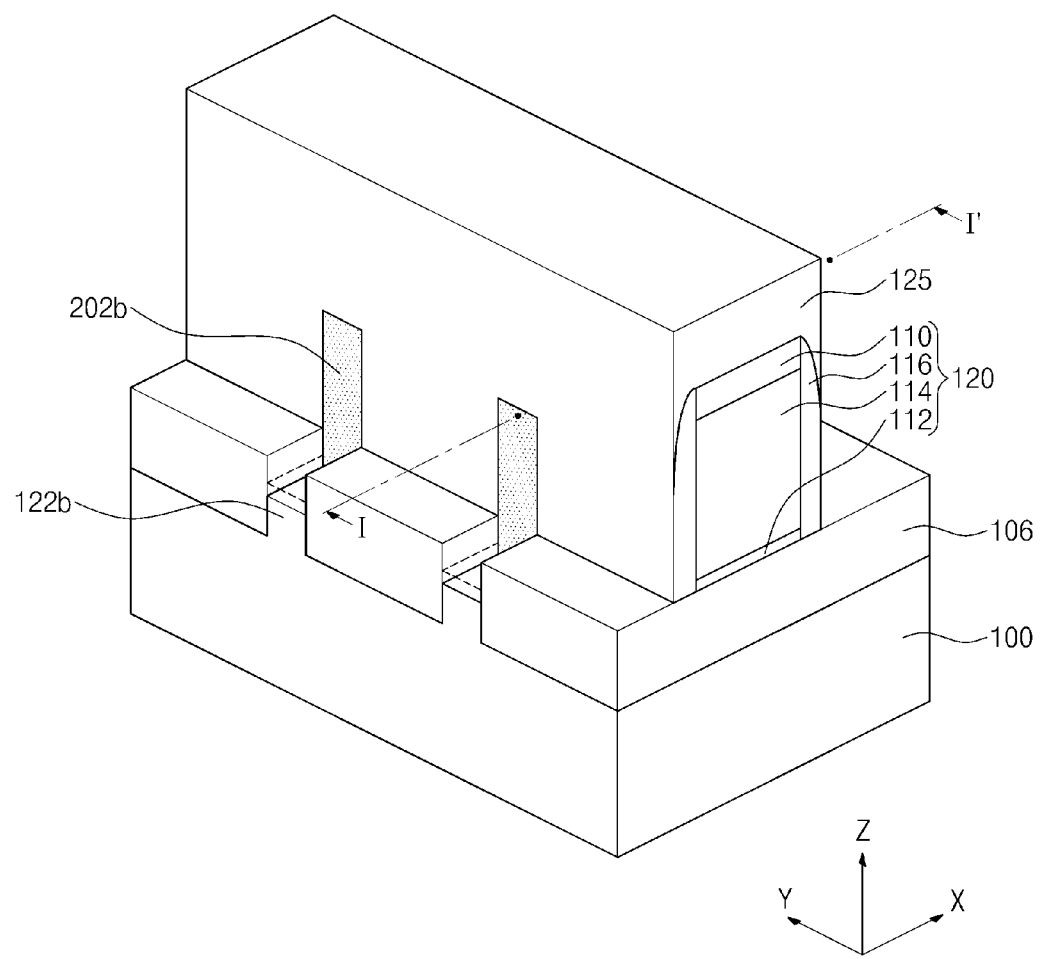
Figure 12B:
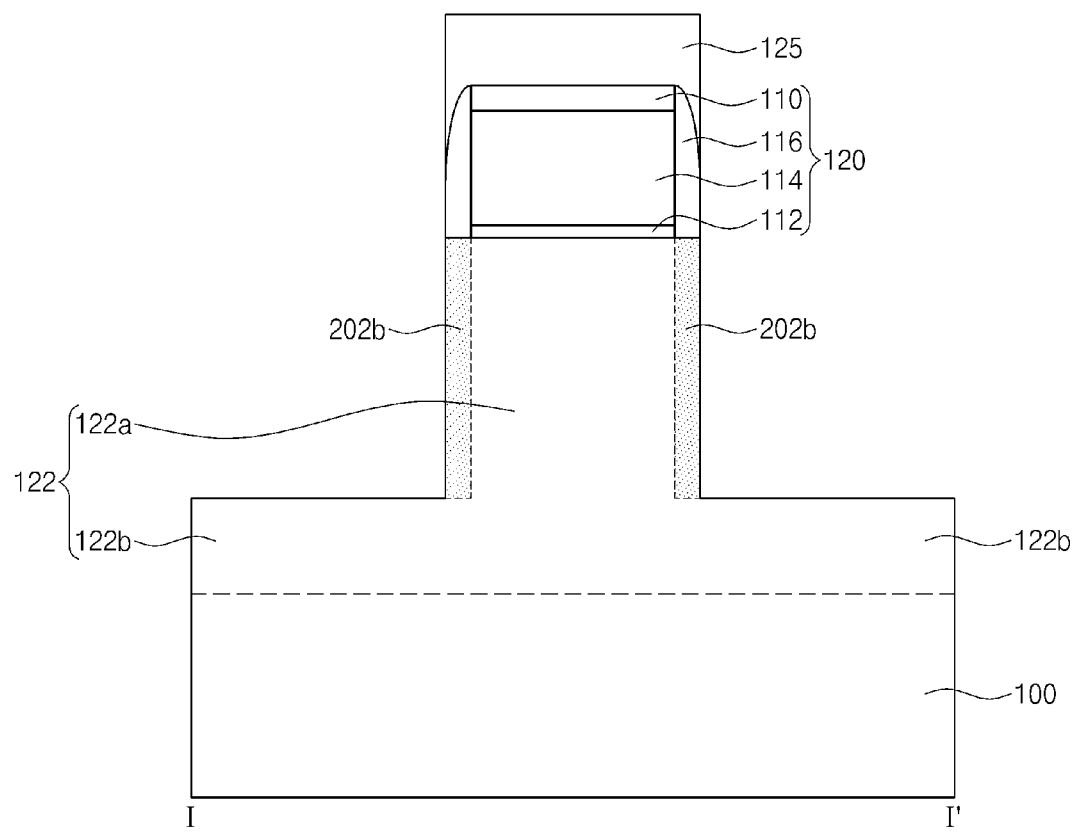

Referring to FIGS. 12a and 12b, the second impurity-doped region 202b which is formed at the upper surface of the second region 122b of the fin-type active pattern 122 may be selectively removed by using an etch process in order to reduce leakage current to the substrate 100. The etch process may include, for example, an etch-back process. Therefore, only the second impurity-doped region 202b on a sidewall of the first region 122a may remain after the etch process.

Figure 13A:
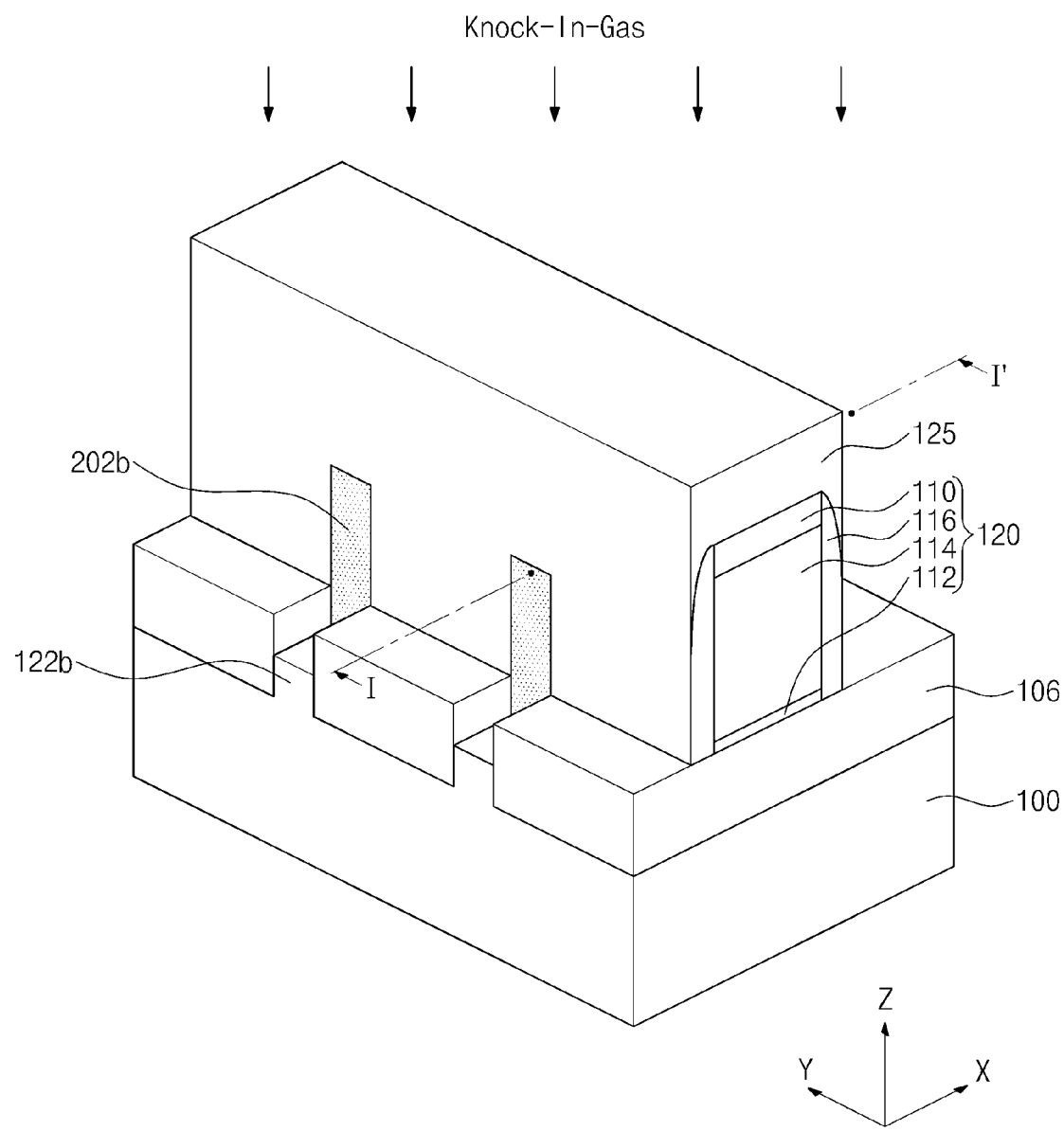
Figure 13B:
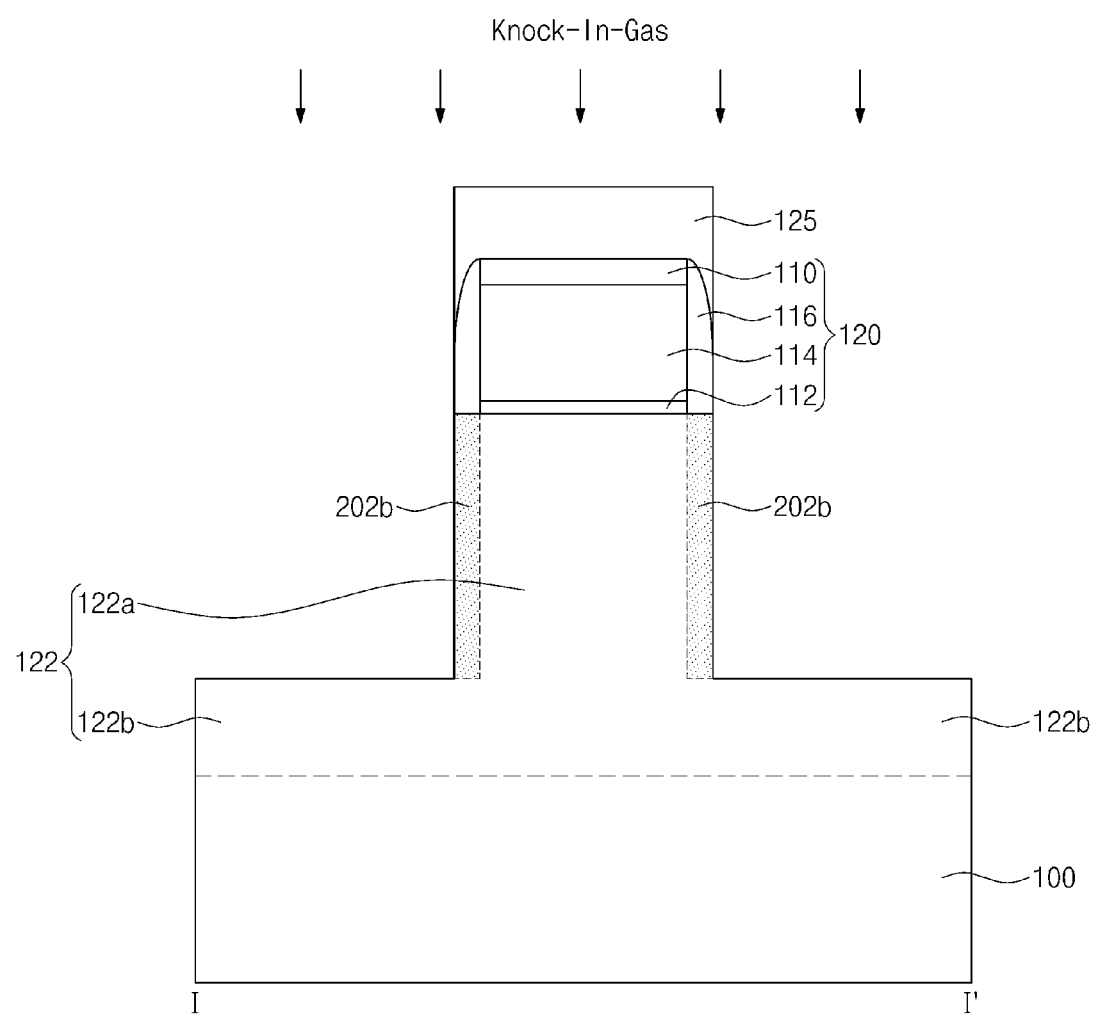

Referring to FIGS. 13a and 13b, a knock-in process may be performed to the second impurity-doped region 202b of the first region 122a.

The knock-in process may include injecting a knock-in gas into the second impurity-doped region 202b of the first region 122a. The knock-in process may be helpful to distribute uniformly the impurities in the second impurity-doped region 202b. The knock-in process may be performed by using, for example, at least one selected from the group consisting of argon (Ar), neon (Ne), helium (He), hydrogen (H), Krypton (Kr), and Xenon (Xe). The knock-in process may also be referred to as a uniform impurity distribution gas injecting process.

Figure 14A:
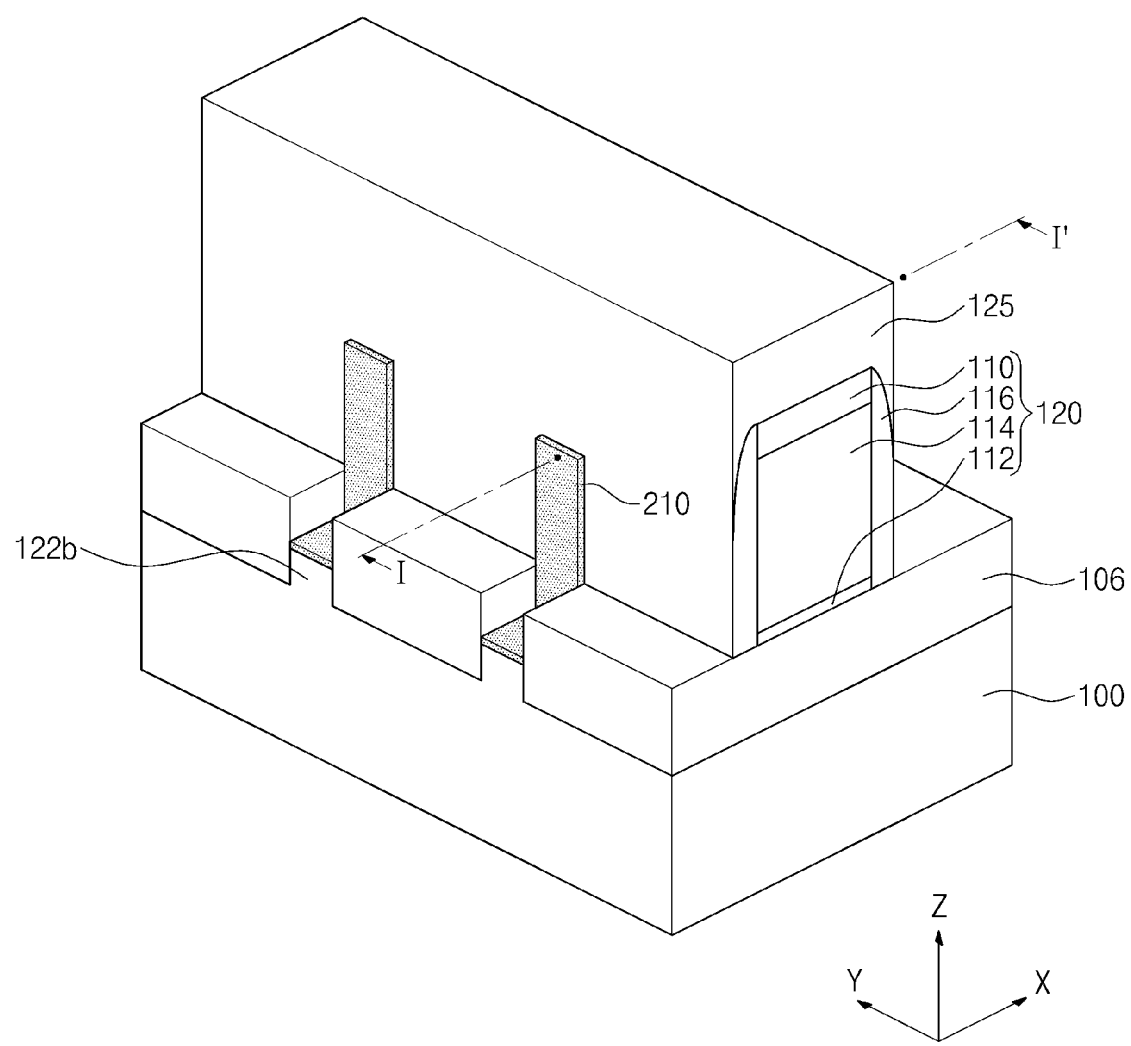
Figure 14B:
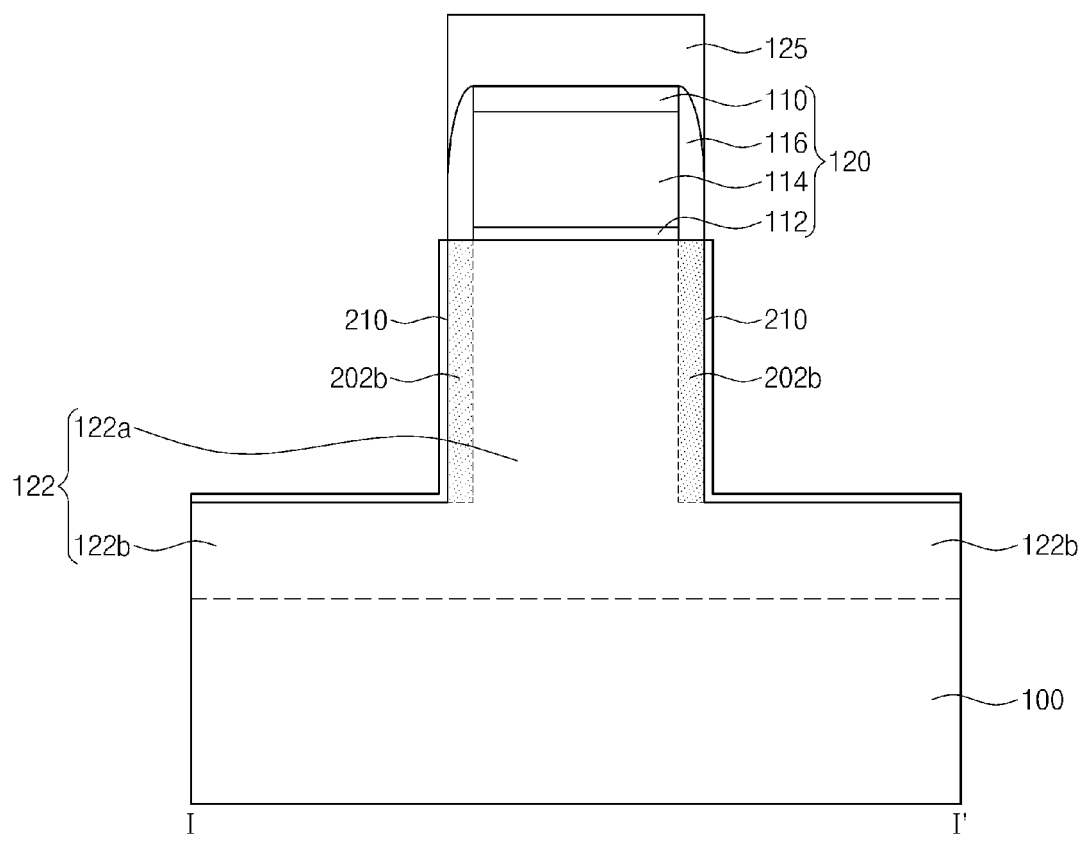

Referring to FIGS. 14a and 14b, a passivation layer 210 may be formed on the fin-type active pattern 122.

For example, if the impurities of the second impurity-doped region 202b include arsenic (As), arsenic may be evaporated before it is diffused inside the second impurity-doped region 202b because arsenic is a sublimable material at a particular temperature. The passivation layer 210 may keep arsenic (As) in the second impurity-doped region 202b during an annealing process that will be performed in a following step. The passivation layer 210 may be formed by using, for example, an oxygen plasma. In this case, the passivation layer 210 may include arsenic oxide ($As_xO_y$).

The knock-in process and the process for forming the passivation layer 210 may be performed in-situ.

Figure 15A:
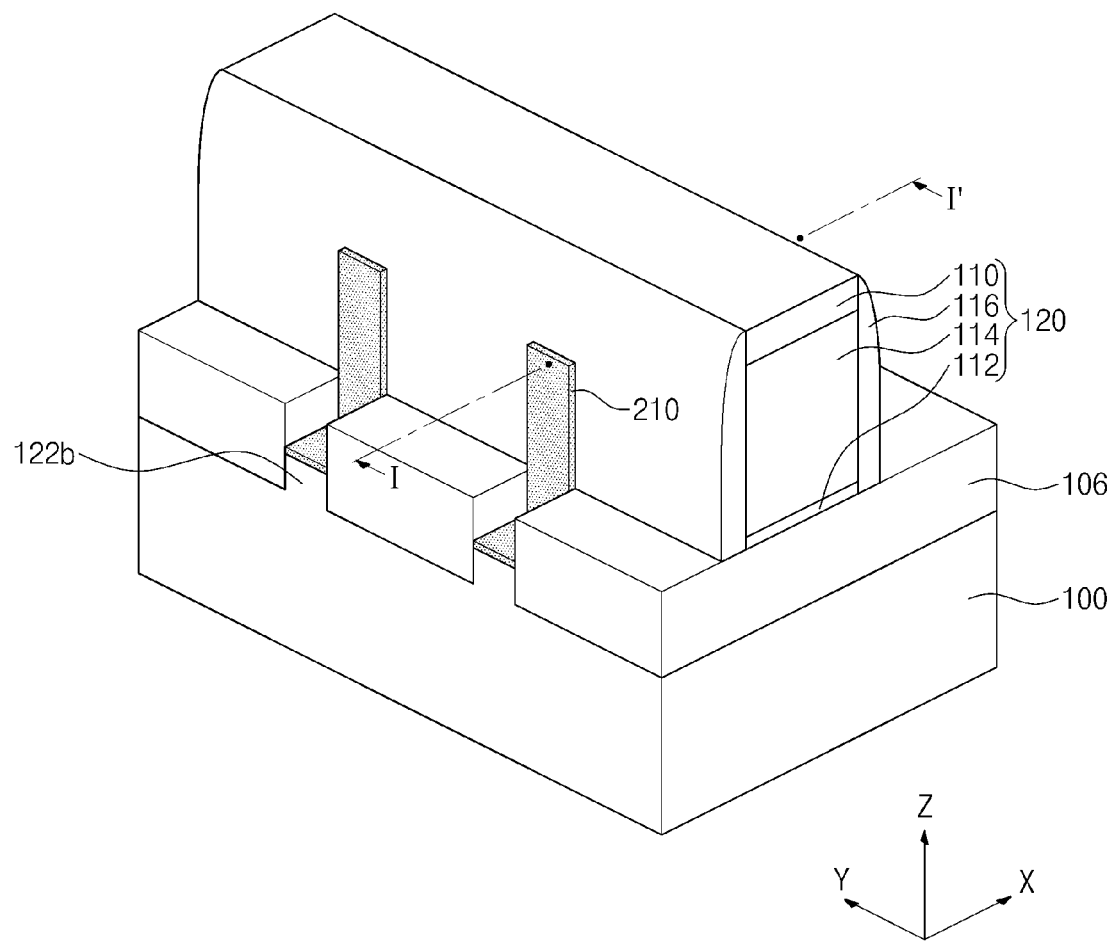
Figure 15B:
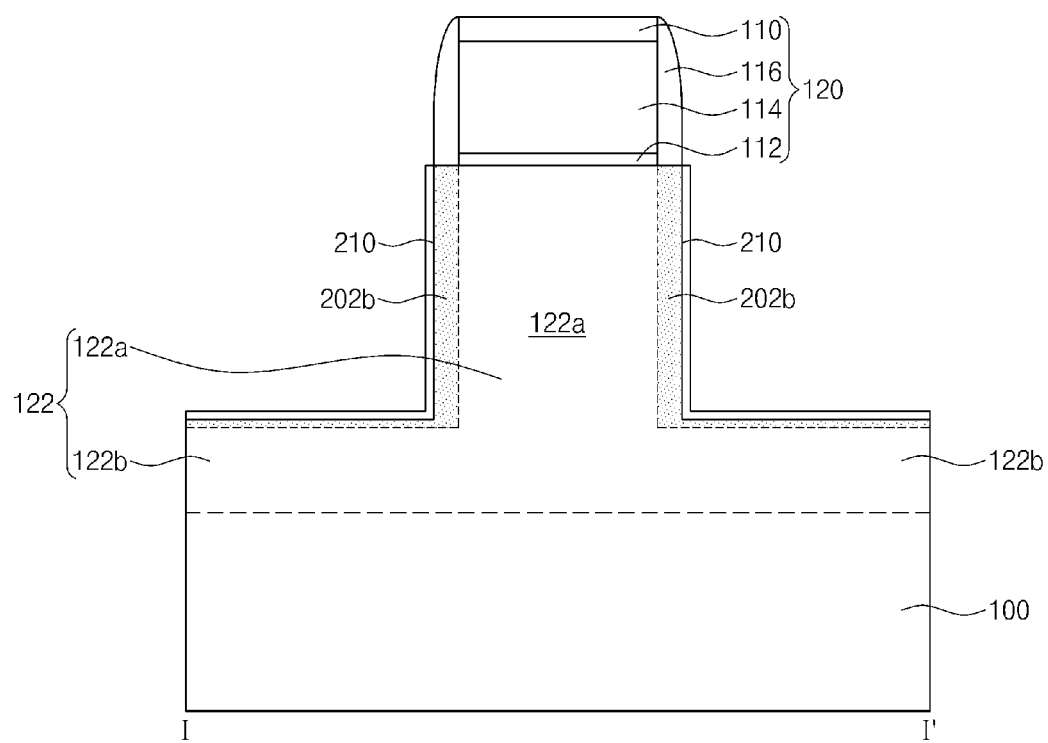

Referring to FIGS. 15a and 15b, the photoresist pattern 125 may be removed. The photoresist pattern 125 may be removed, for example, by using an aching and/or a strip process.

Figure 16A:
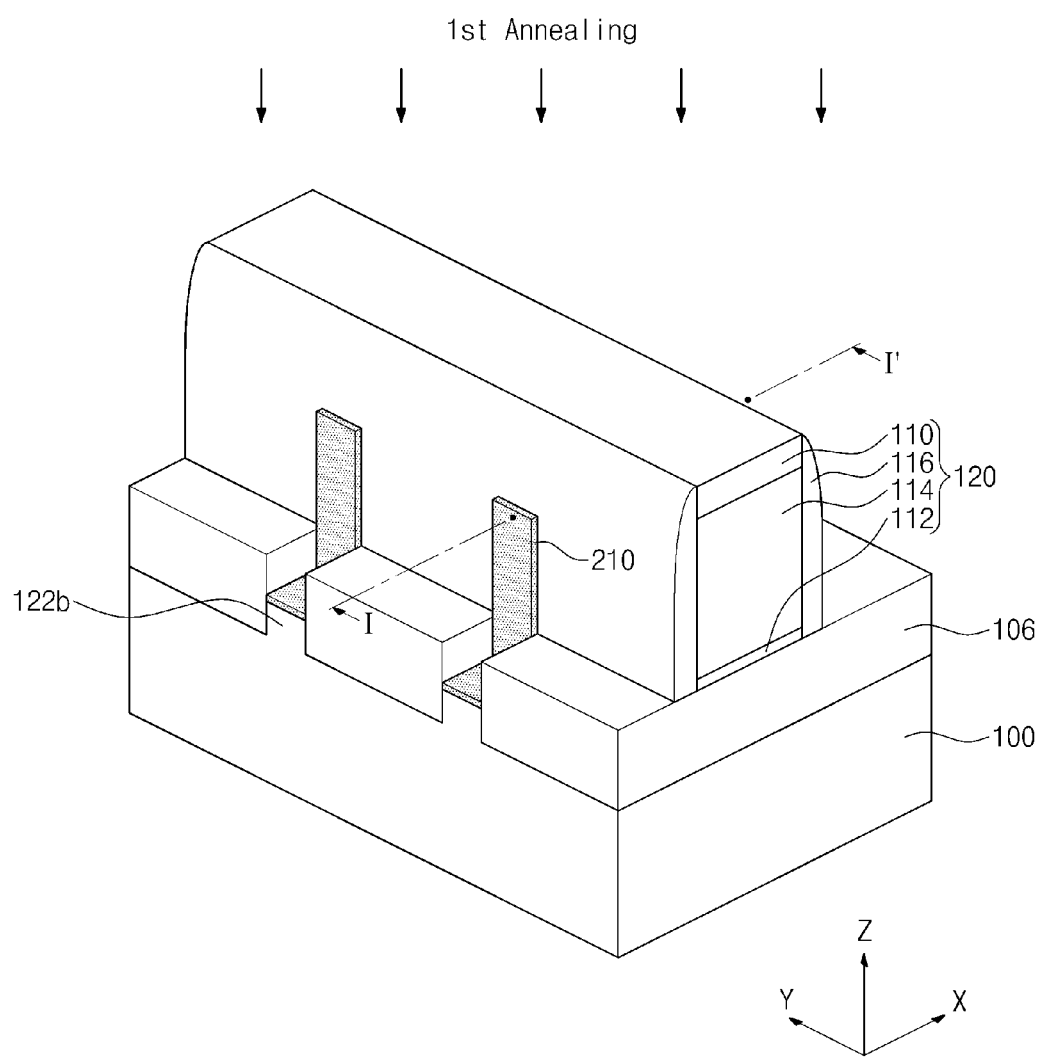
Figure 16B:
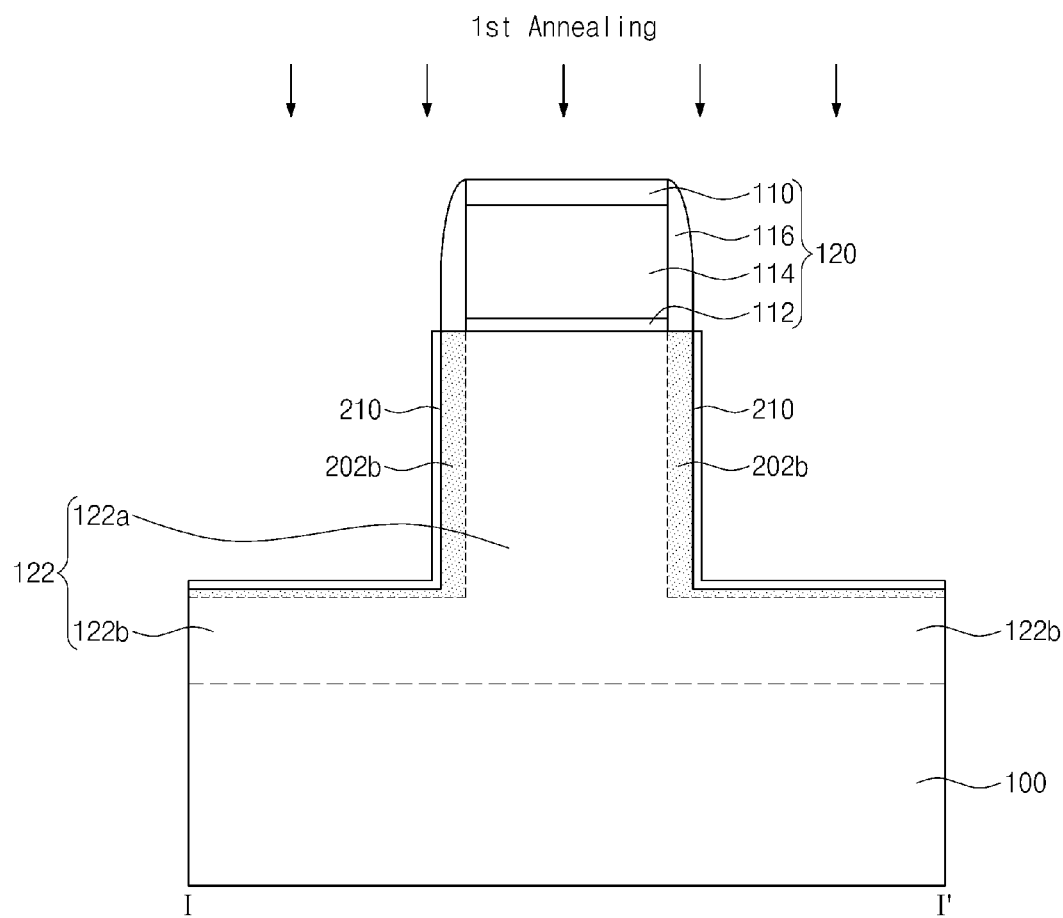

Referring to FIGS. 16a and 16b, a first annealing process may be performed to diffuse the impurities disposed in the second impurity-doped region 202b and the passivation layer 210. For example, the impurities may be diffused from the passivation layer 210 into the first and second regions 122a and 122b of the fin-type active pattern 122 by performing the first annealing process.

The first annealing process may be performed at a first temperature. The first temperature may have a range, for example, of about 500° C. to about 700° C. The first annealing process may include at least one selected, for example, from the group consisting of a rapid thermal anneal (RTA), a rapid thermal oxidation, a plasma annealing, and a microwave annealing.

A portion of the fin-type active pattern 122 may be damaged by the plasma doping process and the damaged portion of the fin-type active pattern 122 may be cured by performing the first annealing process.

Figure 17A:
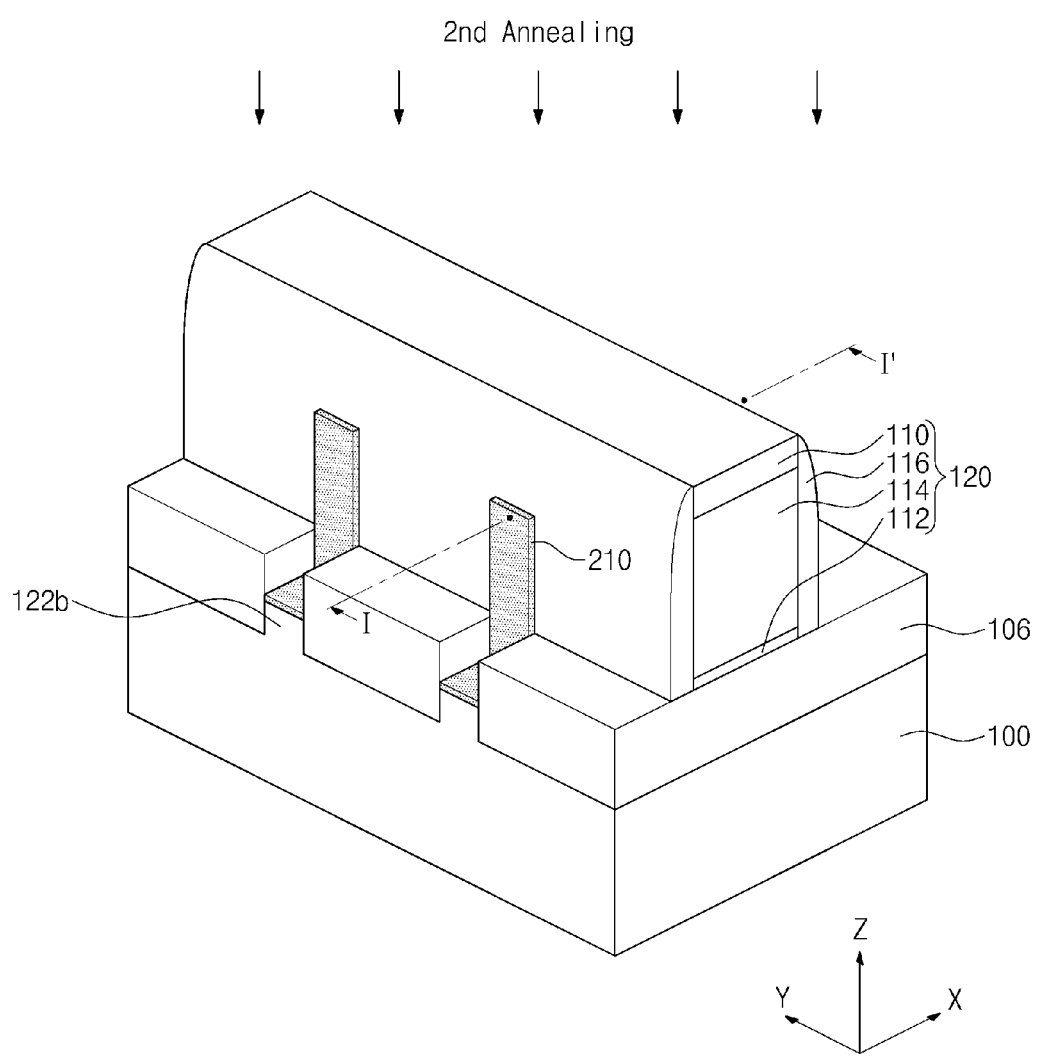
Figure 17B:
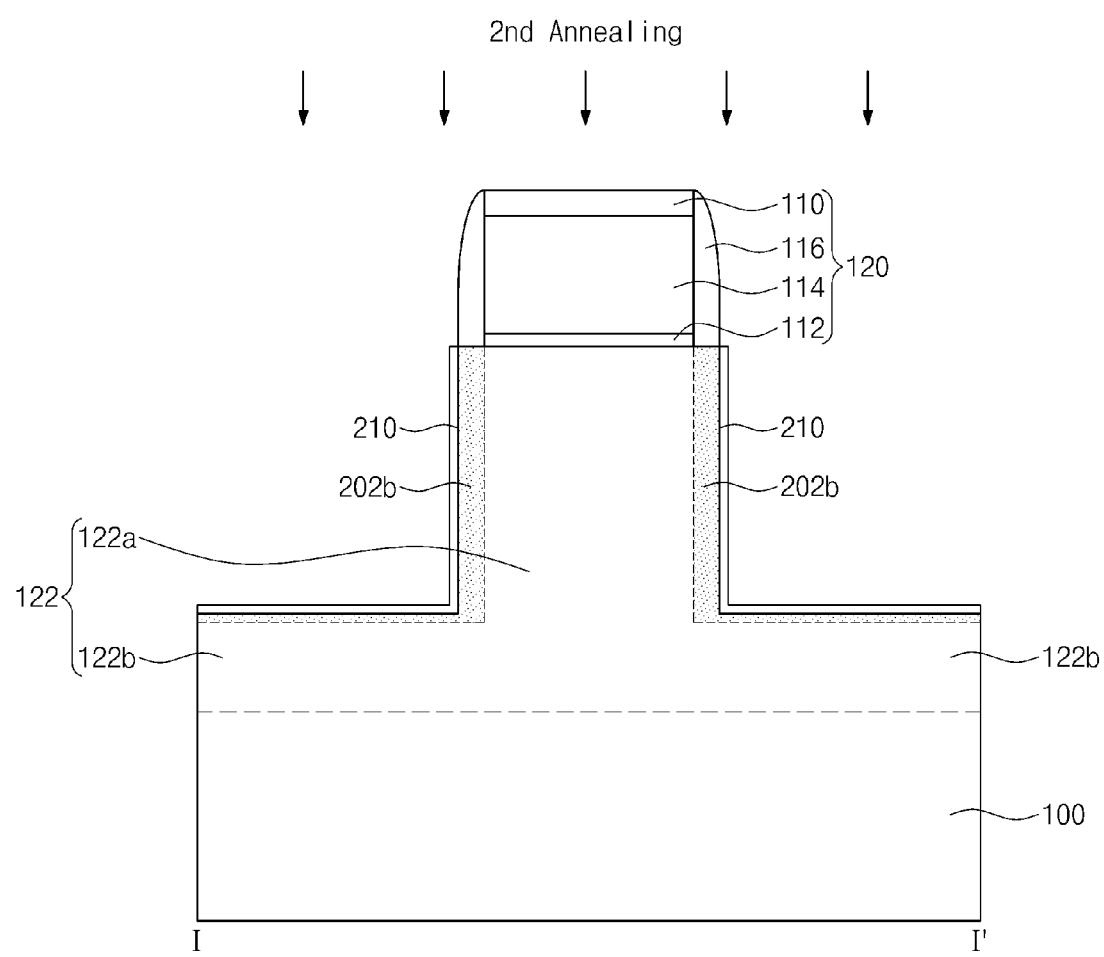

Referring to FIGS. 17a and 17b, a second annealing process may be performed to activate the impurities disposed in the second impurity-doped region 202b and the passivation layer 210. The impurities may be further diffused during the second annealing process.

The second annealing process may be performed in a second temperature higher than the first temperature. For example, the second temperature may have a range of greater than or equal to 900° C. The second annealing process may include at least one selected from the group consisting of a spike annealing, a flash annealing, a laser annealing, and a microwave annealing.

Figure 18A:
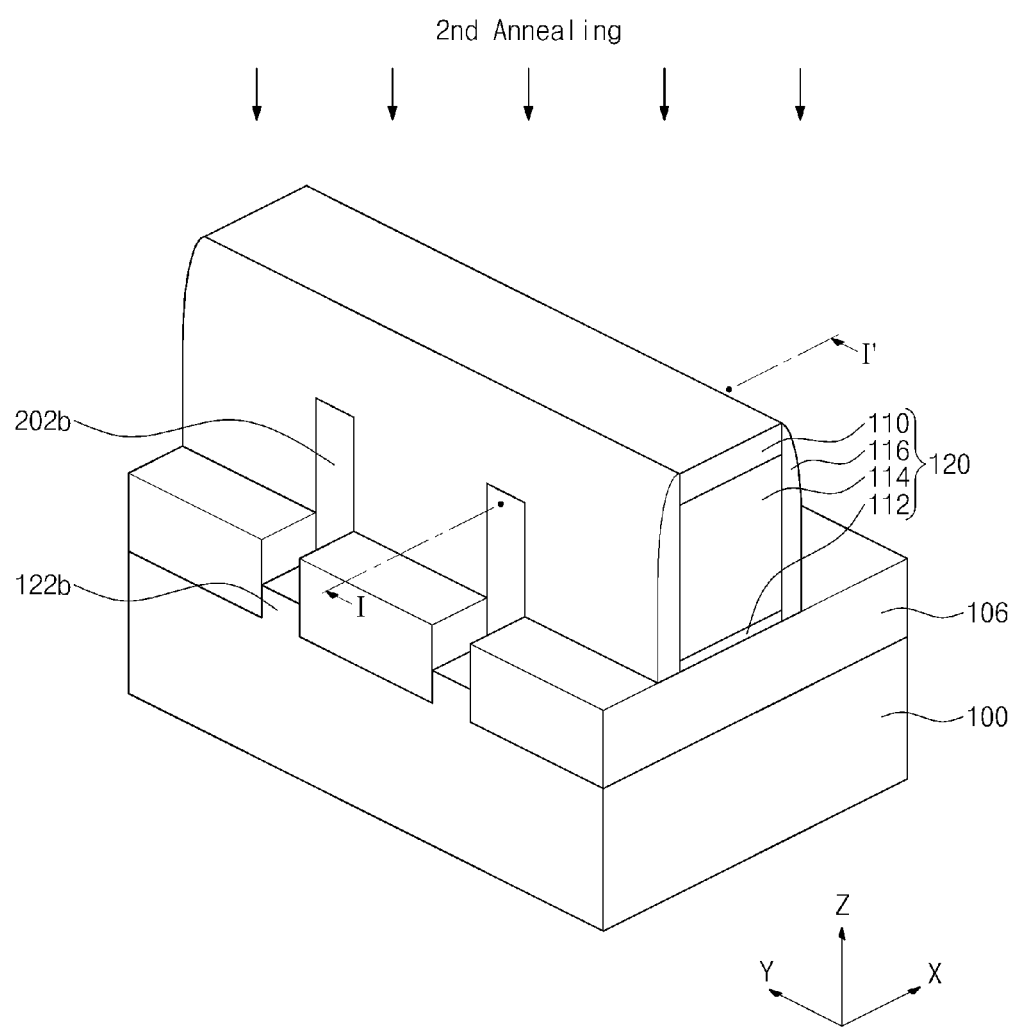
Figure 18B:
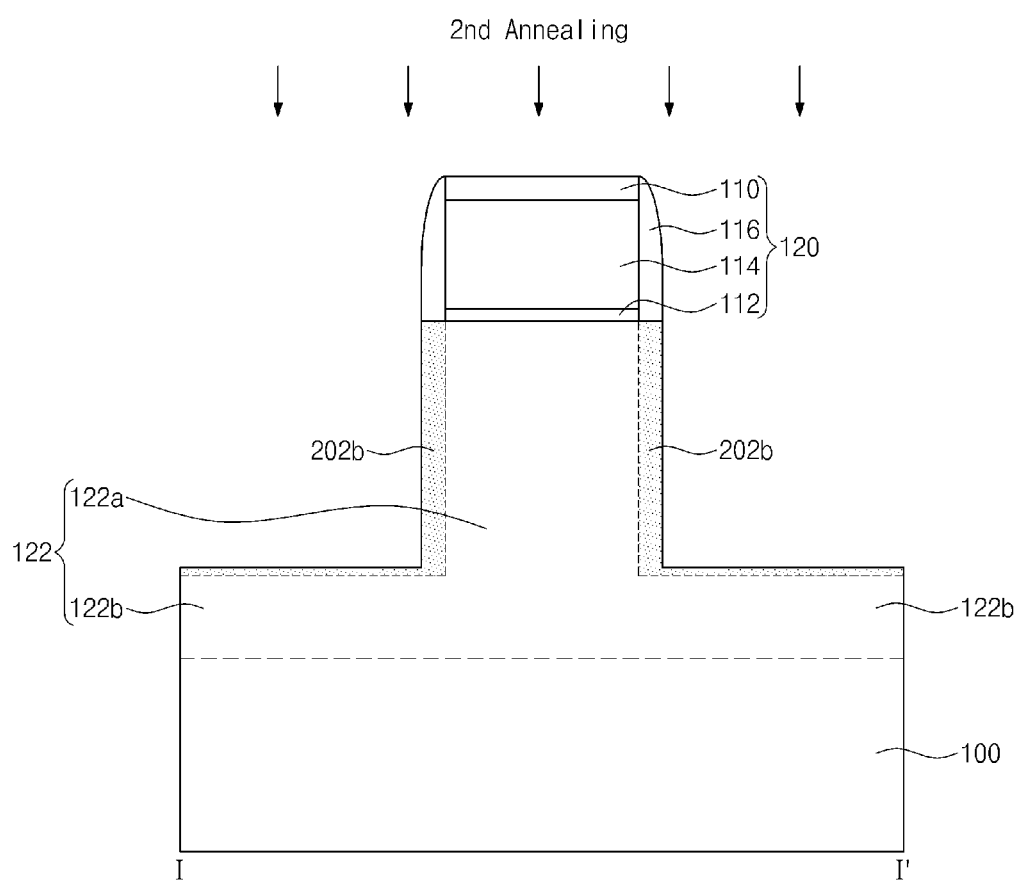

Referring to FIGS. 18a and 18b, the passivation layer 210 may be removed, for example, by using a wet etch process or a dry etch process. Thus, diffusion-based doped regions on sidewalls of the first region 122a and on a top surface of the second region 122b may remain.

Figure 19A:
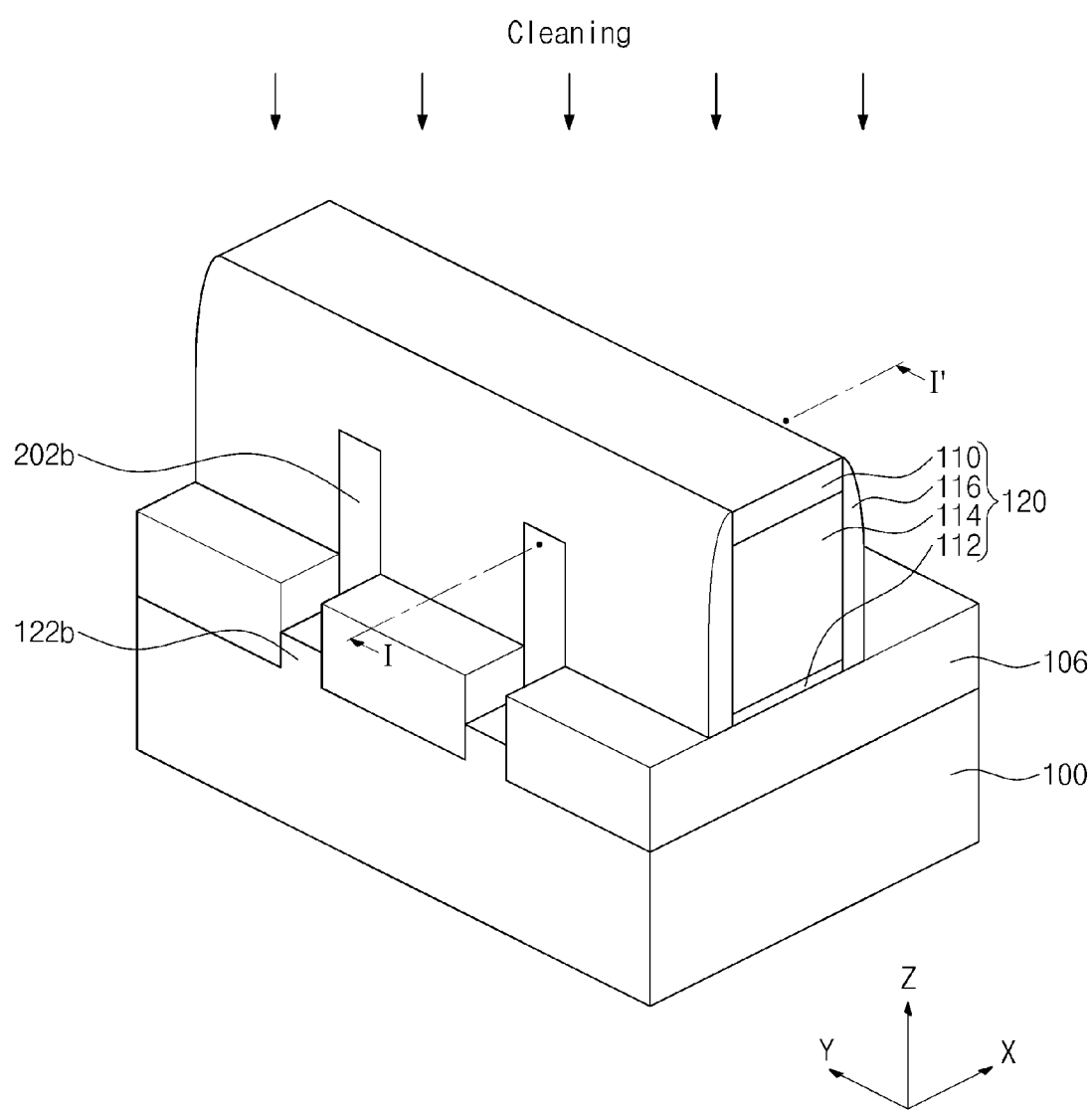
Figure 19B:
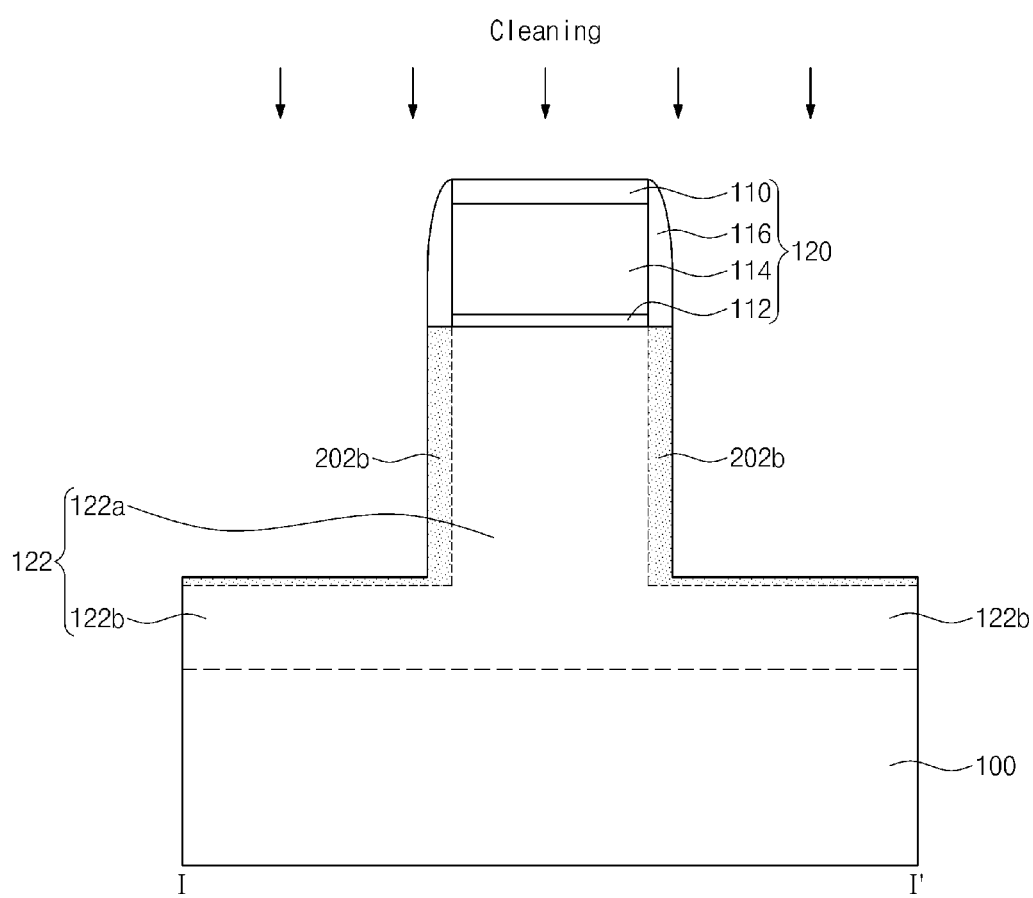

Referring to FIGS. 19a and 19b, a cleaning process may be performed to remove a byproduct formed during the plasma doping process and a residue of the passivation layer 210. The cleaning process may be performed, for example, by using diluted hydrofluoric (HF) acid.

Figure 20A:
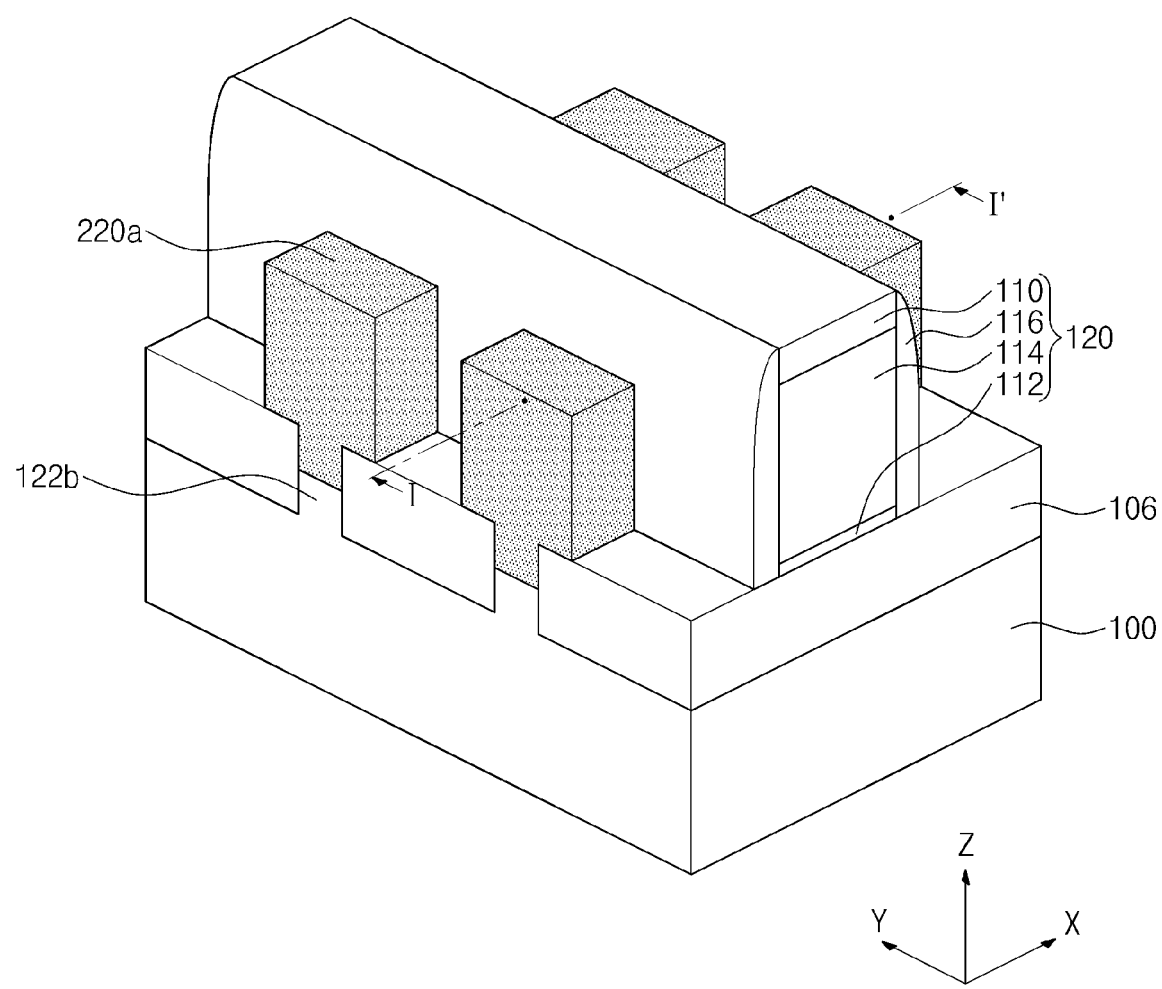
Figure 20B:
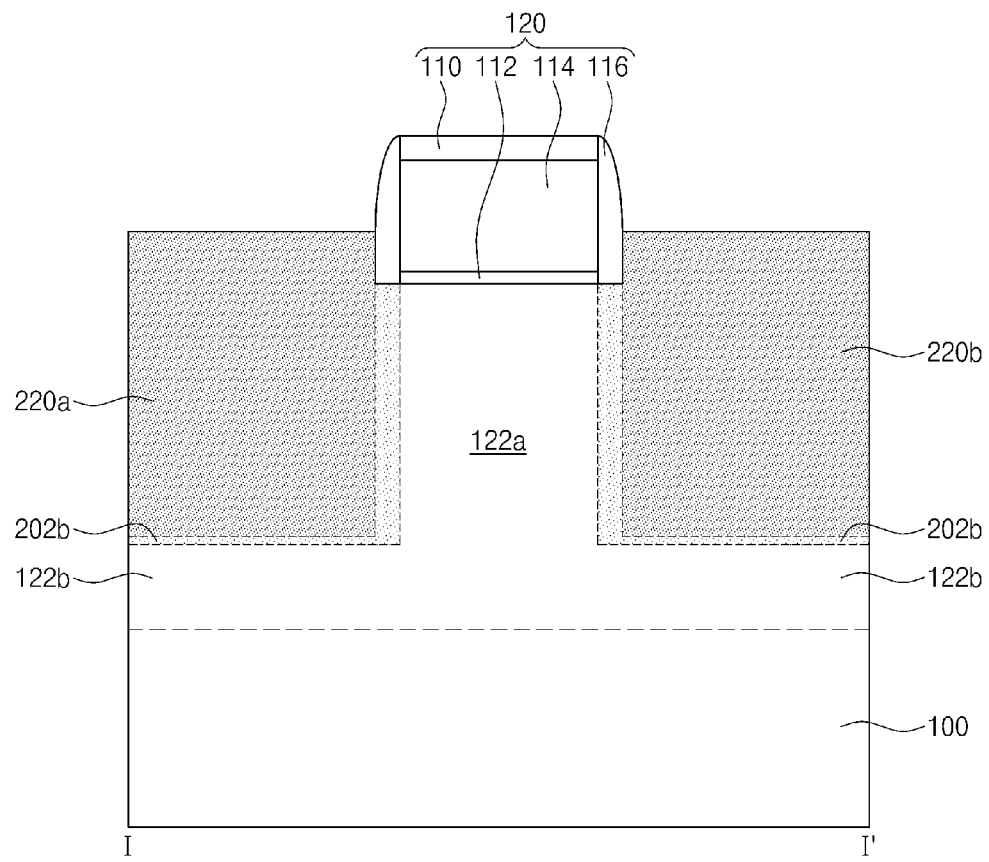

Referring to FIGS. 20a and 20b, a first impurity-doped pattern 220a and a second impurity-doped pattern 220b may be formed on the second region 122b exposed at both sides of the pattern structure 120, respectively.

The first and second impurity-doped patterns 220a and 220b may be formed, for example, by a selective epitaxial growth process. The type of the impurities may be variable according to the type of the fin-type field effect transistor, e.g., NMOS or PMOS. Impurities may be injected into the first and second impurity-doped patterns 220a and 220b during the selective epitaxial growth process. Detailed descriptions are substantially the same to the descriptions as mentioned above referring to FIGS. 8a and 8b. Therefore, detailed descriptions about methods of forming the first and second impurity-doped patterns 220a and 220b will be omitted.

The upper surfaces of the first and second impurity-doped patterns 220a and 220b may have a level higher than that of the fin-type active pattern 122. The upper surfaces of the first and second impurity-doped patterns 220a and 220b may have a level lower than that of the pattern structure 120. The widths of the first and second impurity-doped patterns 220a and 220b (e.g., in the Y-direction) may be greater than that of the fin-type active pattern 122.

The first and second impurity-doped patterns 220a and 220b may serve as a source/drain region of the fin-type field effect transistor.

Other impurities may be further injected into the first and second impurity-doped patterns 220a and 220b by using an injecting process. The injecting process may be performed by a beam-line-ion implantation process. In this case, the beam-line-ion implantation process may be performed for a very short time in order to reduce further damage to the first and second impurity-doped patterns 220a and 220b.

As the result, the fin-type field effect transistor having the pattern structure 120 and the first and second impurity-doped patterns 220a and 220b may be formed on the substrate 100. In this case, the insulation pattern 112 of the pattern structure 120 may serve as a gate dielectric layer pattern. The line pattern 114 of the pattern structure 120 may be serve as a gate electrode of the fin-type field effect transistor.

Alternatively, the pattern structure 120 may be removed to form a gate dielectric layer and a gate electrode layer by using a replacement process. Detailed descriptions will be followed.

FIGS. 21a through 25a are perspective views illustrating a method of manufacturing a semiconductor device according to still another example embodiment of the inventive concepts. FIGS. 21b through 25b are cross-sectional views illustrating a method of manufacturing a semiconductor device according to still another example embodiment of the inventive concepts corresponding to line I-I' of FIGS. 21a through 25a.

Figure 21A:
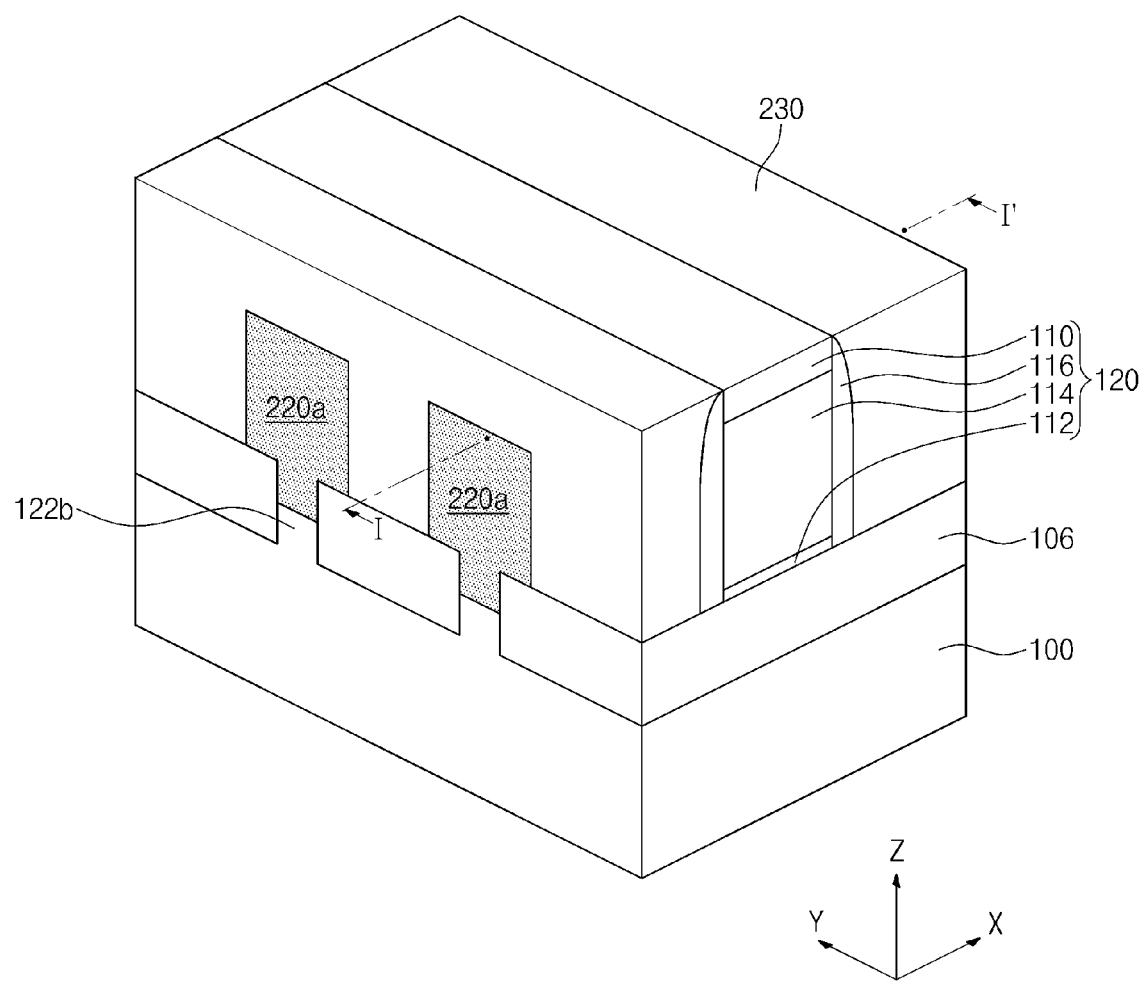
Figure 21B:
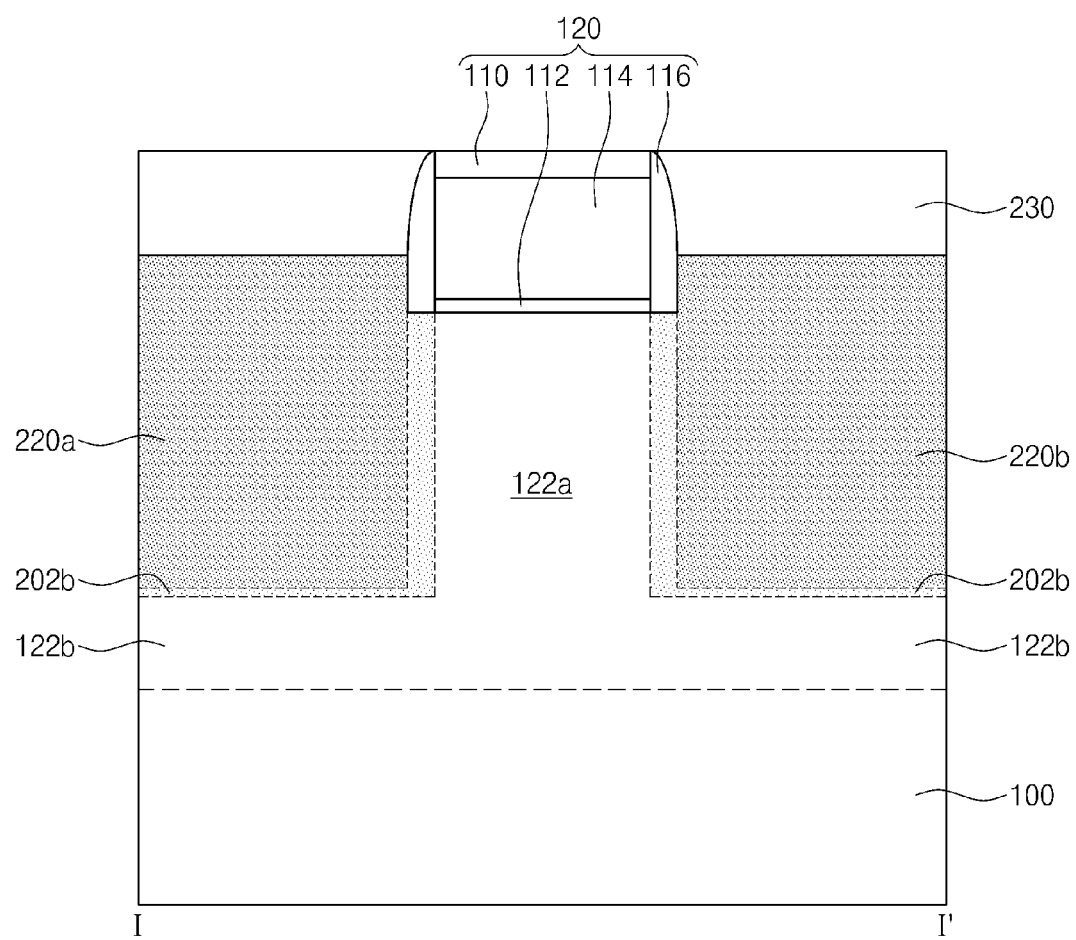

Referring to FIGS. 21a and 21b, a fin-type active pattern 122, a device isolation pattern 106, a pattern structure 120, and a first and second impurity-doped patterns 220a and 220b may be formed on a substrate 100. The fin-type active pattern 122, the device isolation pattern 106, the pattern structure 120, and the first and the second impurity-doped pattern 220a and 220b may be formed by substantially the same process as mentioned above referring to FIGS. 4a through 8a, FIGS. 4b through 8b, FIGS. 12a through 20a, and FIGS. 12b through 20b. Therefore, detailed descriptions about the methods of forming them will be omitted.

An interlayer dielectric layer 230 may be formed on the surface of the semiconductor device corresponding to FIGS. 20a and 20b. The interlayer dielectric layer 230 may include, for example, silicon oxide, silicon nitride, and/or silicon oxynitride. The interlayer dielectric layer may be planarized to expose the upper surface of the pattern structure 120.

Figure 22A:
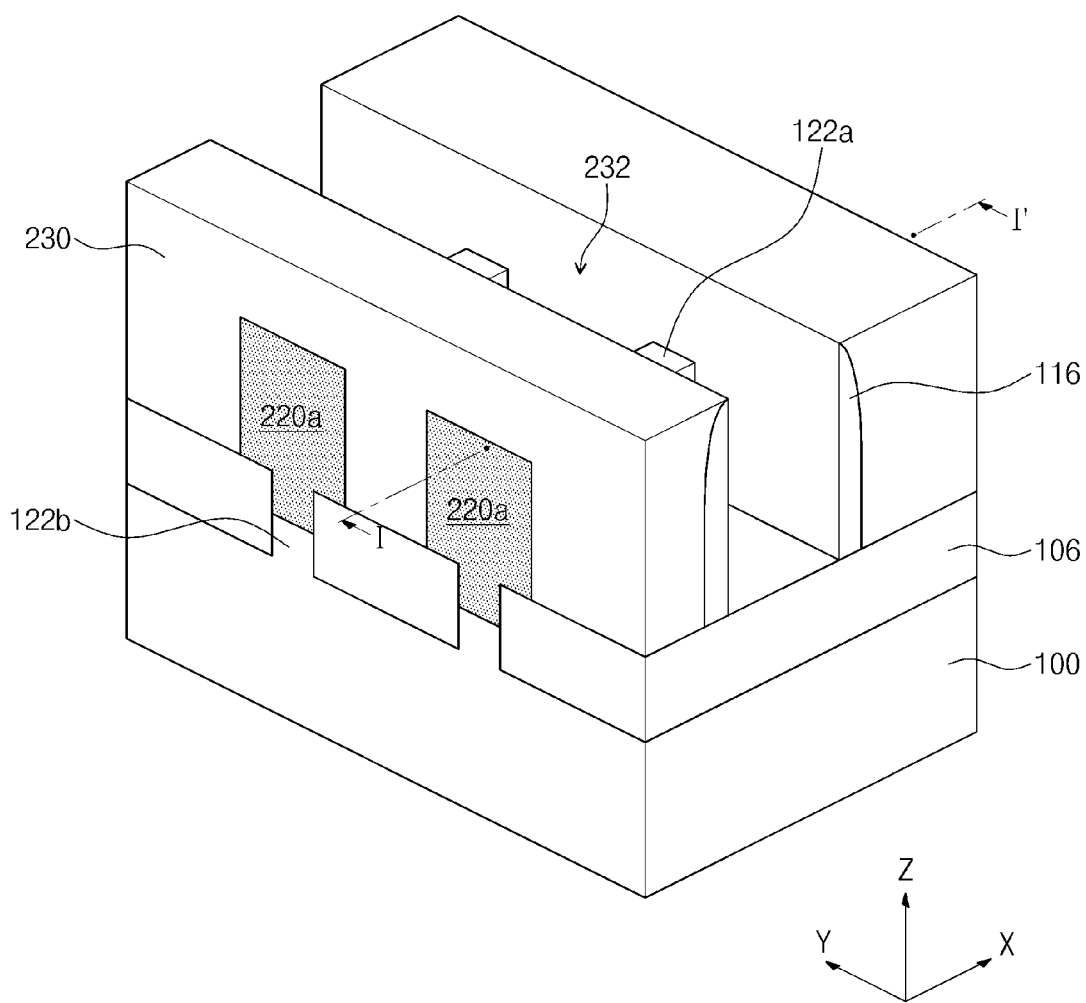
Figure 22B:
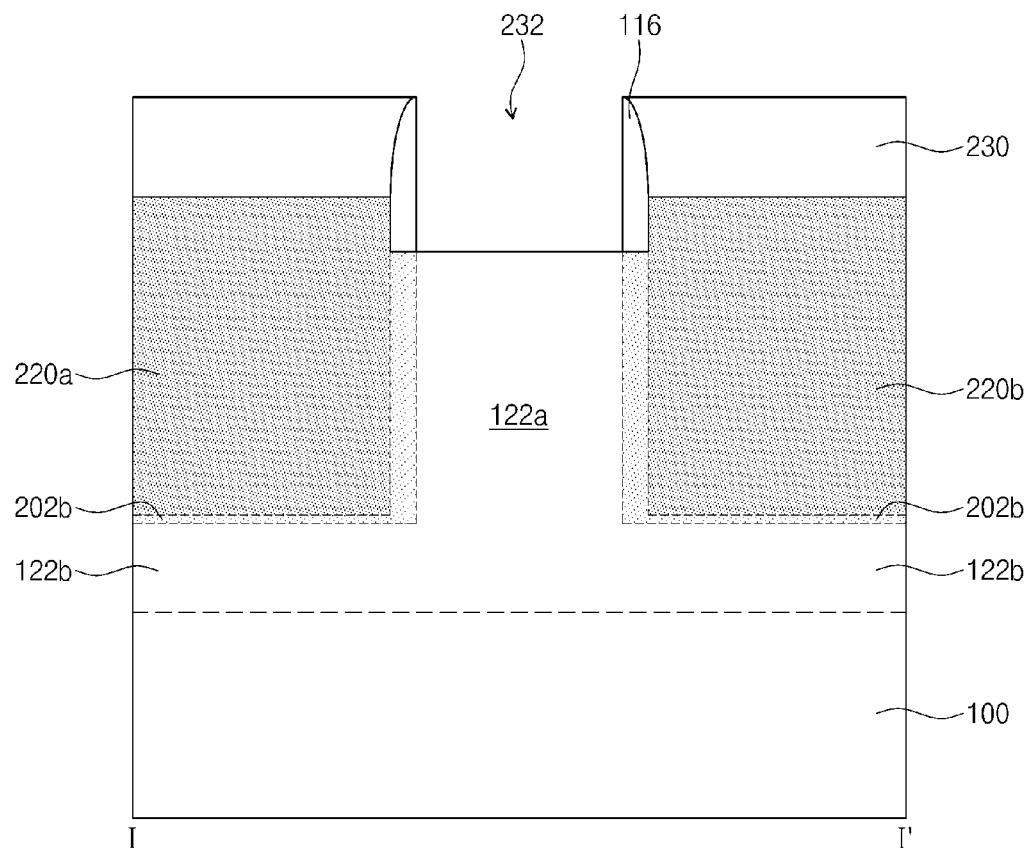

Referring to FIGS. 22a and 22b, the second mask pattern 110, the line pattern 114, and the dielectric pattern 112 of the pattern structure 120 may be removed to form a trench 232 exposing the first region 122a of the fin-type active pattern 122 and a portion of the device isolation pattern 106.

Figure 23A:
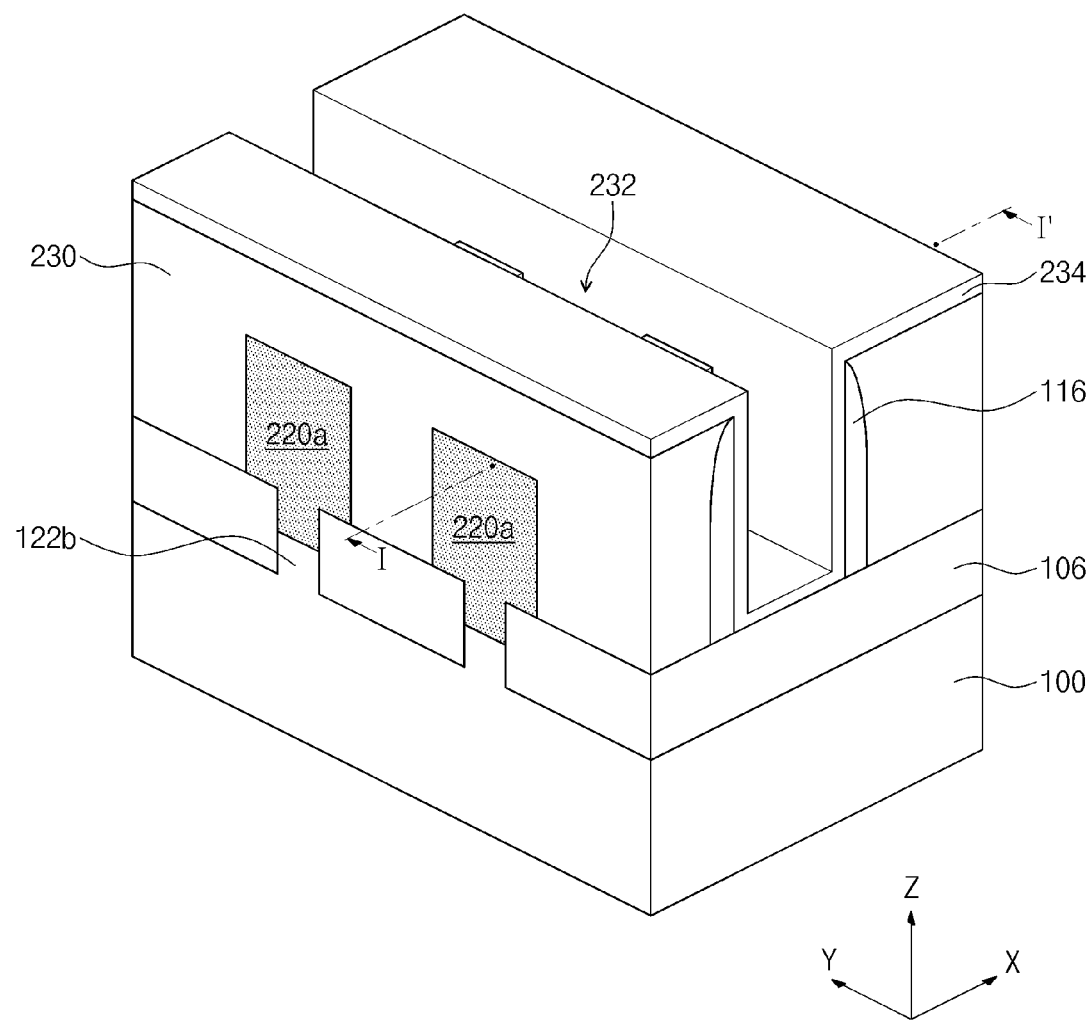
Figure 23B:
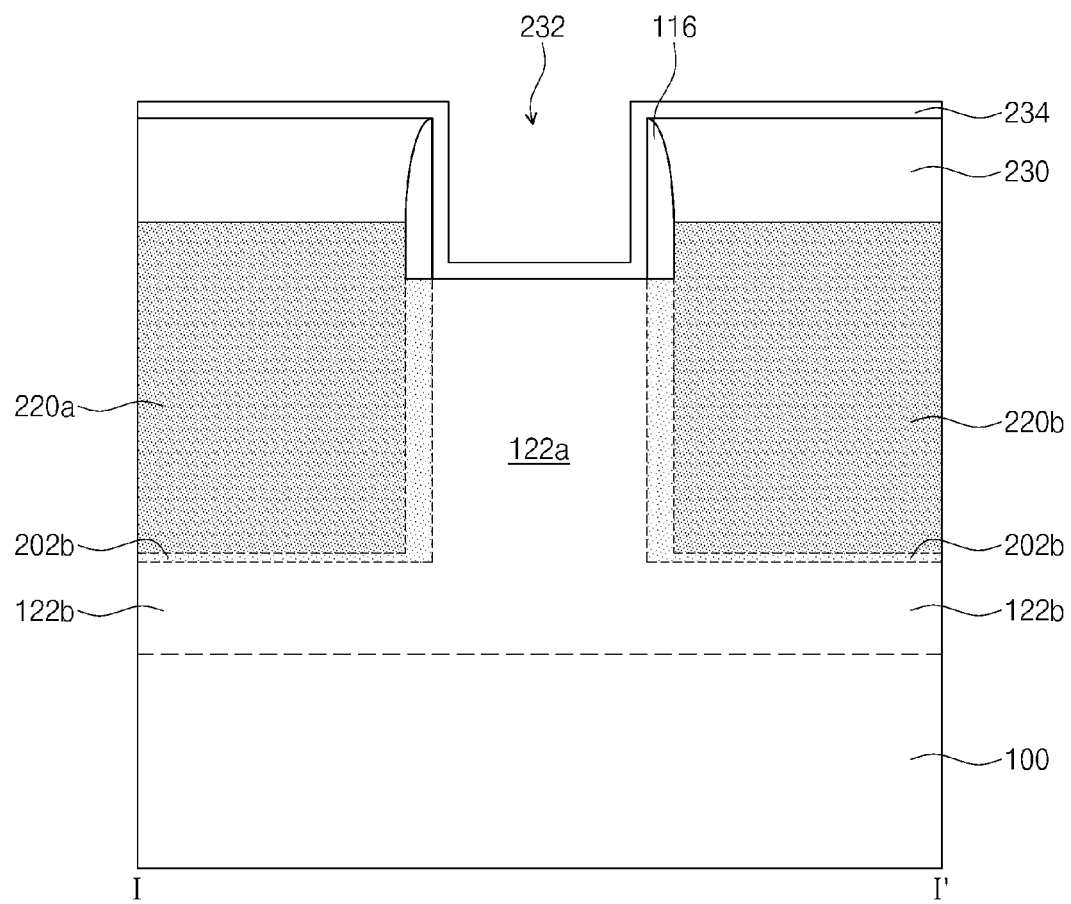

Referring to FIGS. 23a and 23b, a gate dielectric layer 234 may be conformally formed on the sidewall and at the bottom of the trench 232. The gate dielectric layer 234 may not fully fill the trench 232.

The gate dielectric layer 234 may include, for example, a high-k dielectric layer having a higher dielectric constant than that of a silicon oxide layer. The gate dielectric layer 234 may include at least one selected, for example, from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Figure 24A:
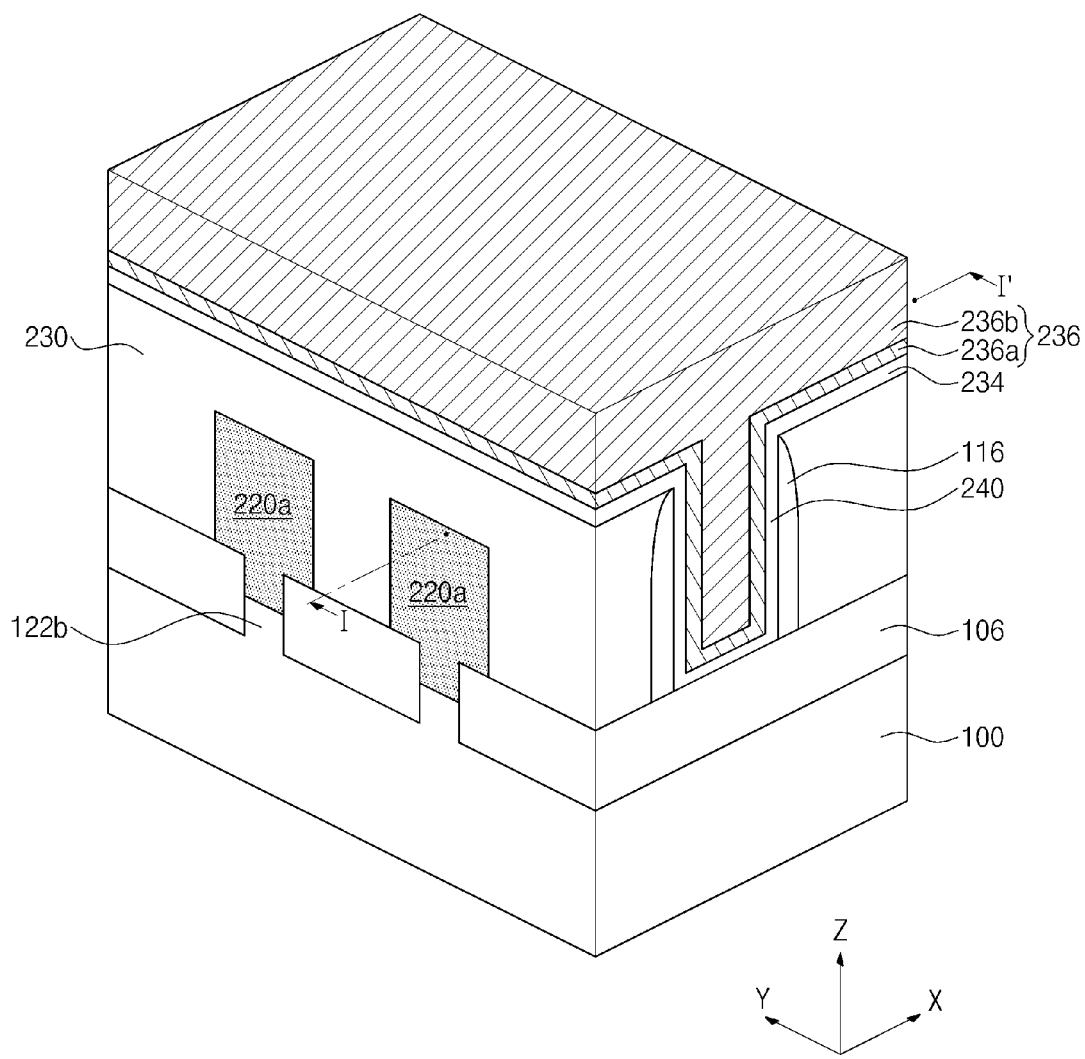
Figure 24B:
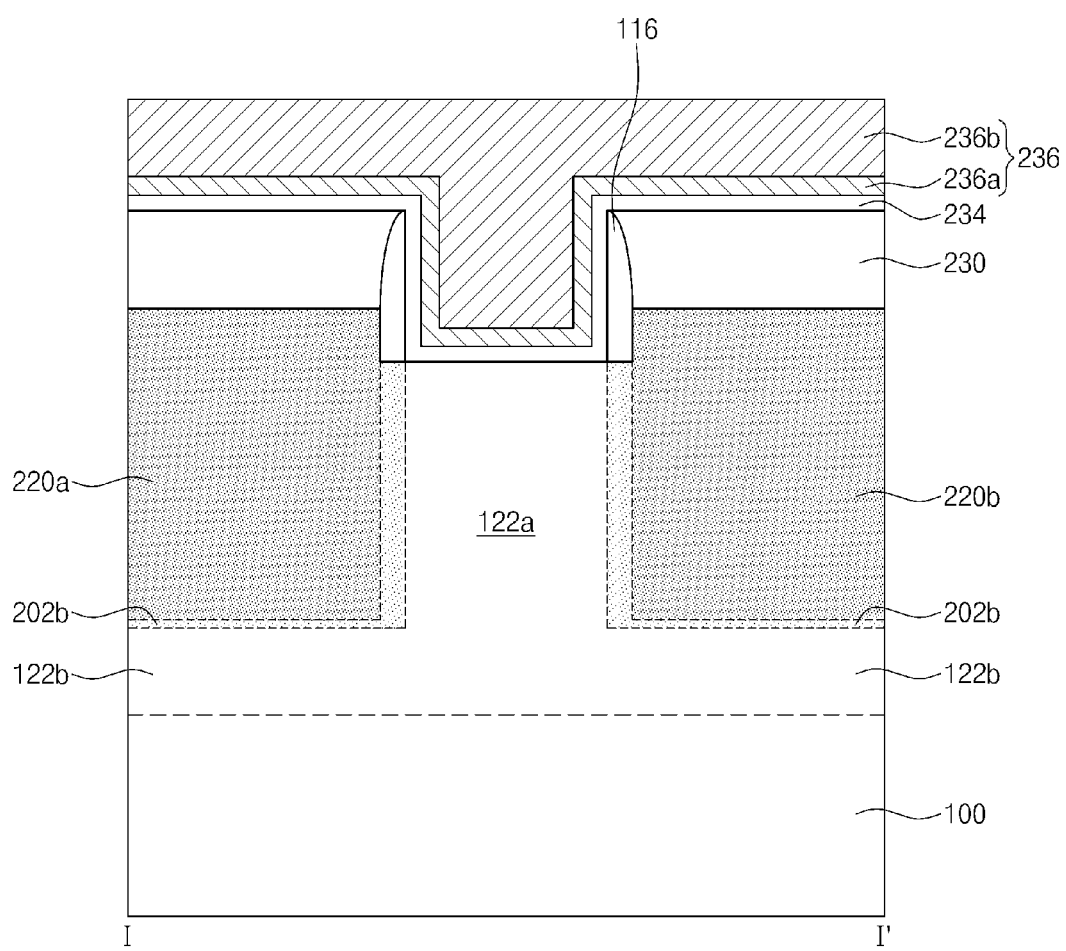

Referring to FIGS. 24a and 24b, a gate electrode layer 236 may be formed on the gate dielectric layer 234 disposed in the trench 232. The gate electrode layer 236 may fill the trench 232.

The gate electrode layer 236 may have a multilayer structure. If the gate electrode layer 236 has a bilayer structure having a lower layer 236a and an upper layer 236b, the lower layer 236a may control the work function value of the gate electrode layer 236 and include at least one selected from the group of titanium nitride (TiN), tantalum nitride (TaN), titanium carbide (TiC), and tantalum carbide (TaC). The upper layer 236b may include tungsten (W) and/or aluminum (Al). Alternatively, the gate electrode layer 236 may comprise silicon (Si) and/or silicon germanium (SiGe).

Figure 25A:
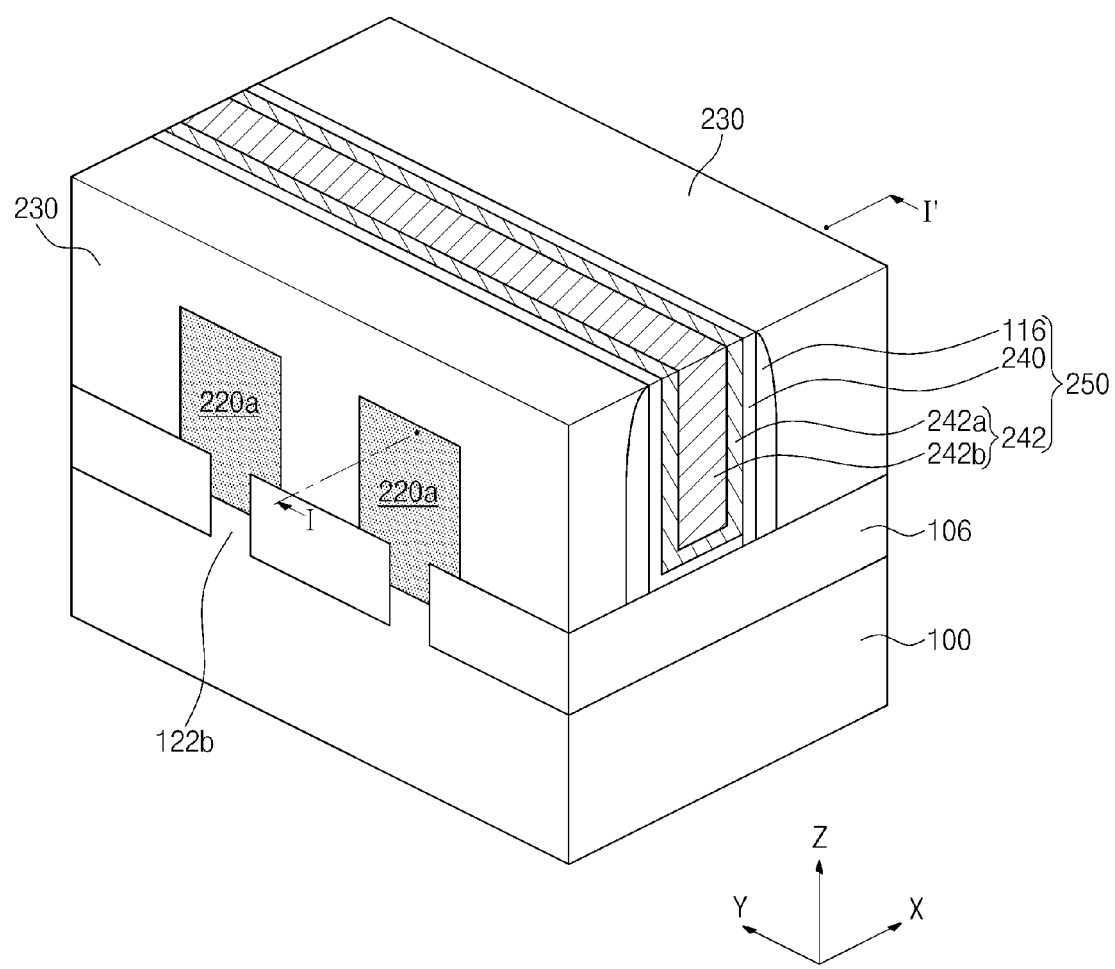
Figure 25B:
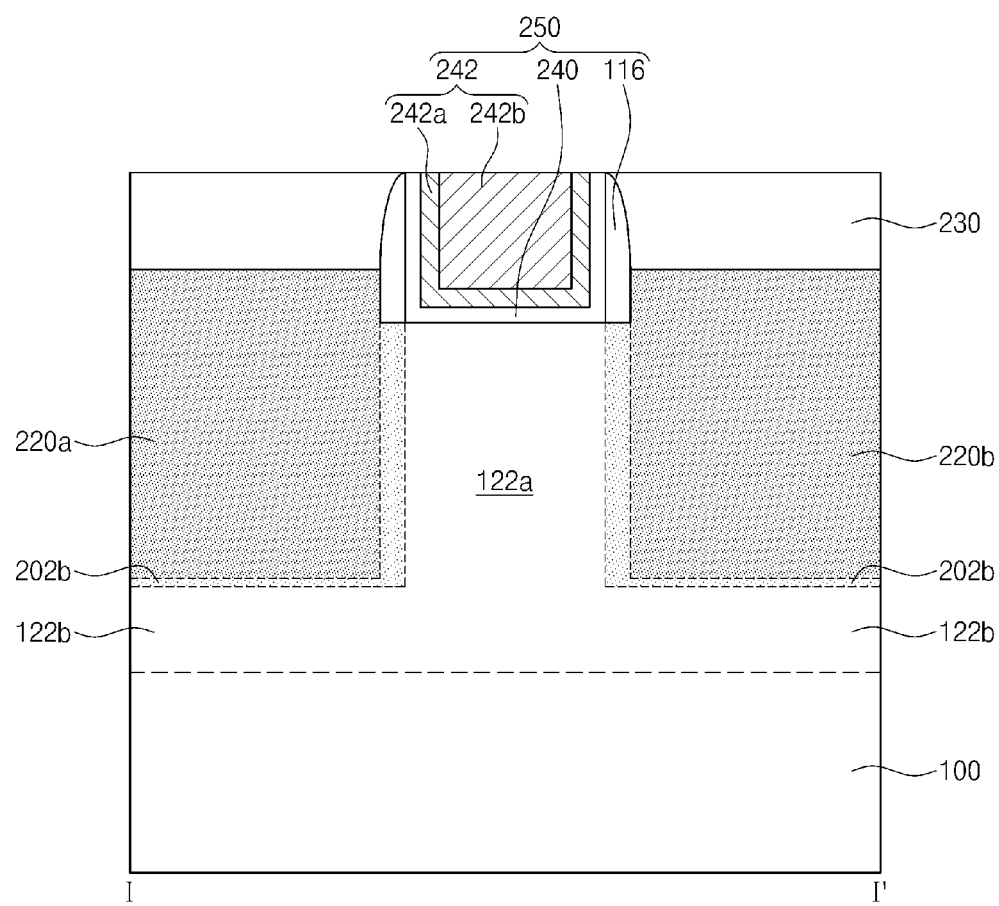

Referring to FIGS. 25a and 25b, the gate dielectric layer 234 and the gate electrode layer 236 may be planarized to expose the upper surface of the interlayer dielectric layer 230 and to form a gate dielectric layer pattern 240 and a gate electrode 242.

From now on, descriptions about distribution of the impurity concentration disposed in the first and second impurity-doped patterns 220a and 220b will be disclosed in detail.

Figure 26A:
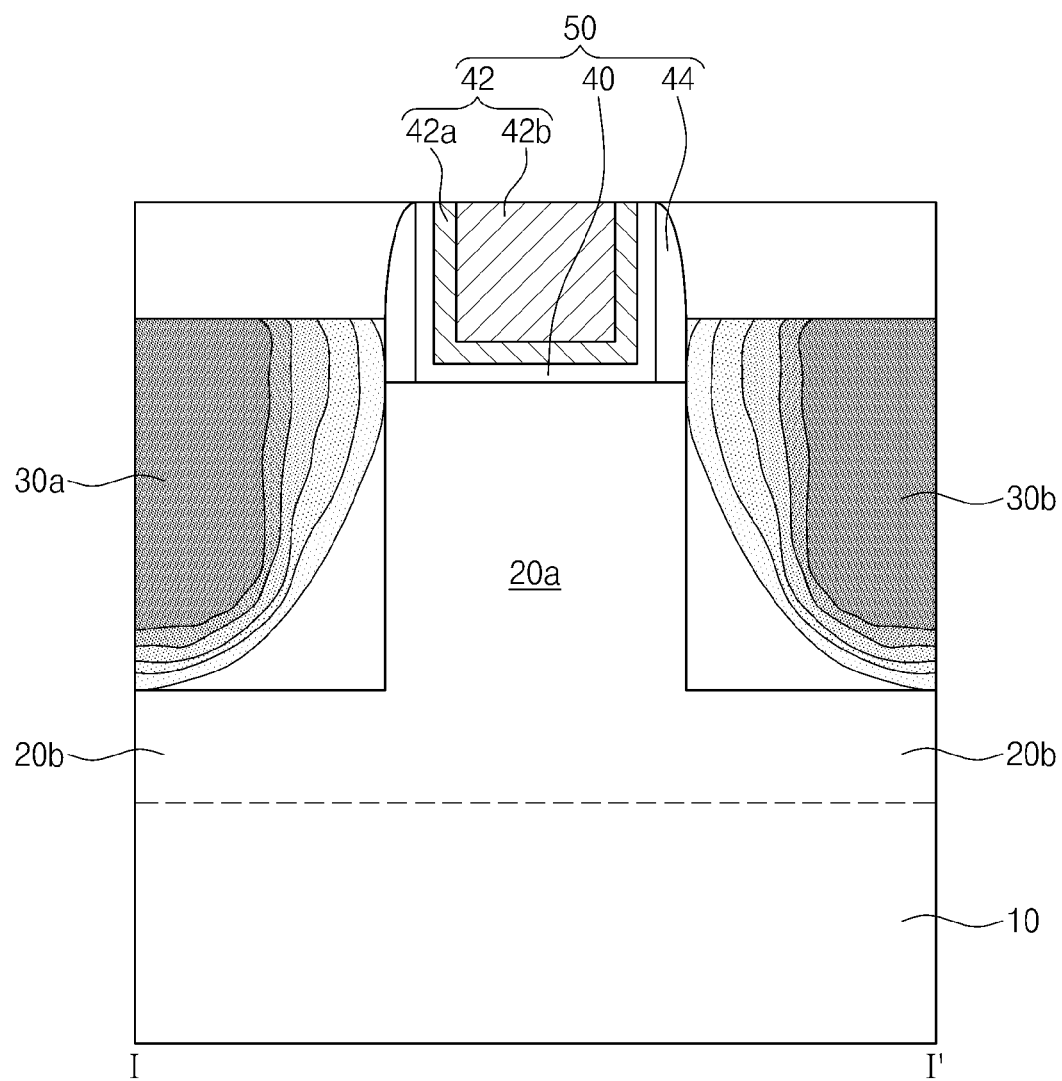
FIG. 26a is a cross-sectional view illustrating a distribution of impurity concentration in an impurity-doped pattern of a conventional fin-type field effect transistor.
Figure 26B:
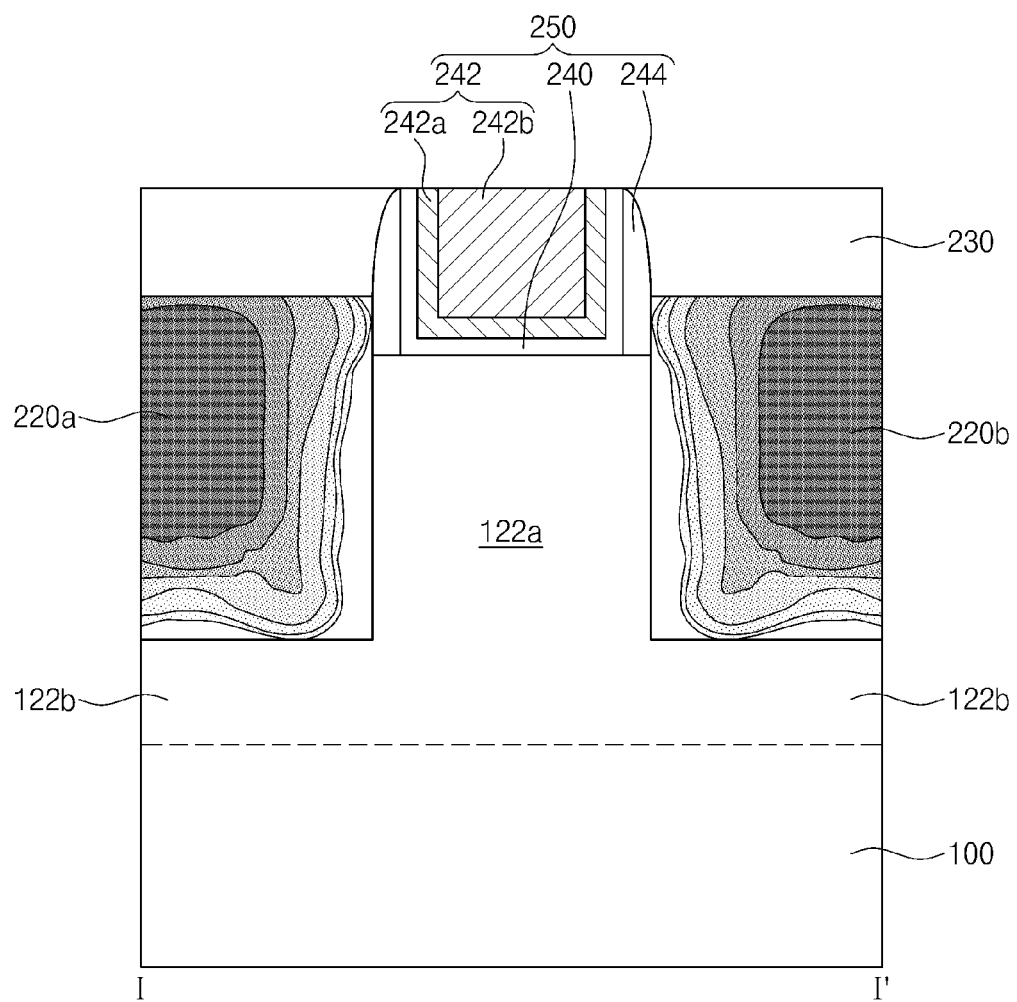
FIG. 26b is a cross-sectional view illustrating a distribution of impurity concentration in an impurity-doped pattern of a fin-type field effect transistor manufactured according to an example embodiment of the inventive concepts.

FIG. 26a is a cross-sectional view illustrating distribution of an impurity concentration disposed in an impurity-doped pattern of a conventional fin-type field effect transistor. FIG. 26b is a cross-sectional view illustrating distribution of an impurity concentration disposed in an impurity-doped pattern of a fin-type field effect transistor according to an example embodiment of the inventive concepts.

A first and a second impurity-doped pattern 30a and 30b of the conventional fin-type field effect transistor in FIG. 26a may be formed by a selective epitaxial growth process. Impurities may be injected into the first and second impurity-doped patterns 30a and 30b by using an ion-beam process. Reference numbers of 10, 20a, 20b, 40, 42a, 42b, 42, 44, and 50 in FIG. 26a correspond to a substrate, a first region of a fin-type active pattern, a second region of a fin-type active pattern, a gate dielectric layer, a lower gate electrode, an upper gate electrode, a gate electrode, a spacer, and a pattern structure, respectively.

The first and second impurity-doped patterns 220a and 220b which are manufactured according to an example embodiment of the inventive concepts may be formed by using a selective epitaxial growth process after performing the plasma doping process as mentioned above referring to FIGS. 11a and 11b. Reference numbers of 100, 122a, 122b, 240, 242a, 242b, 242, 244, and 250 in FIG. 26b correspond to a substrate, a first region of a fin-type active pattern, a second region of a fin-type active pattern, a gate dielectric pattern, a lower gate electrode, an upper gate electrode, a gate electrode, a spacer, and a pattern structure, respectively. An interlayer dielectric layer 230 is also shown.

As shown in FIG. 26a, distributions of the impurity concentrations disposed in the upper portions of the first and second impurity-doped patterns 30a and 30b formed in the conventional fin-type field effect transistor may have widths wider than those of distributions of the impurity concentrations disposed in the lower portions of them, respectively. For example, the curved bands shown in FIG. 26A depict different impurity concentrations, with light shades having the lowest concentration compared to darker shades. As can be seen, the upper portion of the bands (extending in a mostly vertical direction at the top of the impurity doped patterns 30a and 30b) are wider than the lower portion of the bands (extending in a mostly horizontal direction at an outer sidewall of the impurity doped patterns 30a and 30b). As such, the impurity distribution is not uniform.

On the contrary, as shown in FIG. 26b, distributions of the impurity concentrations disposed in the upper portions of the first and second impurity-doped patterns 220a and 220b formed according to an example embodiment of the inventive concepts may have substantially same widths to those disposed in the lower portions of them. Thus, distributions of these impurities are substantially uniform. Therefore, sheet resistances of the upper portions of the first and second impurity-doped patterns 220a and 220b adjacent to the first region 122a of the fin-type active region 122 may be substantially the same as those of the lower portions of them adjacent to the first region 122a of the fin-type active region 122.

Figure 27A:
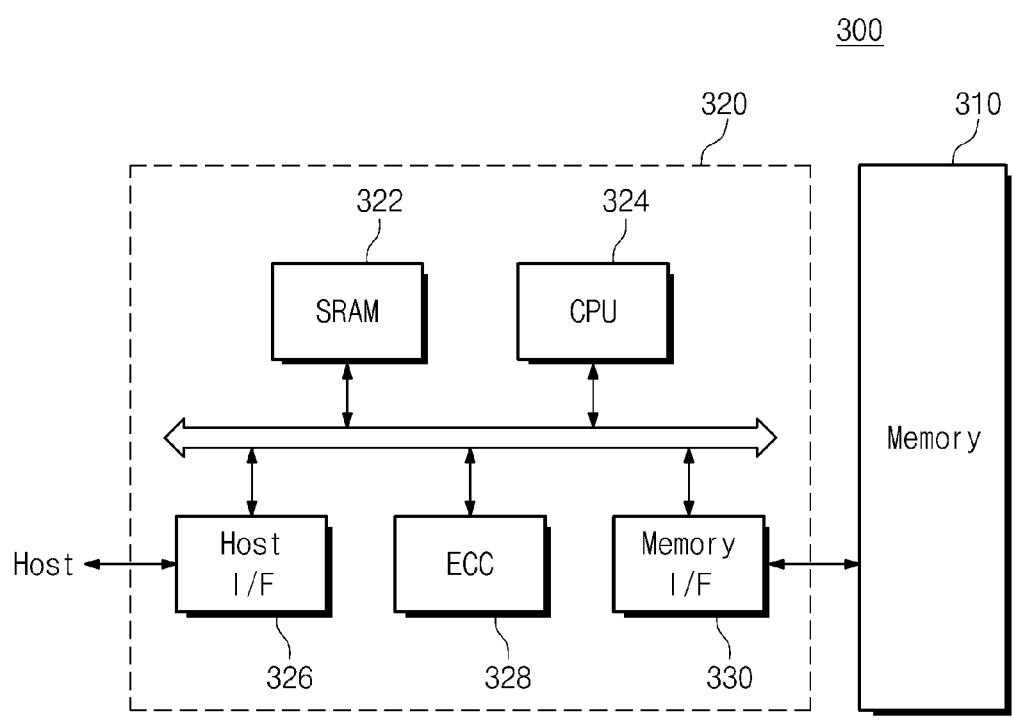
FIG. 27a is a schematic block diagram illustrating a memory card including a semiconductor device according to an example embodiment of the inventive concepts.

FIG. 27a is a schematic block diagram illustrating a memory card including a semiconductor device according to an example embodiment of the inventive concepts.

Referring to FIG. 27a, a memory card 300 may include a memory device 310. The memory device 310 may include at least one of the semiconductor devices according to the example embodiments of the inventive concepts as mentioned above. The memory device 310 may include, for example, at least one of a non-volatile memory device (e.g., a magnetic random access memory device, a phase change random access memory device, etc), a dynamic random access memory (DRAM) device, and/or a static random access memory (SRAM) device. The memory device may be included in a semiconductor device such as a semiconductor chip formed from a wafer, or a semiconductor package, or a package-on-package semiconductor device. The memory card 300 may include a memory controller 320 that controls data communication between a host and the memory device 310.

The memory controller 320 may include a central processing unit (CPU) 324 that controls overall operations of the memory card 300. In addition, the memory controller 320 may include a SRAM device 322 performed as an operation memory of the CPU 324. Moreover, the memory controller 320 may further include a host interface unit 326 and a memory interface unit 330. The host interface unit 326 may be configured to include a data communication protocol between the memory card 300 and the host. The memory interface unit 330 may connect the memory controller 320 to the memory device 310. The memory controller 320 may further include an error check and correction such as an error correction code (ECC) block 328. The ECC block 328 may detect and correct errors of data which are read out from the memory device 310. The memory card 300 may be used as, for example, a portable data storage card. Alternatively, the memory card 300 may be realized as, for example, solid state disks (SSD) which are used as hard disks of computer systems.

Figure 27B:
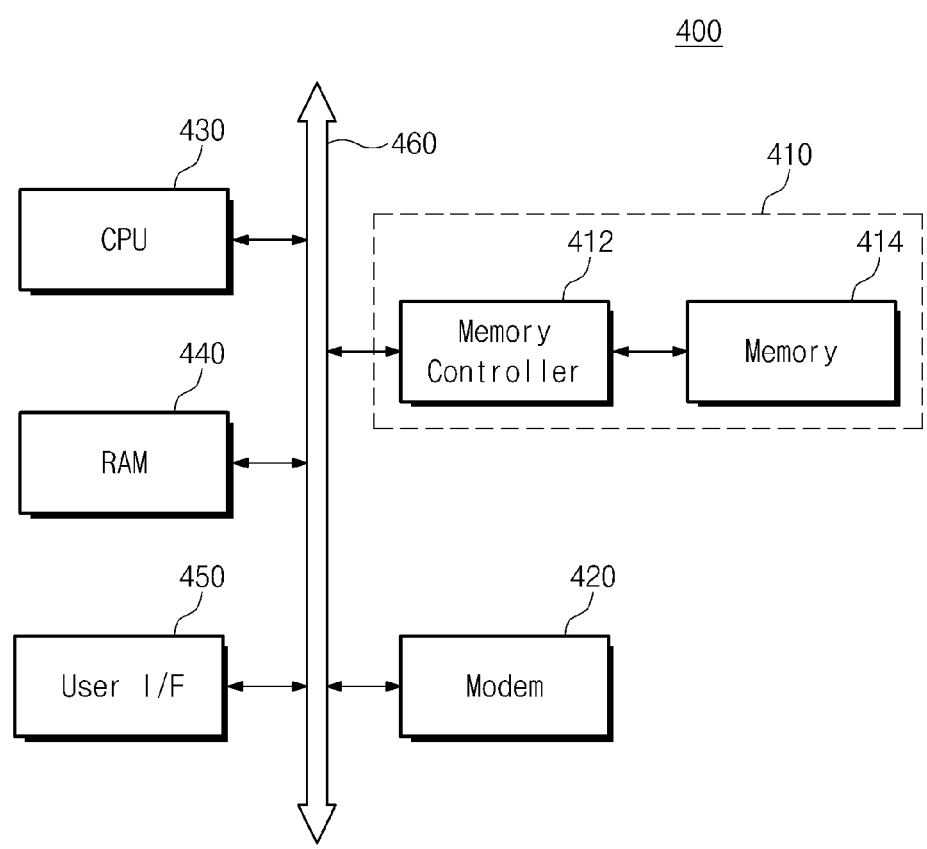
FIG. 27b is a schematic block diagram illustrating an example of information processing systems including a semiconductor device according to an example embodiment of the inventive concepts.

FIG. 27b is a schematic block diagram illustrating an example of information processing systems including a semiconductor device according to an example embodiment of the inventive concepts.

Referring to FIG. 27b, a memory system 410 including the semiconductor device according to an embodiment of the inventive concept may be installed in an information process system 400 such as a mobile device or a desk top computer. The information process system 400 may include a modem 420, a central processing unit (CPU) 430, a random access memory (RAM) 440, and a user interface unit 450 that are electrically connected to the memory system 410 through a system bus 460. Data processed by the CPU 430 or data inputted form the outside of memory system 410 may be stored in the memory system 410. Here, the memory system 410 may be realized as a solid state disk (SSD) device, and may include one or more semiconductor devices such as described above in connection with FIGS. 1-26. In this case, the information processing system 400 may stably store massive data in the memory system 410. Additionally, as the reliability of the memory system 410 increases, the memory system 410 may reduce a resource consumed for correcting errors. Even though not shown in the drawings, an application chipset, a camera image processor (CIS), and/or an input/output unit may further be provided in the information processing system 400.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A semiconductor device, comprising:
a fin-type active pattern protruding from a substrate and extending in a first direction, the fin-type active pattern including a first region having a first vertical thickness and having sidewalls and a second region having a second vertical thickness and an upper surface, the second vertical thickness less than the first vertical thickness;
a pattern structure crossing over the first region of the fin-type active pattern, the pattern structure extending in a second direction; and
an impurity-doped pattern formed on the upper surface of the second region and on a first sidewall of the first region,
wherein the impurity-doped pattern has first impurity concentration at the upper surface of the second region and has a second impurity concentration along the first sidewall of the first region, wherein the second impurity concentration is substantially uniform along the first sidewall.

2. The semiconductor device of claim 1, further comprising a device isolation pattern covering a lower portion of the fin-type active pattern; and
wherein an upper surface of the first region is higher than an upper surface of the device isolation pattern, and
wherein the upper surface of the second region is lower than the upper surface of the device isolation pattern.

3. The semiconductor device of claim 2, wherein an upper surface of the impurity-doped pattern is higher than the upper surface of the device isolation pattern, but lower than the upper surface of the pattern structure.

4. The semiconductor device of claim 1,
wherein the second impurity concentration of the impurity-doped pattern along the first sidewall of the first region is higher than the first impurity concentration of the impurity-doped pattern at the upper surface of the second region.

5. The semiconductor device of claim 1,
wherein the impurity doped pattern has a top surface and a bottom, and an impurity concentration at the top surface of the impurity doped pattern is higher than an impurity concentration at the bottom of the impurity doped pattern.

6. The semiconductor device of claim 1, wherein the impurity-doped pattern has a substantially uniform thickness along the upper surface of the second region.

7. A semiconductor device, comprising:
a fin-type active pattern protruding from a substrate and extending in a first direction, the fin-type active pattern including a first region having a first vertical thickness and having sidewalls and a second region having a second vertical thickness and an upper surface, the second vertical thickness less than the first vertical thickness;
a pattern structure crossing over the first region of the fin-type active pattern, the pattern structure extending in a second direction; and
an impurity-doped pattern having a first impurity concentration on the second region of the fin-type active pattern and a second impurity concentration along a first sidewall of the first region,
wherein the second impurity concentration of the impurity-doped pattern along the first sidewall of the first region is substantially uniform, and
wherein the second impurity concentration is higher than an impurity concentration at a bottom of the impurity-doped pattern.

8. The semiconductor device of claim 7, further comprising a device isolation pattern covering a lower portion of the fin-type active pattern; and
wherein an upper surface of the first region is higher than an upper surface of the device isolation pattern, and
wherein the upper surface of the second region is lower than the upper surface of the device isolation pattern.

9. The semiconductor device of claim 8, wherein an upper surface of the impurity-doped pattern is higher than the upper surface of the device isolation pattern, but lower than the upper surface of the pattern structure.

10. The semiconductor device of claim 7, wherein the impurity-doped pattern has a top surface and a bottom, and an impurity concentration at the top surface of the impurity doped pattern is higher than an impurity concentration at the bottom of the impurity doped pattern.

11. The semiconductor device of claim 7, wherein the impurity-doped pattern has a substantially uniform thickness along the upper surface of the second region.

12. A semiconductor device, comprising:
a fin-type active pattern protruding from a substrate and extending in a first direction, an upper portion of the fin-type active pattern including a channel region and a pair of impurity-doped patterns; and
a gate electrode crossing over the channel region and extending in a second direction,
wherein the first and second directions are parallel to a top surface of the substrate,
wherein the channel region is interposed between the pair of impurity-doped patterns such that the channel region and the pair of impurity-doped patterns are arranged along the first direction,
wherein each of the pair of impurity-doped patterns has an impurity concentration along a sidewall of the channel region, the sidewall of the channel region being in contact with the each of the pair of impurity-doped patterns, and
wherein the impurity concentration along the sidewall of the channel region is substantially uniform.

13. The semiconductor device of claim 12, further comprising a device isolation pattern covering a lower portion of the fin-type active pattern,
wherein bottom surfaces of the pair of impurity-doped patterns are lower than an upper surface of the device isolation pattern.

* * * * *